US008492826B2

(12) United States Patent
Ajika et al.

(10) Patent No.: US 8,492,826 B2
(45) Date of Patent: Jul. 23, 2013

(54) NON-VOLATILE SEMICONDUCTOR MEMORY DEVICE AND MANUFACTURING METHOD THEREOF

(75) Inventors: Natsuo Ajika, Hyogo (JP); Shoji Shukuri, Hyogo (JP); Satoshi Shimizu, Hyogo (JP); Taku Ogura, Hyogo (JP)

(73) Assignee: Genusion, Inc., Tokyo (JP)

( * ) Notice: Subject to any disclaimer, the term of this patent is extended or adjusted under 35 U.S.C. 154(b) by 24 days.

(21) Appl. No.: 12/782,378

(22) Filed: May 18, 2010

(65) Prior Publication Data

US 2010/0283099 A1    Nov. 11, 2010

Related U.S. Application Data

(63) Continuation-in-part of application No. 12/246,193, filed on Oct. 6, 2008, now Pat. No. 8,106,443.

(30) Foreign Application Priority Data

Oct. 9, 2007    (JP) .................................. 2007-263679
Nov. 21, 2007   (JP) .................................. 2007-301370
May 19, 2009    (JP) .................................. 2009-139655

(51) Int. Cl.
*H01L 29/788* (2006.01)
(52) U.S. Cl.
USPC ...................................... 257/324; 257/E29.3
(58) Field of Classification Search
USPC .................. 257/314, 324, E29.279, E29.224, 257/246
See application file for complete search history.

(56) References Cited

U.S. PATENT DOCUMENTS 5,029,131 A    7/1991  Vancu
5,745,417 A    4/1998  Kobayashi et al.
(Continued)

FOREIGN PATENT DOCUMENTS

JP    60-257561 A    12/1985
JP    02-096999 A    4/1990
(Continued)

OTHER PUBLICATIONS

R. Koval, V. Bhachawat, C. Chang, M. Hajra, D. Kencke, Y. Kim, C. Kuo, T. Parent, M. Wei, B.J. Woo, A. Fazio, "Flash ETOX(TM) Virtual Ground Architecture: A Future Scaling Direction," 2005 Symposium of VLSI Technology Digest of Technical Papers, pp. 204-205.

(Continued)

*Primary Examiner* — William D Coleman
*Assistant Examiner* — Christine Enad
(74) *Attorney, Agent, or Firm* — The Marbury Law Group, PLLC

(57) ABSTRACT

A non-volatile semiconductor device includes an n type well formed in a semiconductor substrate having a surface, the surface having a plurality of stripe shaped grooves and a plurality of stripe shaped ribs, a plurality of stripe shaped p type diffusion regions formed in upper parts of each of the plurality of ribs, the plurality of stripe shaped p type diffusion regions being parallel to a longitudinal direction of the ribs, a tunneling insulation film formed on the grooves and the ribs, a charge storage layer formed on the tunneling insulating film, a gate insulation film formed on the charge storage layer, and a plurality of stripe shaped conductors formed on the gate insulating film, the plurality of stripe shaped conductors arranged in a direction intersecting the longitudinal direction of the ribs with a predetermined interval wherein an impurity diffusion structure in the ribs are asymmetric.

7 Claims, 90 Drawing Sheets

U.S. PATENT DOCUMENTS

| | | | |
|---|---|---|---|
| 5,898,606 A | 4/1999 | Kobayashi et al. | |
| 6,518,614 B1 | 2/2003 | Breitwisch et al. | |
| 6,972,997 B2 | 12/2005 | Ishimaru et al. | |
| 7,045,848 B2* | 5/2006 | Shukuri | 257/311 |
| 7,130,223 B2 | 10/2006 | Ishimaru et al. | |
| 7,245,531 B2* | 7/2007 | Okazaki et al. | 365/185.05 |
| 7,248,507 B2 | 7/2007 | Nakamura | |
| 7,402,862 B2* | 7/2008 | Choi et al. | 257/324 |
| 7,847,331 B2 | 12/2010 | Ishimaru et al. | |
| 7,939,861 B2* | 5/2011 | Horch | 257/249 |
| 8,076,709 B2 | 12/2011 | Ishimaru et al. | |
| 2003/0222303 A1 | 12/2003 | Fukuda et al. | |
| 2006/0237777 A1* | 10/2006 | Choi et al. | 257/321 |
| 2007/0155103 A1* | 7/2007 | Shukuri | 438/267 |
| 2007/0187746 A1 | 8/2007 | Kashimura | |
| 2007/0230251 A1* | 10/2007 | Ajika et al. | 365/185.23 |
| 2008/0186772 A1* | 8/2008 | Horch | 365/185.18 |
| 2009/0080260 A1* | 3/2009 | Jenne | 365/185.18 |
| 2009/0090961 A1 | 4/2009 | Ajika et al. | |

FOREIGN PATENT DOCUMENTS

| | | |
|---|---|---|
| JP | 04-082093 A | 6/1992 |
| JP | 05-101683 A | 4/1993 |
| JP | 2004-087770 A | 3/2004 |
| JP | 2004-221554 A | 8/2004 |
| JP | 2005-294498 A | 10/2005 |
| JP | 2006-019373 A | 1/2006 |
| JP | 2006-128594 A | 5/2006 |
| JP | 2007-004911 A | 1/2007 |
| JP | 2007-220914 A | 8/2007 |
| JP | 2007-227585 A | 9/2007 |

OTHER PUBLICATIONS

Japanese Office Action dated Dec. 18, 2012 for Japanese Application No. 2007-263679.

Japanese Office Action issued Mar. 19, 2013; Japanese Application No. 2007-263679.

JP2007-301370 Office Action received on Dec. 19, 2012.

JP2007-301370 Office Action issued on Mar. 12, 2013.

* cited by examiner

FIG. 6

Operation conditions

| | | sBLL | sBLR | uBL | sWL | uWL | n-well | p-sub |
|---|---|---|---|---|---|---|---|---|
| 1 | Program | 0V | 1.8V /float | 1.8V /float | 12V | 0V /1.8V | 4V | 0V |
| 2 | Erase (One Time FN Erasure By Block) | 8V /float | 8V /float | 8V /float | -8V | -8V | 8V | 0V |
| 3 | (Erase) (Substrate Hot Hole Injection Erasure By Block) | -3V | -3V | -3V | -8V | -8V | -1V | 0V |
| 4 | Read | 1.8V | 0V | float | -2V | 1.8V | 1.8V | 0V |
| 5 | (Read) | 0V | 1.8V | float | -2V | 1.8V | 1.8V | 0V |

Process 2 : ONO+polysilicon layer formation

Process 4 : p+ diffusion layer, n- halo diffusion layer formation

Process 5 : oxide film deposition + CMP

Process 6 : gate electrode polysilicon deposition

Process 7 : gate electrode pattern formation
202

Process 2: p+ diffusion layer formation (B/BF2 implantation)

Process 3 : mask oxide film deposition

Process 4 : 3D channel formation
210

Process 6: n- halo diffusion layer implantation

Process 7 : ONO film deposition

Process 8 : gate electrode polysilicon deposition

Process 9 : gate electrode polysilicon patterning

Process 1 : n-Wellformation (Phosphorus implantation)

Procdss 2 : mask oxide film deposition

Process 3 : 3D channel formation

Process 7 : ONO film formation

Process 8 : gate electrode polysilicon film deposition

Process 9 : gate electrode polysilicon film patterning

Process 2 : mask oxide film deposition

Process 3 : mask oxide film patterning

Process 6 : 3D channel formation

Process 8 : ONO film deposition

Process 9 : gate electrode polysilicon film deposition

Process10: gate electrode polysilicon film patterning

Process 2 : mask oxide film deposition

Process 3 : mask oxide film patterning

Process 5 : 3 D channel formation

Process 7 : ONO film deposition

All following procedures are the same as another 3D cell

Process 8 : gate electrode polysilicon film deposition

FIG. 88

| Operation Conditions | | | | | | | |
|---|---|---|---|---|---|---|---|
| | sBL | uBL | SL | sWL | uWL | n-well | p-sub |
| Program | Vdp | uVdp | Vsp | Vgp | uVgp | Vbp | Vsub |
| Erase | Vde | | Vse | Vge | | Vbe | Vsub |
| Read | Vdr | uVdr | Vsr | Vgr | uVgr | Vbr | Vsub |
| Standby | Vdsb | | Vssb | Vgsb | | Vbsb | Vsub |

FIG. 89

| Operation Conditions | | | | | | | |
|---|---|---|---|---|---|---|---|
| | sBL | uBL | SL | sWL | uWL | n-well | p-sub |
| Program | 0V | 1.8V /3.6V /float | 1.8V /float | 12V | 0V /1.8V | 6V | 0V |
| Erase | 10V /float | | 10V | -10V | | 10V | 0V |
| Read | 1.8V | 0V /float | 0V | -3V | 1.8V | 1.8V | 0V |
| Standby | 0V | | 0V | 1.8V | | 1.8V | 0V |

NON-VOLATILE SEMICONDUCTOR MEMORY DEVICE AND MANUFACTURING METHOD THEREOF

CROSS REFERENCE TO RELATED APPLICATIONS

This application is a continuation-in-part of and claims the benefit of priority to U.S. patent application Ser. No. 12/246,193, filed Oct. 6, 2008, which claims the benefit of priority from the prior Japanese Patent Applications No. 2007-263679, filed on Oct. 9, 2007, and No. 2007-301370, filed on Nov. 21, 2007. This application also claims the benefit of priority to prior Japanese Patent Application No. 2009-139655, filed on May 19, 2009. The entire contents of all the aforementioned U.S. and Japanese priority applications are hereby incorporated by reference.

BACKGROUND OF THE INVENTION

1. Field of the Invention

One of the inventions relates to an improvement in the structure of a non-volatile semiconductor memory device having a Virtual Ground Array structure (first to fifth embodiments). Furthermore, another one of the inventions relates to an improvement of a CMOS compatible non-volatile semiconductor memory device (sixth to thirteenth embodiments).

2. Description of the Related Art

FIG. 1(A) and FIG. 1(B) show the diagrams of equivalent circuits of a general NOR array structure and a virtual ground array structure. In the virtual ground array structure, since one bit line is shared by two adjacent memory cell transistors, isolations of memory cells and contacts can be removed, therefore, the structure becomes simpler and the area of a cell becomes smaller. The structure of a virtual ground array is receiving attention as a future technology of a NOR type flash memory as cited, for example, in pp 204-205 of IEEE, *Symposium on VLSI Technology Digest of Technical Papers*, 2005.

On the other hand, the Applicants of the present invention have developed a technology of B4-HE (back bias assisted band-to-band tunneling induced hot electron) injection mechanism which dramatically improved the program speed of a flash memory, as shown in FIG. 2. In the B4-HE injection mechanism, current consumption during programming is reduced and the number of cells which can be simultaneously programmed increases by injecting hot electrons into charge storage layers by BTBT (band-to-band tunneling) while the back gate voltage is applied. This is described in Japanese Patent Publication 2006-156925 (US counterpart: 20070230251A1).

B4-HE injection technology is a method in which programming is performed by applying a predetermined voltage to a gate electrode, N type well and a bit line (drain). When B4-HE injection technology is applied to a virtual ground array structure, a bit line is shared between adjacent memory cells on the same row in the virtual ground memory cell array. As a result, as is shown in FIG. 3, in B4-HE injection technology, the application of a programming voltage to a selected cell 51 is done with the same conditions to the adjacent non-selected memory cell 52 which shares the same bit line which is applied with the predetermined voltage (0V) and thus is programmed at the same as the selected cell 51. Therefore, the above mentioned B4-HE injection technology can not be applied as it is to a virtual ground array structure.

One of the present inventions provides a non-volatile semiconductor memory device having a virtual ground array in which B4-HE injection technology is applied so that a non-selected cell which is adjacent to a selected cell is not programmed. Furthermore, the present invention proposes a manufacturing method thereof. These inventions are supported by the first to fifth embodiments.

Another aspect of the present inventions provides a CMOS compatible non-volatile semiconductor memory device which has better performance than the devices disclosed in U.S. Pat. Nos. 6,518,614, 7,248,507 and in US patent published application No. 2003-222,303 A1. This aspect is supported by the sixth to thirteenth embodiments.

SUMMARY OF THE INVENTION

In one aspect of the present invention, it is provided a non-volatile semiconductor device comprising: an n type well formed in a semiconductor substrate; and a memory cell array of a virtual ground array structure, the memory cell array having a plurality of P type MONOS cells arranged in matrix, adjacent ones of P type MONOS cells share a same diffusion region, each of the P type MONOS cells being configured to be programmed from one side of a channel by band to band tunneling.

In the non-volatile semiconductor device according to the present invention, each of the P type MONOS cells may be programmed by applying a first voltage to a bit line connected to the respective one of the P type MONOS cells, applying a second voltage higher than the first voltage to the n type well, applying a third voltage higher than the second voltage to a word line connected to the respective one of the P type MONOS cells.

In the non-volatile semiconductor device according to the present invention, each of the P type MONOS cells has a halo region to enhance an electrical field in the one side of the channel.

In the non-volatile semiconductor device according to the present invention, each of the P type MONOS cells may have an offset region to suppress programming from another side of the channel.

In the non-volatile semiconductor device according to the present invention, a plurality of grooves and ribs may be formed in a surface of the n type well along a column direction, the channels of the P type MONOS cells may be partly formed in bottom surfaces of the grooves.

In the non-volatile semiconductor device according to the present invention, a plurality of bit lines made of p type diffusions may be formed in the top surfaces of the ribs.

In the non-volatile semiconductor device according to the present invention, a plurality of halo regions may be formed in first side walls of the grooves.

In the non-volatile semiconductor device according to the present invention, a plurality of lightly doped regions may be formed in second side walls of the grooves, the second side walls being opposite to the first side walls.

In the non-volatile semiconductor device according to the present invention, an ONO film continuously may extend across at least a single row of the plurality of P type MONOS cells.

In the non-volatile semiconductor device according to the present invention, the ONO film continuously may extend across rows and columns of the plurality of P type MONOS cells.

In other aspect of the present invention, it is provided a non-volatile semiconductor device comprising: an n type well formed in a semiconductor substrate having a surface, the surface having a plurality of stripe shaped grooves formed along a first direction and a plurality of stripe shaped ribs formed along the first direction; a plurality of stripe shaped p type diffusion regions each formed in an upper part of corresponding one of the plurality of ribs, the plurality of stripe shaped p type diffusion regions being formed along the first direction; a tunneling insulation film formed on the grooves and the ribs; a charge storage film formed on the tunneling insulating film; a gate insulation film formed on the charge storage film; and a plurality of stripe shaped conductors formed on the gate insulating film, the plurality of stripe shaped conductors arranged in a direction intersecting the longitudinal direction of the ribs with a predetermined interval; wherein an impurity diffusion structure in the ribs are asymmetric.

In the non-volatile semiconductor device according to the present invention, a plurality of stripe shaped p-type diffusion regions formed along a longitudinal direction and in adjacent to the plurality of stripe shaped p type diffusion regions, and having a lower diffusion density than a diffusion density of the p type diffusion regions.

In the non-volatile semiconductor device according to the present invention, there may be a plurality of stripe shaped n type impurity regions formed along a longitudinal direction and in adjacent to the p type diffusion regions, and having a higher diffusion density than the n type well.

In the non-volatile semiconductor device according to the present invention, a first distance between one of the p type diffusion regions and a first adjacent one of the grooves and a second distance between the one of p type diffusion regions and a second adjacent one of the grooves are different.

In the non-volatile semiconductor device according to the present invention, there may be a plurality of insulation layers formed between the ribs of the semiconductor substrate and the tunneling insulation film.

In other aspect of the present invention, it is provided a non-volatile semiconductor device comprising: an n type well formed in a semiconductor substrate; a plurality of stripe shaped p type diffusion regions formed at predetermined intervals in the n type well; a plurality of stripe shaped tunneling insulation layers formed on the n type well, wherein the plurality of stripe shaped tunneling insulation layers do not overlap with the plurality of stripe shaped p type diffusion regions; a plurality of stripe shaped charge storage layers formed on the a plurality of stripe shaped tunneling insulation layers respectively, each of the plurality of stripe shaped charge storage layers being closer to one of adjacent pairs of the plurality of stripe shaped p type diffusion regions than other one of adjacent pairs of the plurality of stripe shaped p type diffusion regions; a plurality of stripe shaped gate insulation layers formed on the plurality of stripe shaped charge storage layers; a plurality of stripe shaped conductors formed on the gate insulating layers, the plurality of stripe shaped conductors arranged in a direction intersecting the longitudinal direction of the p type diffusion regions at predetermined intervals; and a plurality of n type impurity regions having higher impurity density than the n type well, the plurality of n type impurity regions formed in contact to closer one of the adjacent pairs of the plurality of stripe shaped p type diffusion regions.

In the non-volatile semiconductor device according to the present invention, there may be a plurality of stripe shaped insulating layers formed on the semiconductor substrate and arranged between the plurality of stripe shaped tunneling insulation layers, the plurality of stripe shaped charge storage layers and the plurality of stripe shaped gate insulation layers.

In the non-volatile semiconductor device according to the present invention, the plurality of stripe shaped insulating layers are formed by Chemical Vapor Deposition.

In other aspect of the present invention, it is provided a method for manufacturing a non-volatile semiconductor device comprising: preparing a semiconductor substrate having a surface: forming a first conductivity type well near the surface of the semiconductor substrate; forming an ONO film over said surface of the semiconductor substrate; forming a first polysilicon film over the ONO film; patterning the ONO film and the first polysilicon film in a stripe pattern along a first direction; ion-implanting, by a first angle, a second conductivity type ions into the surface of the semiconductor substrate using the patterned first polysilicon film as a shadowing mask; filling gaps of the ONO film and the first polysilicon film in the stripe pattern with first insulating layers; forming a second polysilicon film over the first polysilicon film and the first insulating layers; and patterning the first polysilicon film and the second polysilicon film in a stripe pattern along a second direction perpendicular to the first direction.

In the method according to the present invention, there may be steps for ion-implanting, by a second angle, ions of the first conductivity into the surface of the semiconductor substrate using the first polysilicon film as a shadowing mask.

In the method according to the present invention, the step for filling the gaps of the ONO film and the first polysilicon film in the stripe pattern with first insulating layers may comprises: forming the first insulating film over the stripe pattern of the ONO film and the first polysilicon film; and polishing the surface of the first insulating film to isolate the first insulating film into the filled first insulating layers.

In the method according to the present invention, the first conductivity type may be n type and the second conductivity type may be p type.

In other aspect of the present invention, it is provided a method for manufacturing a non-volatile semiconductor device comprising: preparing a semiconductor substrate having a surface; forming a first conductivity type well near the surface of the semiconductor substrate; forming a second conductivity type diffusion in the surface of the semiconductor substrate; forming a first insulating film over the surface of the semiconductor substrate: etching the first insulating film and the semiconductor substrate to form a plurality of stripe shaped grooves along a first direction and a plurality of stripe shaped ribs along the first direction, thereby leaving a plurality of stripe shaped first insulating layers on the plurality of stripe shaped ribs and isolating a plurality of stripe shaped a first diffusion regions of the second conductivity type in an upper part of corresponding one of the plurality of ribs; ion-implanting, by a first angle, ions of the second conductivity type into the surface of the semiconductor substrate using the plurality of stripe shaped first insulating layers as a shadowing mask; forming an ONO film over the grooves and the ribs; forming a polysilicon film over the ONO film; and patterning the polysilicon film in a stripe pattern along a second direction perpendicular to the first direction.

In the method according to the present invention, there may be a step for ion-implanting, by an opposite angle to the first angle, ions of the first conductivity type into the surface of the semiconductor substrate using the plurality of stripe shaped first insulating layers as a shadowing mask.

In the method according to the present invention, the first conductivity type may be n type and the second conductivity type may be p type.

In other aspect of the present invention, it is provided a method for manufacturing a non-volatile semiconductor device comprising: preparing a semiconductor substrate having a surface; forming a first conductivity type well near the surface of the semiconductor substrate; forming a first insulating film over the surface of the semiconductor substrate: etching the first insulating film and the semiconductor substrate to form a plurality of stripe shaped grooves along a first direction and a plurality of stripe shaped ribs along the first direction, thereby leaving a plurality of stripe shaped first insulating layers on the plurality of stripe shaped ribs; ion-implanting, by a first angle, ions of the second conductivity type into the surface of the semiconductor substrate using the plurality of stripe shaped first insulating layers as a shadowing mask; ion-implanting, by a second angle which is an opposite angle to the first angle, ions of the second conductivity type into the surface of the semiconductor substrate using the plurality of stripe shaped first insulating layers as a shadowing mask; forming an ONO film over the grooves and the ribs; forming a polysilicon film over the ONO film; and patterning the polysilicon film in a stripe pattern along a second direction perpendicular to the first direction.

In the method according to the present invention, there may be a step for ion-implanting, by a third angle which is the opposite angle to the first angle, ions of the first conductivity type into the surface of the semiconductor substrate using the plurality of stripe shaped first insulating layers as a shadowing mask.

In the method according to the present invention, the first conductivity type may be n type and the second conductivity type may be p type.

In other aspect of the present invention, it is provided a method for manufacturing a non-volatile semiconductor device comprising: preparing a semiconductor substrate having a surface; forming a first conductivity type well near the surface of the semiconductor substrate; forming a first insulating film over the surface of the semiconductor substrate: forming a stripe shaped resist pattern along a first direction; etching the first insulating film, using the stripe shaped resist pattern as a mask, to form a plurality of stripe shaped first insulation layers; ion-implanting, by a first angle, ions of the second conductivity type into the surface of the semiconductor substrate using the stripe shaped resist pattern as a shadowing mask; ion-implanting, by a second angle which is an opposite angle to the first angle, ions of the second conductivity type into the surface of the semiconductor substrate using the stripe shaped resist pattern as a shadowing mask; etching the semiconductor substrate to form a plurality of stripe shaped grooves along the first direction and a plurality of stripe shaped ribs along the first direction, thereby leaving a plurality of stripe shaped diffusion regions of the second conductivity type in the plurality of stripe shaped ribs; forming an ONO film over the grooves and the ribs; forming a polysilicon film over the ONO film; and patterning the polysilicon film in a stripe pattern along a second direction perpendicular to the first direction.

In the method according to the present invention, there may be a step for ion-implanting, by a third angle which is the opposite angle to the first angle, ions of the first conductivity type into the surface of the semiconductor substrate using the stripe shaped resist pattern as a shadowing mask.

In the method according to the present invention, the first conductivity type may be n type and the second conductivity type may be p type.

In other aspect of the present invention, it is provided a method for manufacturing a non-volatile semiconductor device comprising: preparing a semiconductor substrate having a surface; forming a first conductivity type well near the surface of the semiconductor substrate; forming a first insulating film over the surface of the semiconductor substrate: forming a stripe shaped resist pattern along a first direction; etching the first insulating film, using the stripe shaped resist pattern as a mask, to form a plurality of stripe shaped first insulation layers; ion-implanting, by a first angle, ions of the second conductivity type into the surface of the semiconductor substrate using the stripe shaped resist pattern as a shadowing mask; ion-implanting, by a second angle, ions of the first conductivity type into the surface of the semiconductor substrate using the stripe shaped resist pattern as a shadowing mask; etching the semiconductor substrate to form a plurality of stripe shaped grooves along the first direction and a plurality of stripe shaped ribs along the first direction, thereby leaving a plurality of stripe shaped diffusion regions of the second conductivity type in the plurality of stripe shaped ribs; forming an ONO film over the grooves and the ribs; forming a polysilicon film over the ONO film; and patterning the polysilicon film in a stripe pattern along a second direction perpendicular to the first direction.

In the method according to the present invention, the first conductivity type may be n type and the second conductivity type may be p type.

According to the present invention, it is possible to realize high speed programming by B4-HE injection which applies a back gate voltage in the non-volatile semiconductor memory device which uses a virtual ground array.

BRIEF EXPLANATION OF THE DRAWINGS

FIG. 6 shows a chart of voltage application conditions.

FIG. 88 is a chart which shows the application conditions of an operation voltage of the same memory cell.

FIG. 89 is a chart which shows an example of the application conditions of an operation voltage of the same memory cell

DETAILED DESCRIPTION

A first embodiment of the present invention will be explained by referring to the figures. Firstly, the first embodiment will be explained by referring to FIGS. 4 to 13.

Figure 1:
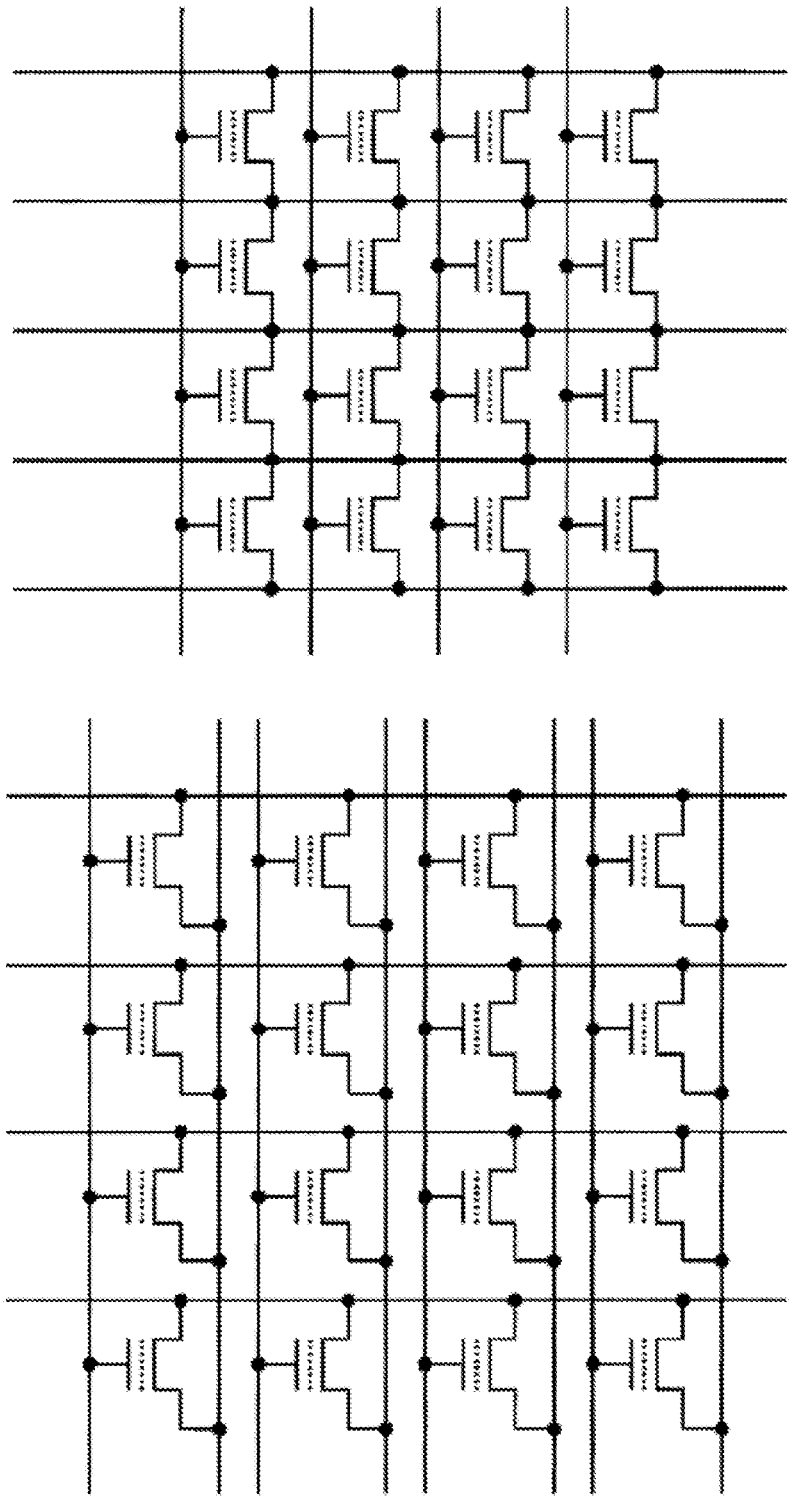
FIGS. 1(A) and (B) show equivalent circuit diagrams of a general NOR array structure and of a virtual ground array structure.
Figure 2:
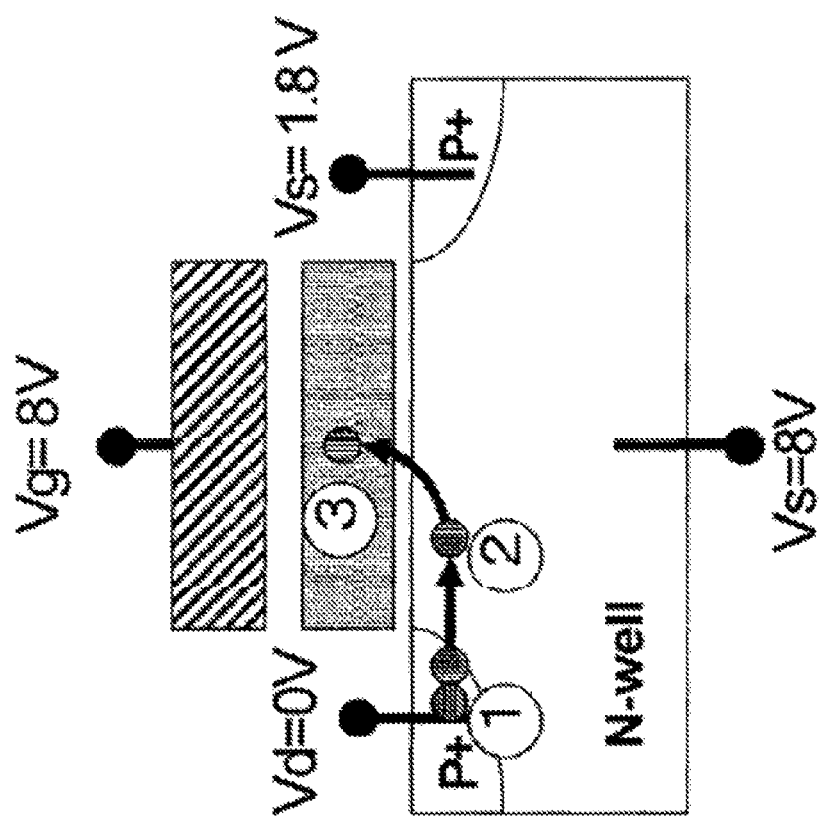
FIG. 2 shows a diagram which explains B4-HE injection technology.
Figure 3:
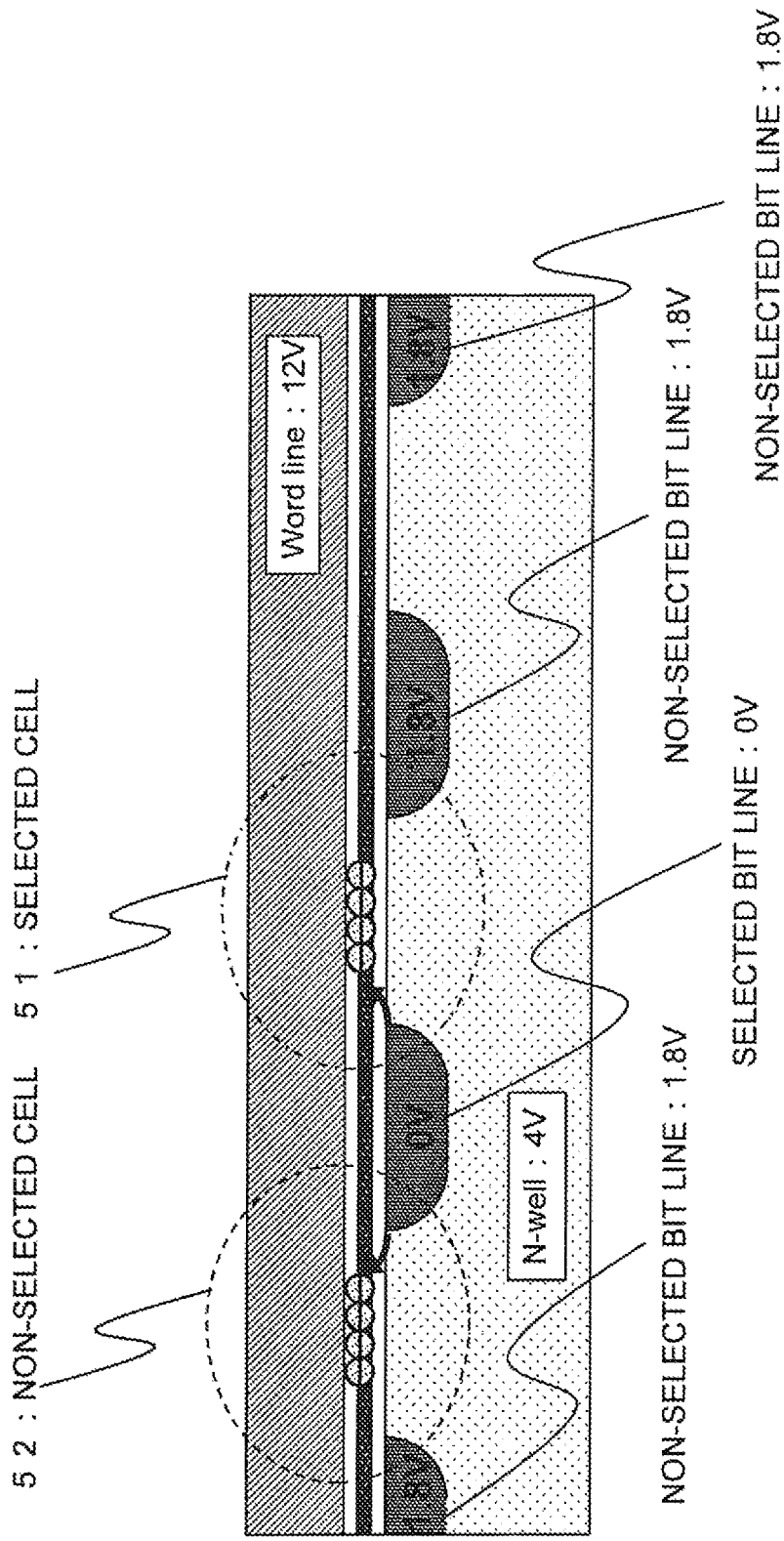
FIG. 3 shows an operation in the case where B4-HE programming is performed in a memory cell array having a conventional virtual ground array structure.
Figure 4:
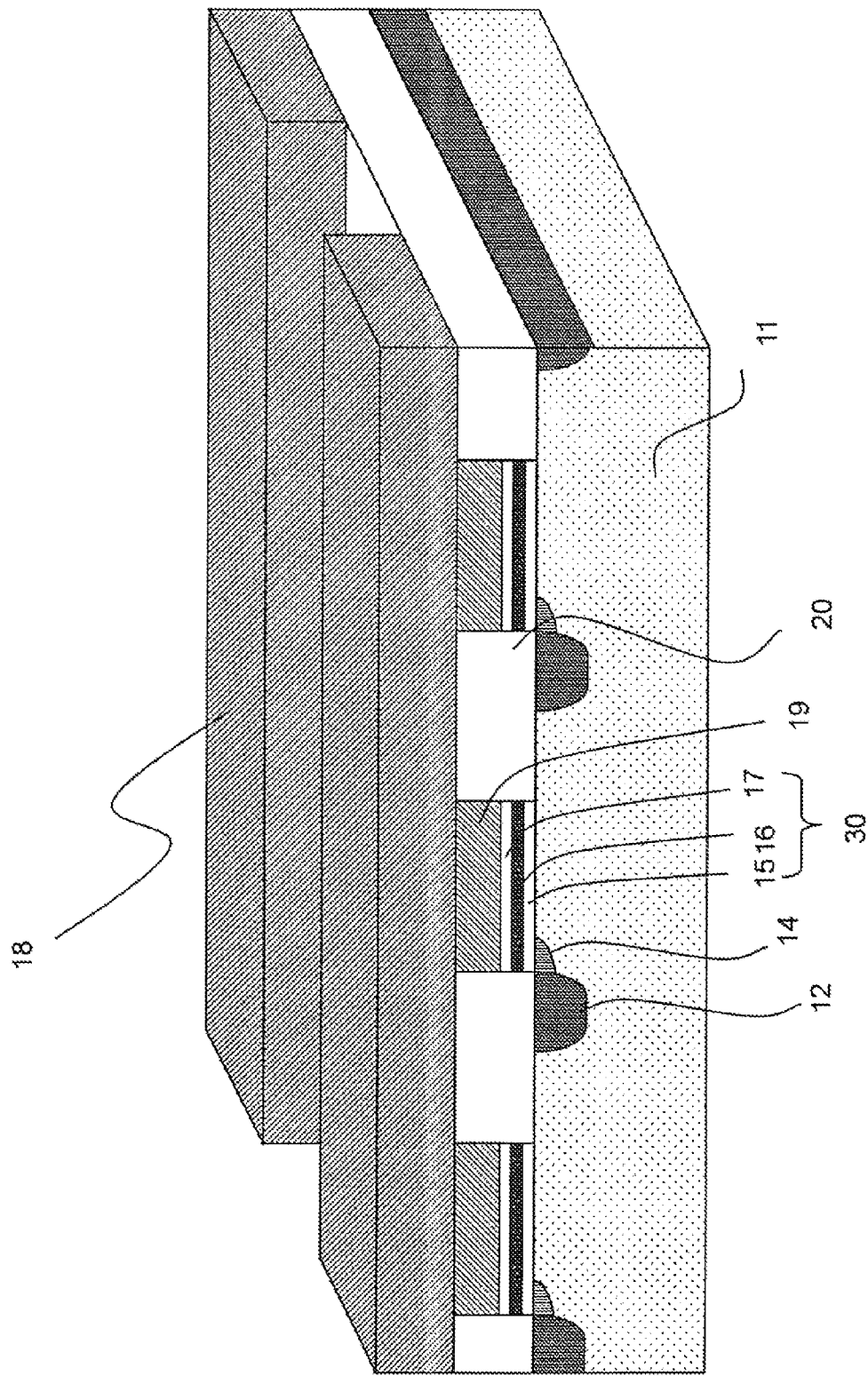
FIG. 4 shows a cross sectional oblique view of a first embodiment of the present invention.

FIG. 4 is a cross sectional oblique view diagram which shows the structure of a memory cell array related to the first embodiment of the present invention. This memory cell array is formed by a p channel MONOS structure. That is, an ONO film (a nitride film (N), and oxide insulation films (O) sandwiching the nitride film (N)), is formed above a channel region of each memory cell. A gate electrode (M) is formed above the ONO film.

An n type well 11 is formed in the entire surface where memory cell array is formed, near the surface of the semiconductor substrate. A predetermined interval is arranged near the surface of this n type well 11 and a plurality of p type diffusion regions 12 are formed in stripe shape in a Y direction. The p type diffusion regions 12 are bit lines in this memory cell array and functions as a source or a drain in each of memory cells. A halo region 14 is formed in one side (X side) surface of corresponding p type diffusion region 12. The halo region 14 is a region for enhancing an electric field (steep potential change) in an area near the p type diffusion region 12 which functions as a drain in order to generate hot electrons. There is a higher concentration of n type impurities in the halo region 14 than in the n type well 11.

Furthermore, the other side (-X side) surface of the p type diffusion region 12 is offset from the channel region of the other memory cell transistor and has a structure in which it is difficult for the hot electrons which are generated in an area near the p type diffusion region 12 to reach the charge storage layer.

ONO films 30 and insulation oxide films 20 are alternately formed in stripe shape in the Y direction above the semiconductor substrate (n type well 11). The insulation oxide film layer 20 is formed above the p type diffusion region 12 and above a side surface region which is on the opposite side (-X side) to the halo region 14 of this p type diffusion region. In addition, the ONO film 30 is formed above a channel region between the adjacent p type diffusion regions 12.

A plurality of polysilicon layers 18 are formed in a stripe shape in the X direction over the insulation oxide film layer 20. These polysilicon layers 18 are word lines in the memory cell array. In addition, polysilicon layers 19 of a height which fills a difference in height between the ONO film 30 and the insulation oxide film layer 20 are formed below the polysilicon layers 18. This polysilicon layers 19 function as a gate electrode of each memory cell.

The ONO film 30 is formed by a tunnel oxide film 15 which is formed from oxide silicon, a charge storage layer 16 of nitride silicon which accumulates injected charges (electrons) and an insulation film 17 which is formed from oxide silicon. The film thickness of each of these three layers is about 1.5 nm to 8 nm.

In this memory cell array, each memory cell is not separated by grooves. However, in this memory cell array, the polysilicon layers 19 are formed above the ONO films 30 and the regions between the two p type diffusion regions 12 are channel regions of memory cell transistors. Furthermore, in this memory cell array, one memory cell is formed by one transistor, the same as in a general flash memory.

Because the conductivity of the nitride film which is used as the charge storage layer 16 is low, the trapped charges do not move within the film and remain in trapped positions. As a result, even if the charge storage layer 16 is formed in common with memory cells which are arranged in series in a Y direction, the trapped electric charges remain in a region of a memory cell transistor by a programming operation of that memory cell transistor and do not move to another memory cell region.

Here, the operation of a P channel MONOS memory cell of the above structure will be explained.

Figure 5:
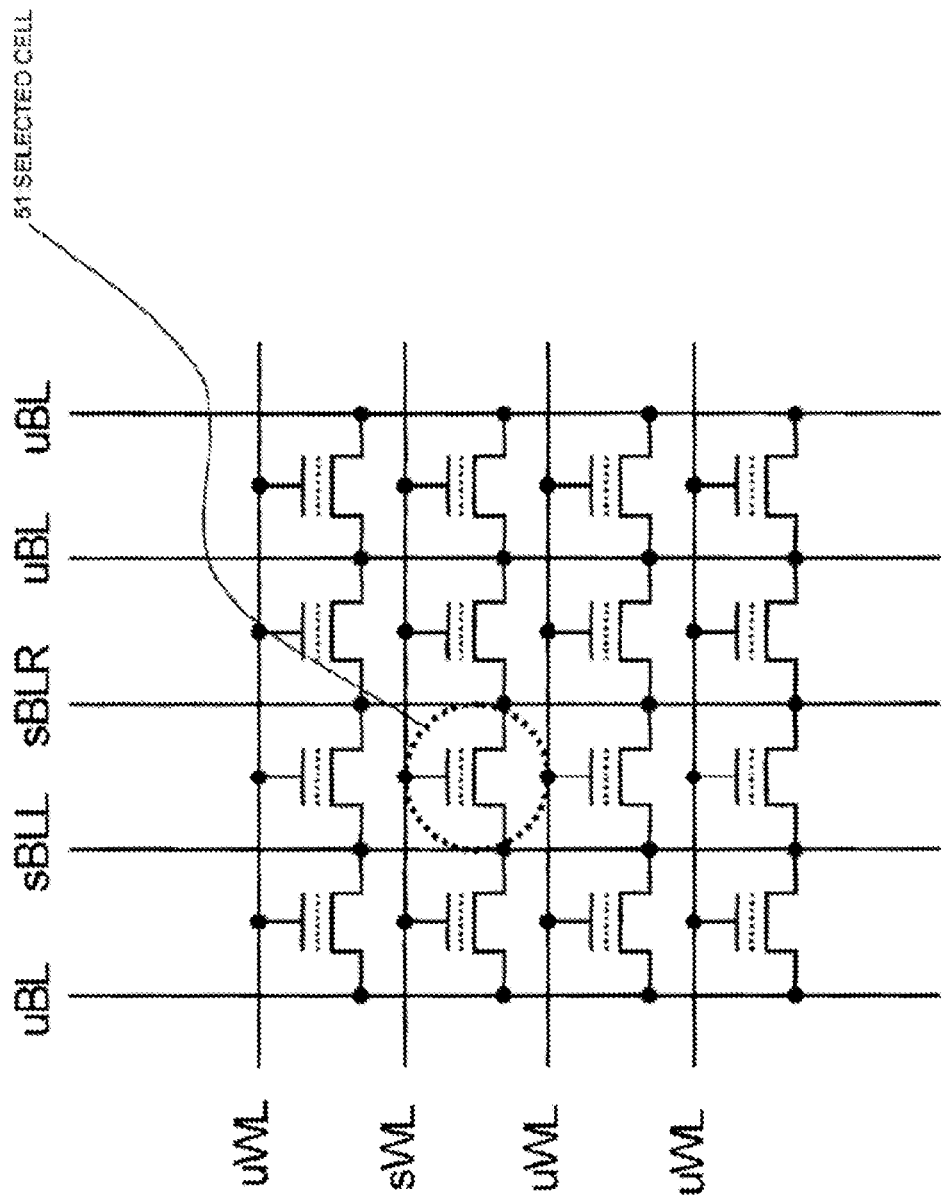
FIG. 5 shows an equivalent circuit diagram of a first embodiment and a selected cell of the memory cell array.

FIG. 5 is a circuit diagram of a memory cell array of this embodiment. The operation conditions in the cases of programming, erasing and reading a selected memory cell 51 are shown in FIG. 6. There is a circuit (internal voltage generator) to generate high voltages of 8V and 12 V and negative voltages of -1V, -2V, -3V and -8V from externally supplied Vcc of 1.8V. There is a circuit (control circuit) to transfer these high voltages, negative voltages, Vss and Vcc to bit lines, word lines, n-well and p-sub. The internal voltage generator and the control circuit are arranged at the periphery of the memory cell array.

In this memory cell, during programming by B4-HE injection, the voltage Vs of the bit line sBLR which functions as a source is lower than the a well voltage Vsub which is applied to an n type well. The potential difference between the voltage Vs and the drain voltage Vd is not too much. By a small potential difference between a drain and a source and by a back gate effect caused by applying an appropriate back gate voltage to an n type well and by increasing equivalent threshold voltage Vth (absolute value), punch through between a source and a drain may not happen. In addition, it is possible to operate a bit line in which the highest operation speed is demanded in GND-VCC range during programming or reading by applying an appropriate back gate voltage to an n type well.

First, the programming operation of a memory cell array will be explained. Programming of a memory cell is performed by injecting electrons into the charge storage layer 16. Injection of electrons into the charge storage layer 16 is carried out by hot electron injection by band-to-band tunneling (B4-HE (back bias assisted band-to-band tunneling induced hot electron) injection) using a high electric field in a depletion layer which arises by a large potential difference between a gate electrode 19 (sWL) which is applied with a relatively high positive voltage and by a back gate voltage, and by a ground voltage applied to a p type diffusion region 12 (sBLL: below referred to as a drain). In order to supply a ground voltage to the drain, a positive back gate voltage of 4V is applied to the n type well 11. As a result, the drain will be at a relatively negative voltage.

Figure 7:
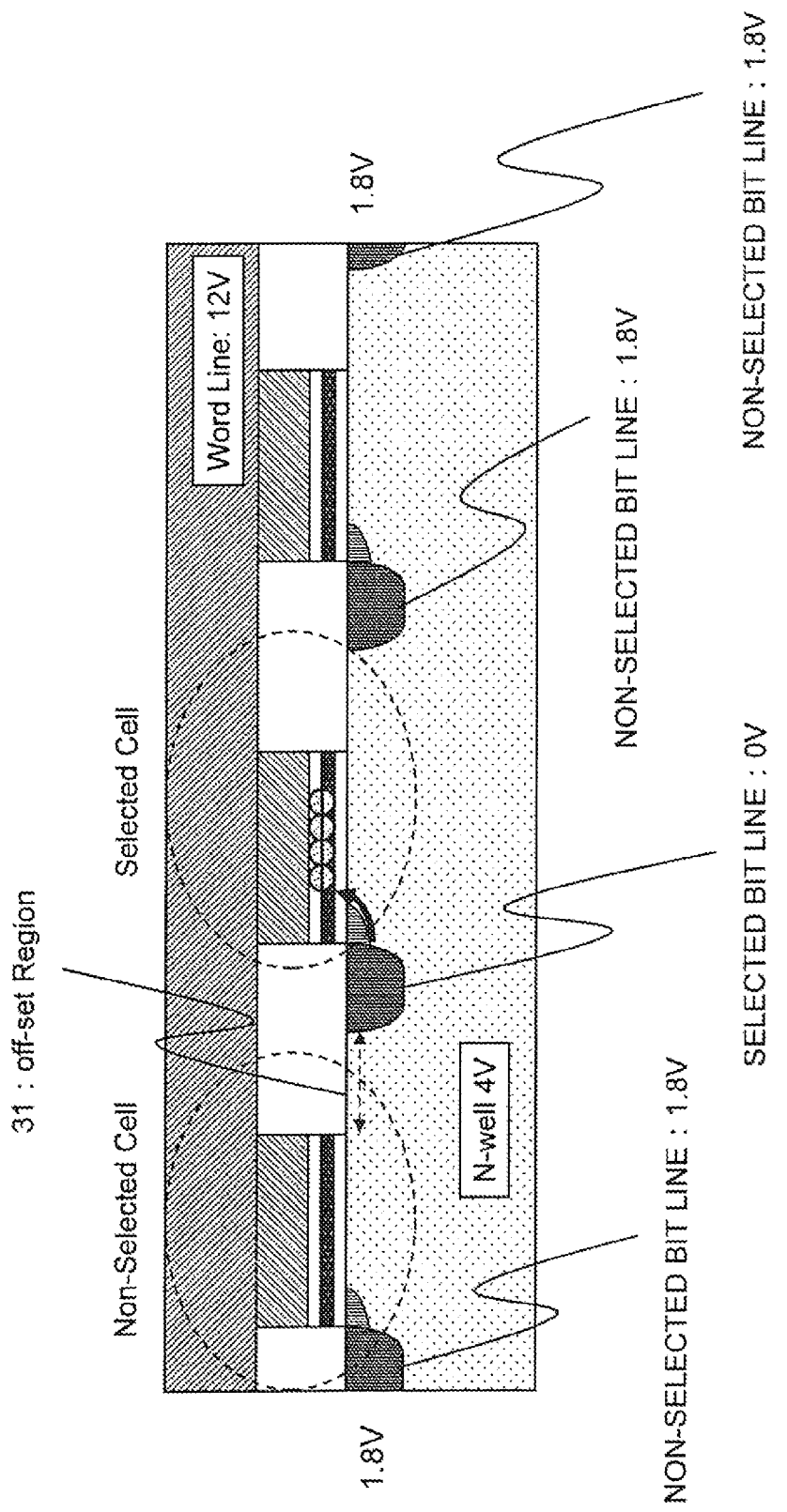
FIG. 7 shows an operation in the case where B4-HE programming is performed in the virtual ground array of the embodiments of the present inventions.

More specifically, as shown in FIG. 6 and FIG. 7, +4V is applied to the n type well 11 as a back gate voltage. Ground voltage (0V) is applied to the drain. Then, 12V is applied to the gate electrode 19 as a gate voltage. At this time, either VCC (=1.8V) is applied to the other p type diffusion region 12 (sBLR: below referred to as a source) of the selected cell 51, or it is made to float.

In addition, 0V or 1.8V is applied to a non-selected word line uWL which has no relationship with the selected cell 51 and either 1.8V is applied to the bit line uBL of the non-selected bit line or it is made to float.

FIG. 7 is a diagram which shows potentials near the selected cell 51 during programming. During programming, by applying a voltage with the conditions shown in FIG. 6, electrons which are generated by BTBT within in the p type diffusion region 12 (sBLL) of the selected cell which functions as a drain by a strong electric field of the halo layer 14 which is formed on the surface which joins the p type diffusion region 12 and the n type well 11 are accelerated and become hot electrons having a high energy. The hot electrons having a high energy are sucked in by a positive voltage which is applied to the gate electrode 19 (sWL), pass over the tunnel insulation film 15 and are injected into the charge storage layer 16.

On the other hand, in a non-selected cell which shares the p type diffusion region 12 (sBLL) with the above selected cell, a halo layer is not formed between the p type diffusion region 12 (sBLL) and an ONO film. An offset region 31 exists under the insulation oxide film layer 20. Therefore, hot electrons are hardly generated near the p type diffusion region 12 (sBLL) to tunnel (BTBT). Even if hot electrons are generated, they are hardly injected into the charge storage layer 16.

Because the injection of this charges is performed while the transistor is turned off and the source 13 and the drain 14 are electrically disconnected, it is possible to secure a high injection efficiency of about $10^{-2}$ and it is possible to obtain about $10^3$ times higher efficiency than the efficiency of conventional channel hot electron injection methods.

Next, a reading operation will be explained by referring to row 4 in FIG. 6. The operation conditions in row 4 are operation conditions at the time of what is called reverse read. Reverse read is an operation in which reading is performed by reversing the function (drain, source) of two bit lines between which the selected cell 51 is located during programming. At the time of reading, 1.8V (=VCC) is applied to the n type well 11 as a back gate voltage and VCC (=1.8V) is applied to one bit line sBLL of the selected cell 51. In this state, after the bit line sBLR which is to be read of the selected cell 51 is applied with 0V (GND), a read voltage Vgr=−2V is applied to the word line sWL of the selected cell. In this way, if the selected cell 51 has been programmed in this voltage pattern the bit line sBLR to be read rises to VCC and if the selected cell has not been programmed the bit line sBLR remains at GND. Reading is then performed by detecting a change in the voltage of this bit line sBLR with a detection circuit.

Furthermore, as shown in row 5 of FIG. 6, the reading operation may also be performed by making the functions of the two bit lines sandwiching the selected cell 51 the same as for programming.

Next, an erasing operation will be explained. There are two methods of erasure as shown in FIG. 6: 1) extraction by FN tunneling (Fowler-Nordheim) shown in row 2 and 2) substrate hot hole injection shown in row 3.

First, extraction by FN tunneling will be explained by referring to row 2 in FIG. 6. Erasure is performed by block unit sharing the same n type well 11. A positive high voltage of 8V is applied to the n type well 11 and a negative high voltage of −8V is applied to all the word lines. In this way, a large potential difference is made between a word line (gate electrode) and the n type well 11 and the electrons trapped in the charge storage layer 16 pass through the tunnel insulation film 15 by an FN tunneling effect and are extracted to the n type well 11. Furthermore, a bit line may be applied with the same high voltage as the n type well 11 or may be floated.

Next, the erasure method by substrate hot hole injection will be explained by referring to row 3 in FIG. 6. −1V is applied to the n type well 11, −8V is applied to the word line 18 and −3V is applied to all the bit lines 12. By applying these voltages, the p type substrate 10, n type well 11 and bit lines 12 function as a bipolar transistor and holes are released from the p type semiconductor substrate to the bit lines 12. At the same time, a high negative voltage is applied to the word line 18, attracting these holes toward the direction of the gate electrode, making these holes to pass through the tunnel insulation film 15 and to move into the charge storage layer 16. The negative charges of the electrons are cancelled out by the positive charges of these holes and as a result the charges of the charge storage layer 16 disappear and the data is erased.

Here, an outline of the manufacturing process of the above mentioned memory cell array will be explained by referring to FIG. 8 to FIG. 14. This process is divided into process 1 to process 7 and explained in FIG. 8 to FIG. 14 respectively.

Figure 8:
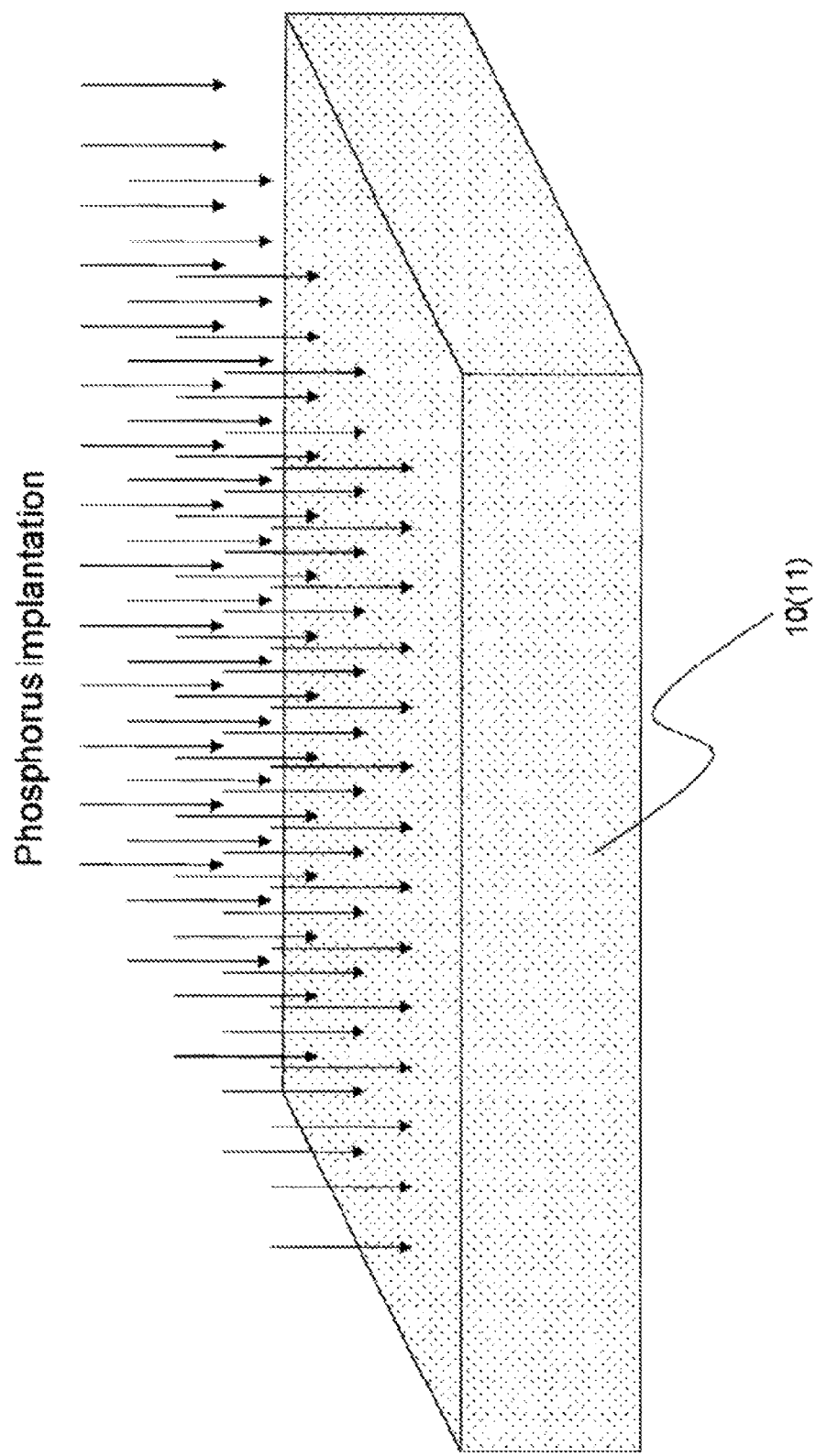
FIG. 8 shows a manufacturing process (Process 1) of the memory cell array of a first embodiment.
Figure 9:
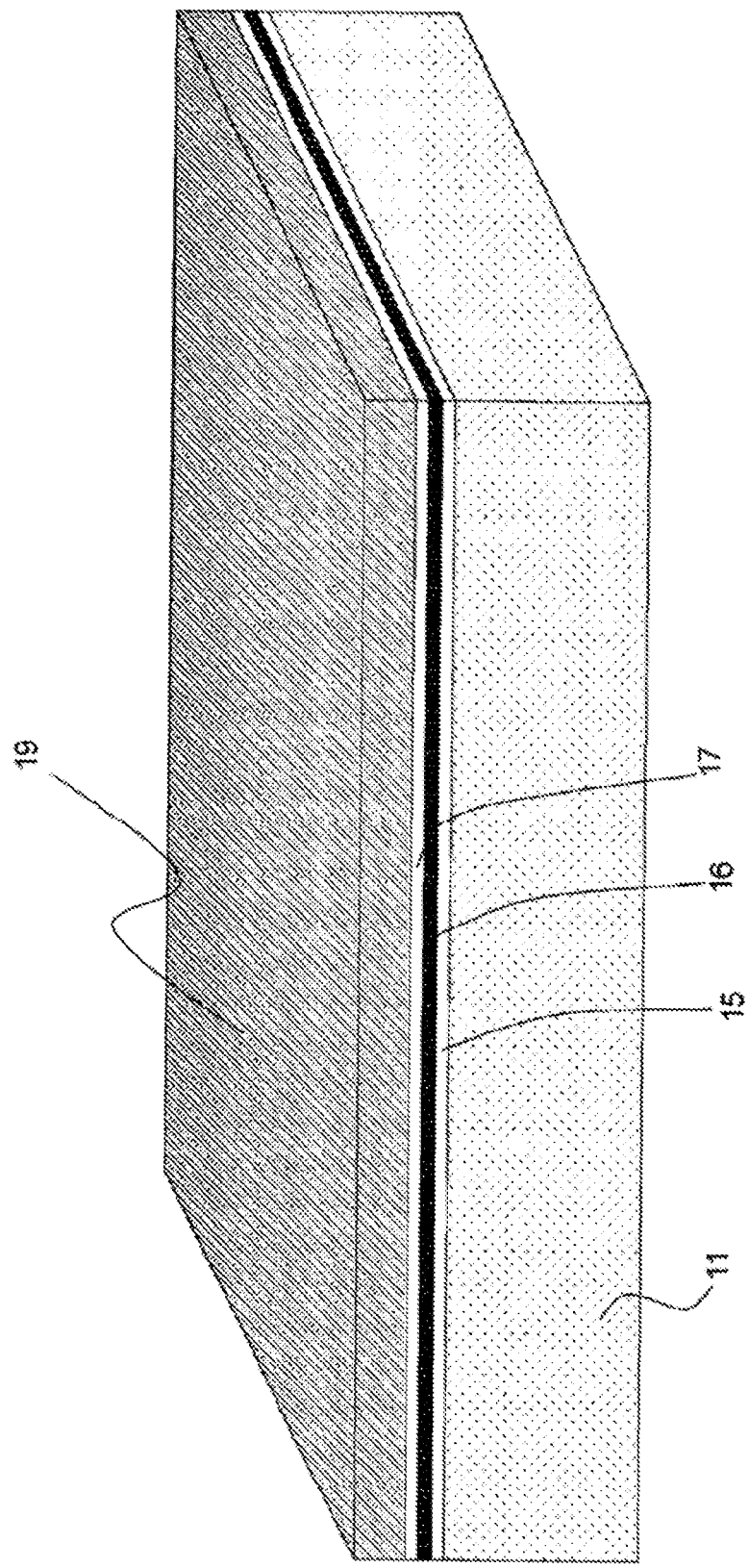
FIG. 9 shows a manufacturing process (Process 2) of the memory cell array of a first embodiment.

In the process 1 shown in FIG. 8, phosphorus is implanted into the entire surface of the silicon substrate 10 and an n type well 11 is then formed by annealing. In the process 2 shown in FIG. 9, ONO film 30 (tunnel oxide film 15, nitride silicon film, (charge storage layer) 16 and insulation oxide film 17) and a polysilicon film 19 is formed. The oxide films 15, 17 are formed by CVD or a thermal oxidization. The nitride film 16 is formed by CVD. In addition, the polysilicon film 19 is formed by CVD. Here, the entire surface in the process 1, the process 2 and all further processes means the entire block region of a memory cell array. When there are a plurality of block regions, a plurality of n type wells are formed. In these processes, openings made in a photo-resist are used for a memory cell array with a plurality of block regions.

Figure 10:
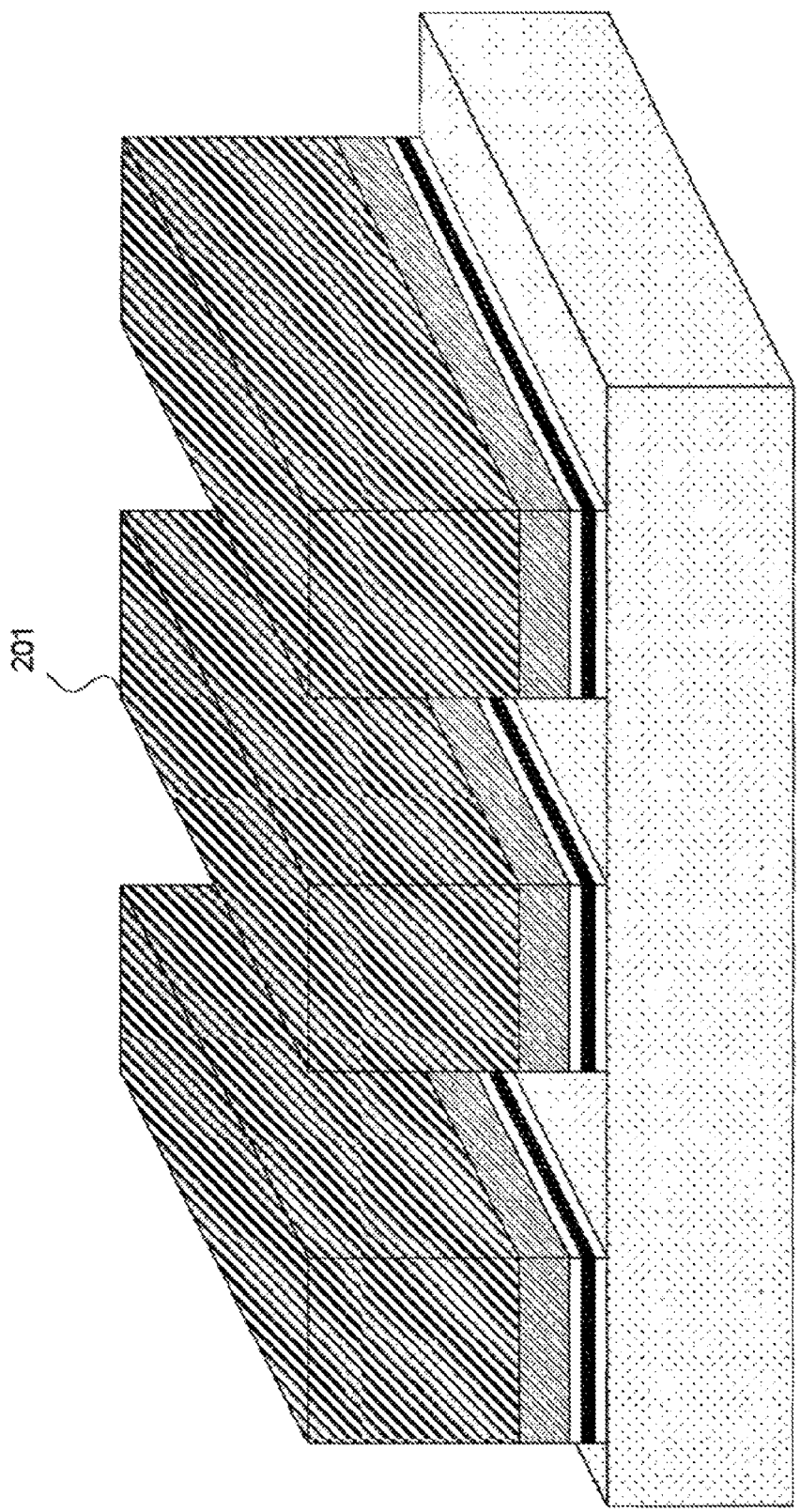
FIG. 10 shows a manufacturing process (Process 3) of the memory cell array of a first embodiment.

In the process 3 shown in FIG. 10, a photo-resist 201 is formed in a stripe shape in a Y direction, and the ONO film 30 and polysilicon film 29 are patterned along the Y direction. The regions under the ONO film 30 and the polysilicon 19 which are left by the patterning using the photo-resist 201 will become channel regions of memory cell transistors. Bit lines 12 of p type diffusion regions 12 will be later formed in the regions where the ONO film 30 and the polysilicon film 19 are removed.

Figure 11:
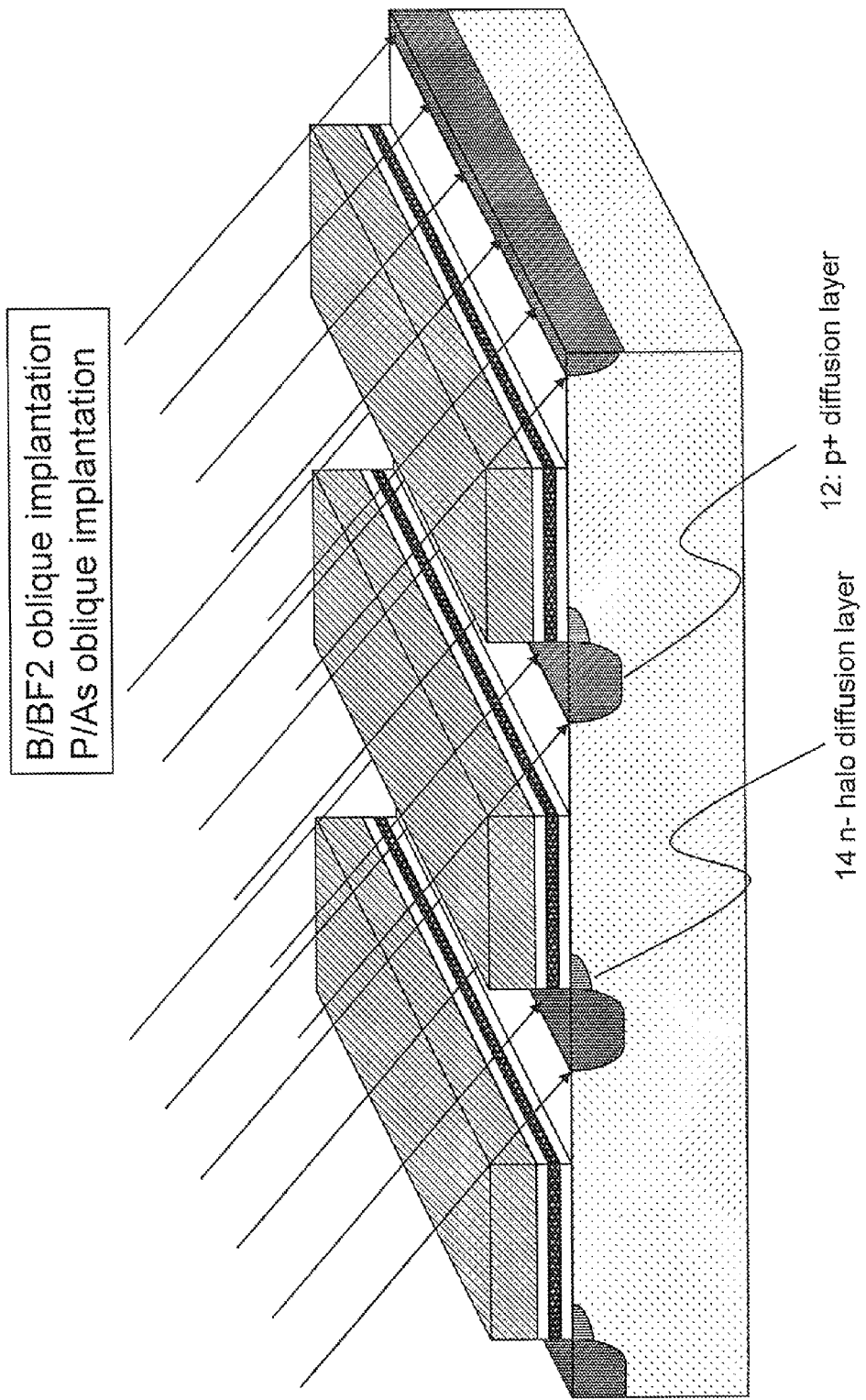
FIG. 11 shows a manufacturing process (Process 4) of the memory cell array of a first embodiment.

In the process 4 shown in FIG. 11, the photo-resist 201 is removed and p type impurities (B or BF$_2$) are obliquely implanted using the polysilicon film 19 which was patterned in the process 3 as a shade to form p type diffusion regions 12. These p type diffusion regions 12 will become bit lines in the memory cell array. In the formation of the p type diffusion regions 12, the oblique injection angle is set so that the p type diffusion regions 12 is formed in a desired shape using a shadowing effect by the polysilicon film 19. Since the edges of the polysilicon film 19 are sharper than the photo-resist, oblique injection is done in higher accuracy than oblique injection using photo-resist.

Next, n type impurities (P, As etc) are implanted at a greater oblique angle in the same direction to form n type halo regions 14 on one side surfaces of the p type diffusion region (X side). The formation of the halo regions 14 is performed by optimally setting the oblique injection angle.

Figure 12:
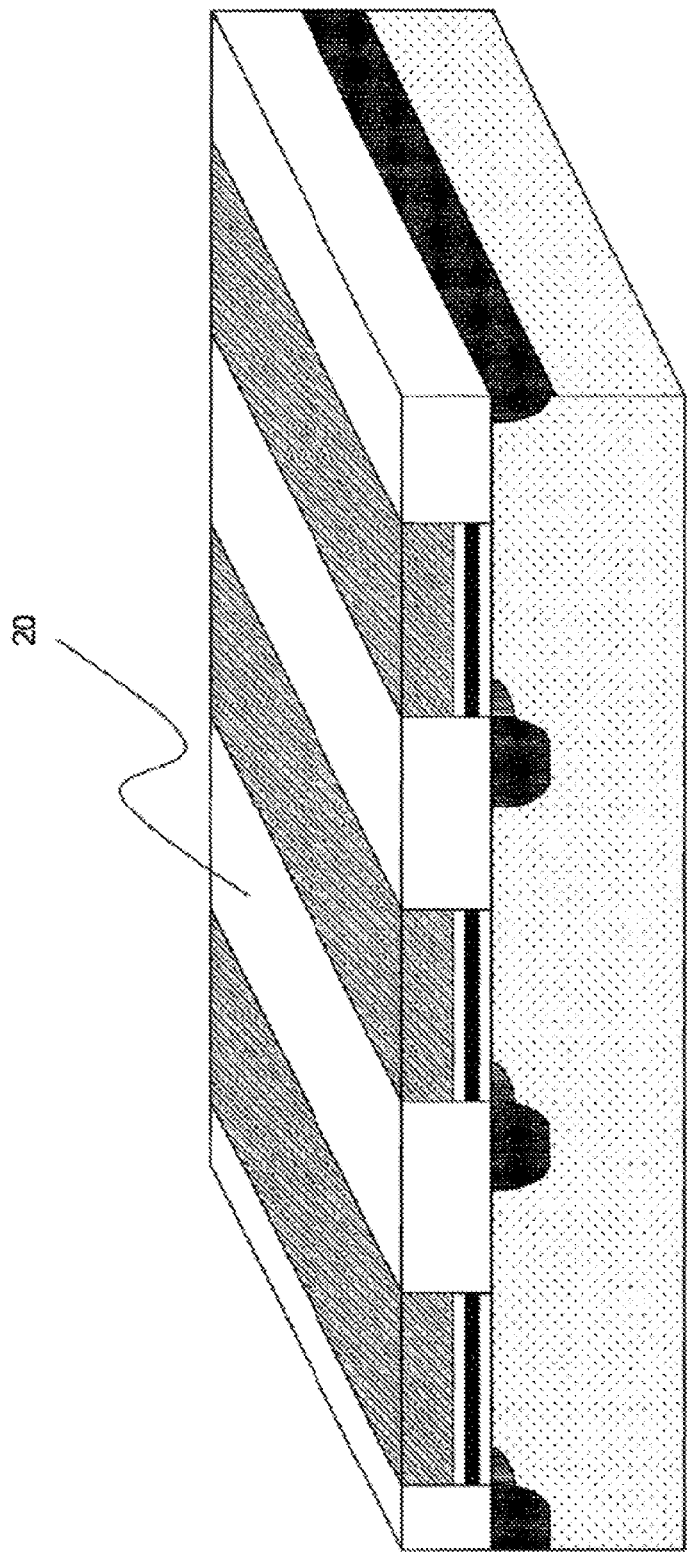
FIG. 12 shows a manufacturing process (Process 5) of the memory cell array of a first embodiment.

In the process 5 shown in FIG. 12, an insulation oxide film layer 20 is formed which fills the gaps where the ONO films and polysilicon films were removed in the process 3. This insulation oxide film layer 20 is formed by a CVD, for example, and then smoothed by CMP.

Figure 13:
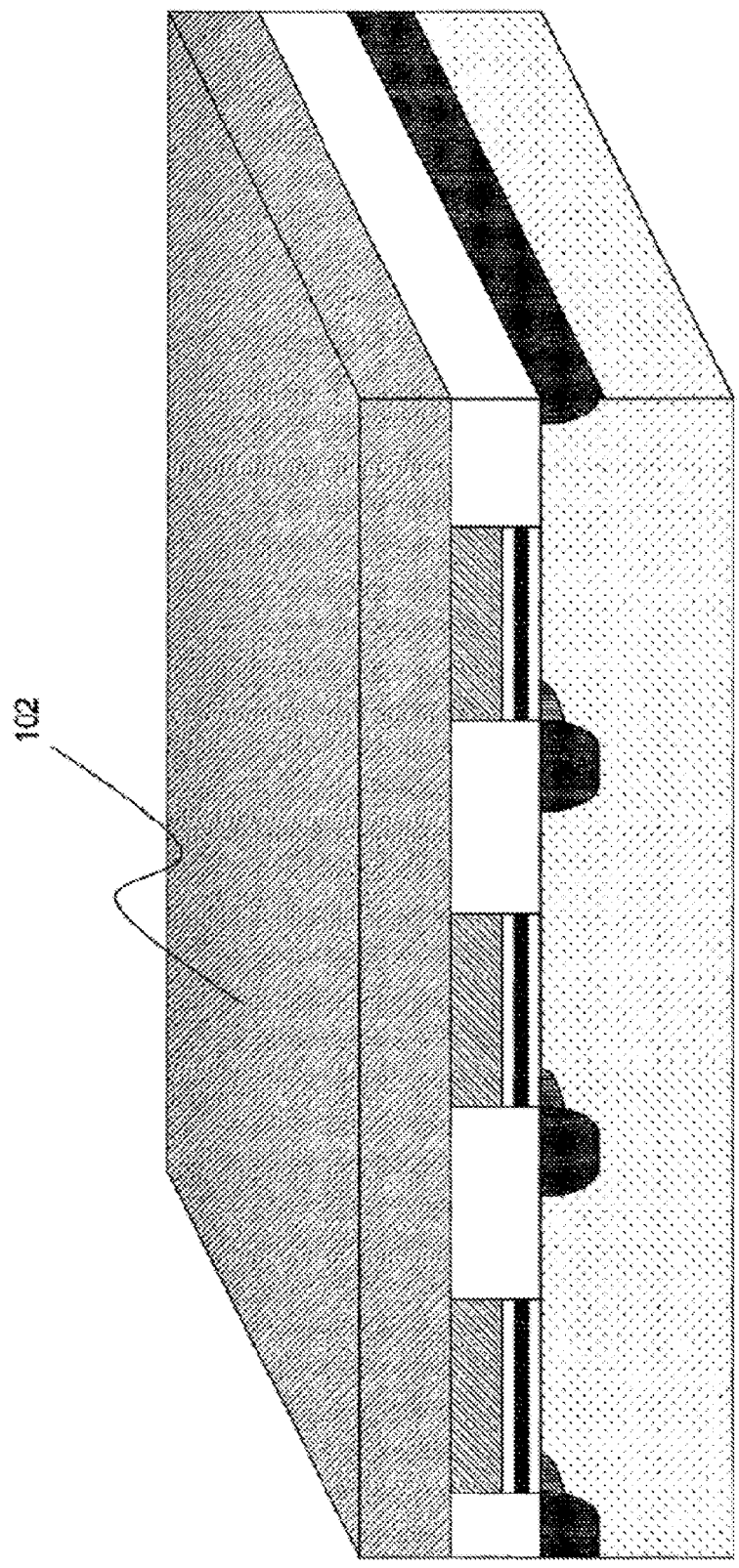
FIG. 13 shows a manufacturing process (Process 6) of the memory cell array of a first embodiment.

In the process 6 shown in FIG. 13, a polysilicon layer 102 is formed on the entire surface. This polysilicon layer 102 will become word lines by later performing patterning.

Figure 14:
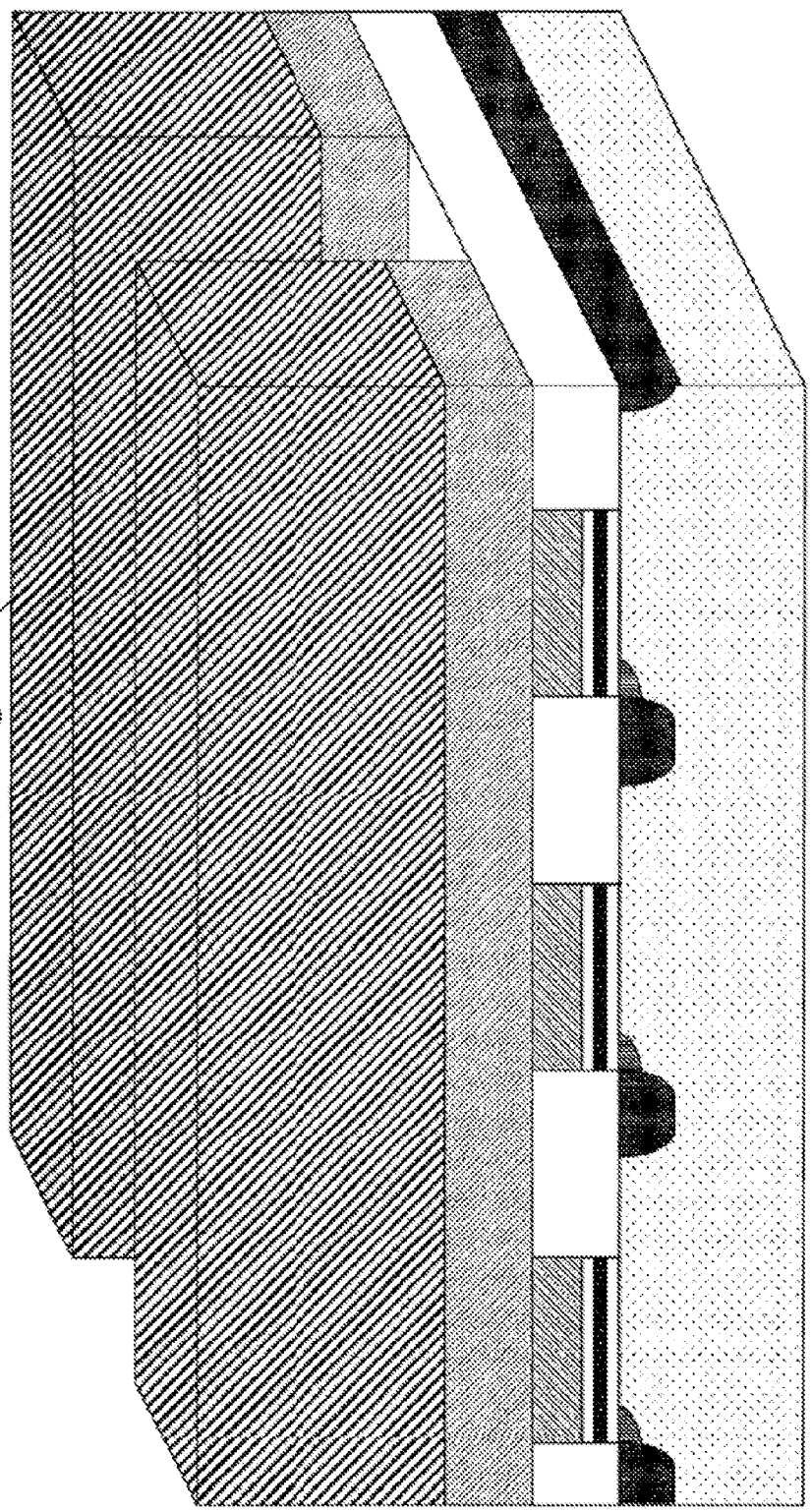
FIG. 14 shows a manufacturing process (Process 7) of the memory cell array of a first embodiment.

In the process 7 shown in FIG. 14, a photo-resist 202 of gate pattern of a stripe shape in a X direction which is perpendicular to the Y direction is formed. The polysilicon layer 102 and the polysilicon layer 19 below the photo-resist 202 are removed by etching, therefore gate electrodes 19 and 18 (word lines) and memory cell transistors are formed.

The photo-resist 202 is removed and the memory cell array shown in FIG. 4 is formed. After these processes 1-7, periphery circuits and upper wiring layers are formed to complete the non-volatile semiconductor memory device.

By offsetting the charge storage layers 16 which are adjacent to the bit lines 12 toward -X by the insulation oxide film layer 20, programming to a non-selected cell is prevented. As a result, even in a structure in which an LDD region is omitted, it is possible to prevent programming to a non-selected cell Second Embodiment A second embodiment of this invention comprising a memory cell array will be explained by referring to FIG. 15 to FIG. 24.

Figure 15:
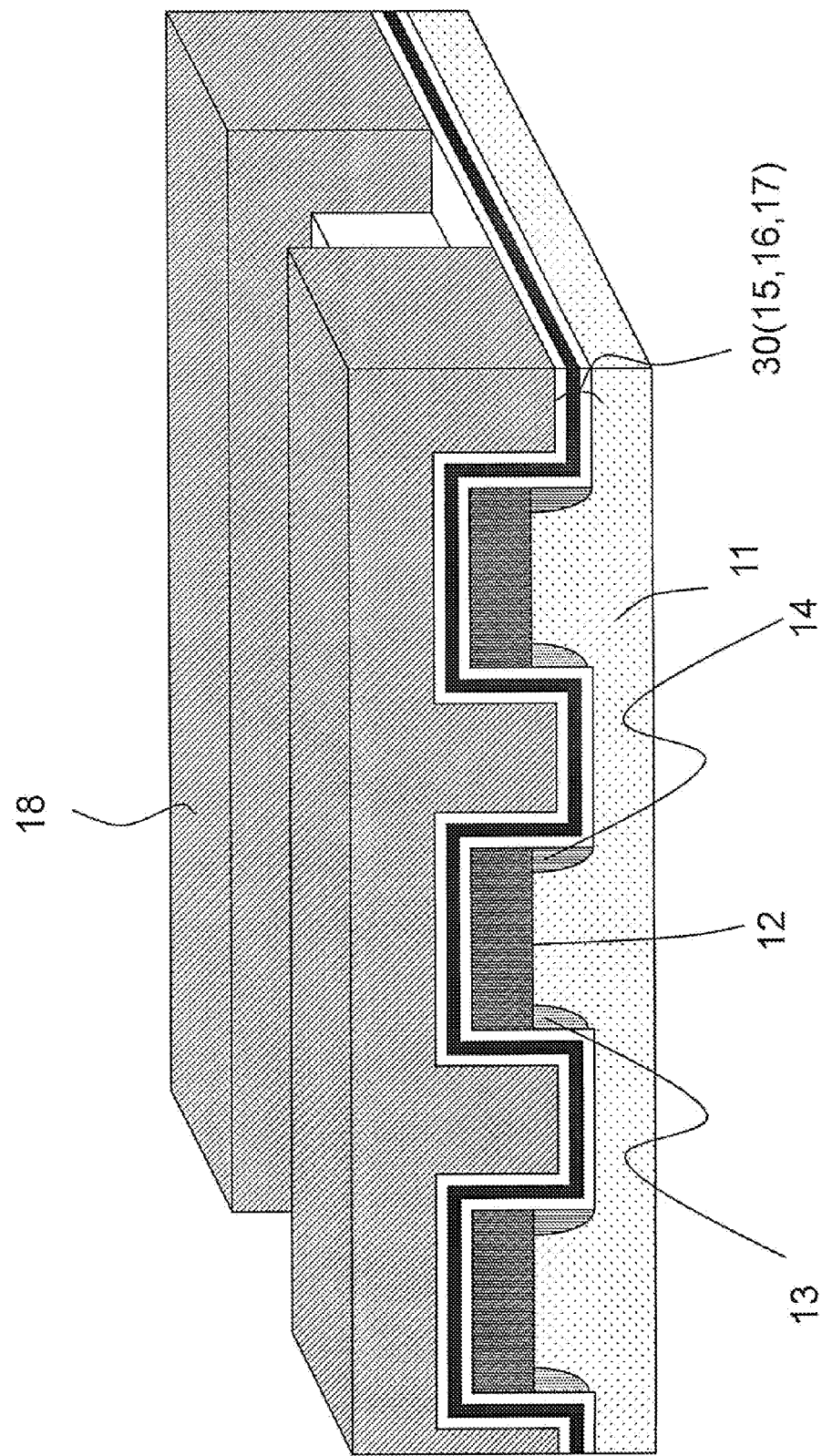
FIG. 15 shows a cross sectional oblique view of a second embodiment of the present invention.

FIG. 15 is a cross sectional oblique view which shows the structure of a memory cell array of the second embodiment of the present invention. This memory cell array has a p channel MONOS structure and is a memory cell array having a three dimensional structure in which a difference in height is made between channel regions and source/drain regions. In the explanation in second embodiment, the same elements as in the first embodiment have the same reference numbers and their explanation will be thus omitted.

In addition, the memory cell array in the second embodiment has a three dimensional structure which is different to the structure in the first embodiment, however, because the equivalent circuits and operation fundamentals are the same as the memory cell array in the embodiment, explanations on programming, erasure and reading are omitted.

Here, an outline of the manufacturing process of the above mentioned memory cell array will be explained by referring to FIG. 16 to FIG. 24. This process is divided into process 1 to process 7 explained in FIG. 16 to FIG. 24 respectively.

Figure 16:
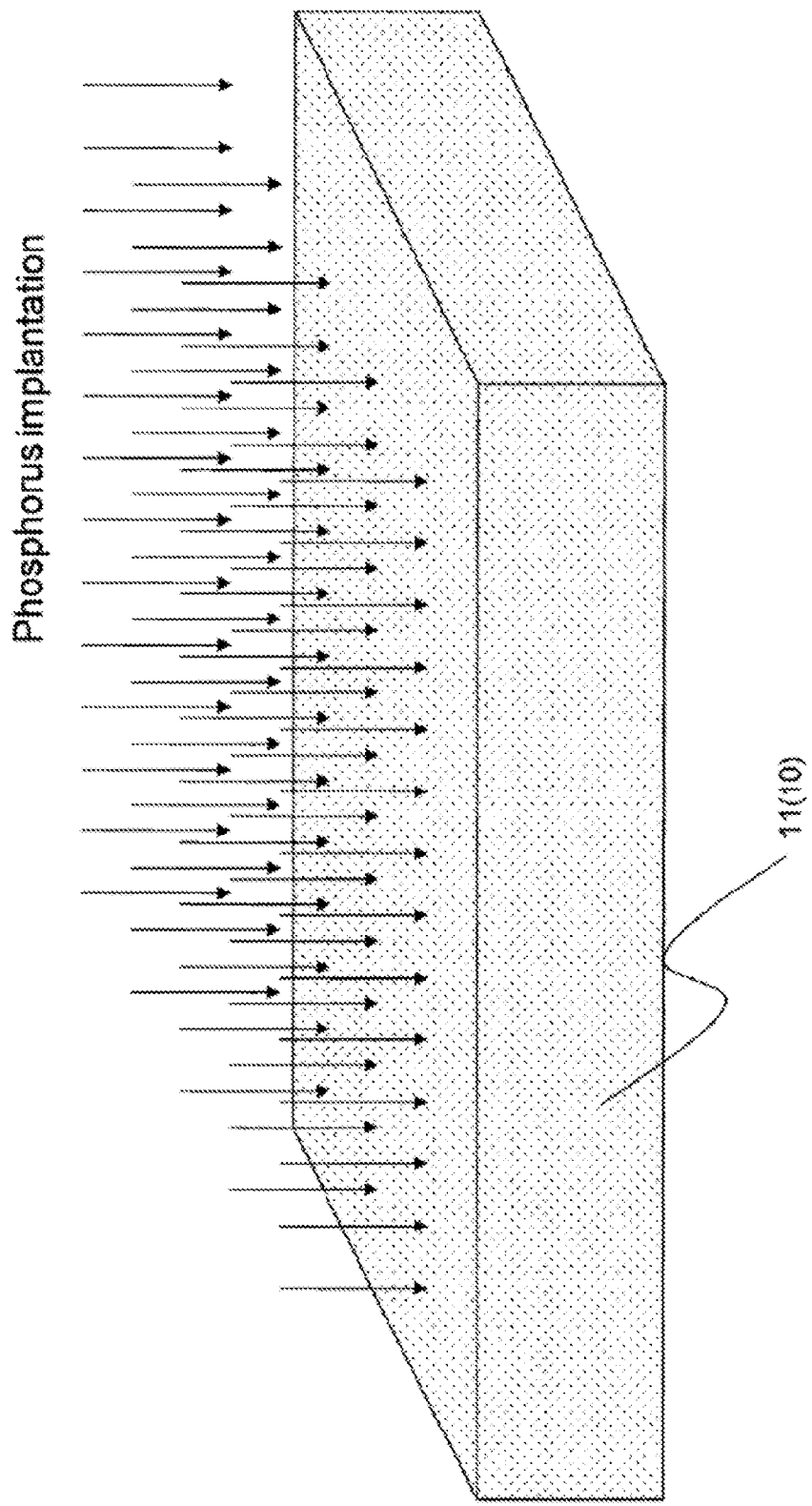
FIG. 16 shows a manufacturing process (Process 1) of the memory cell array of a second embodiment.
Figure 17:
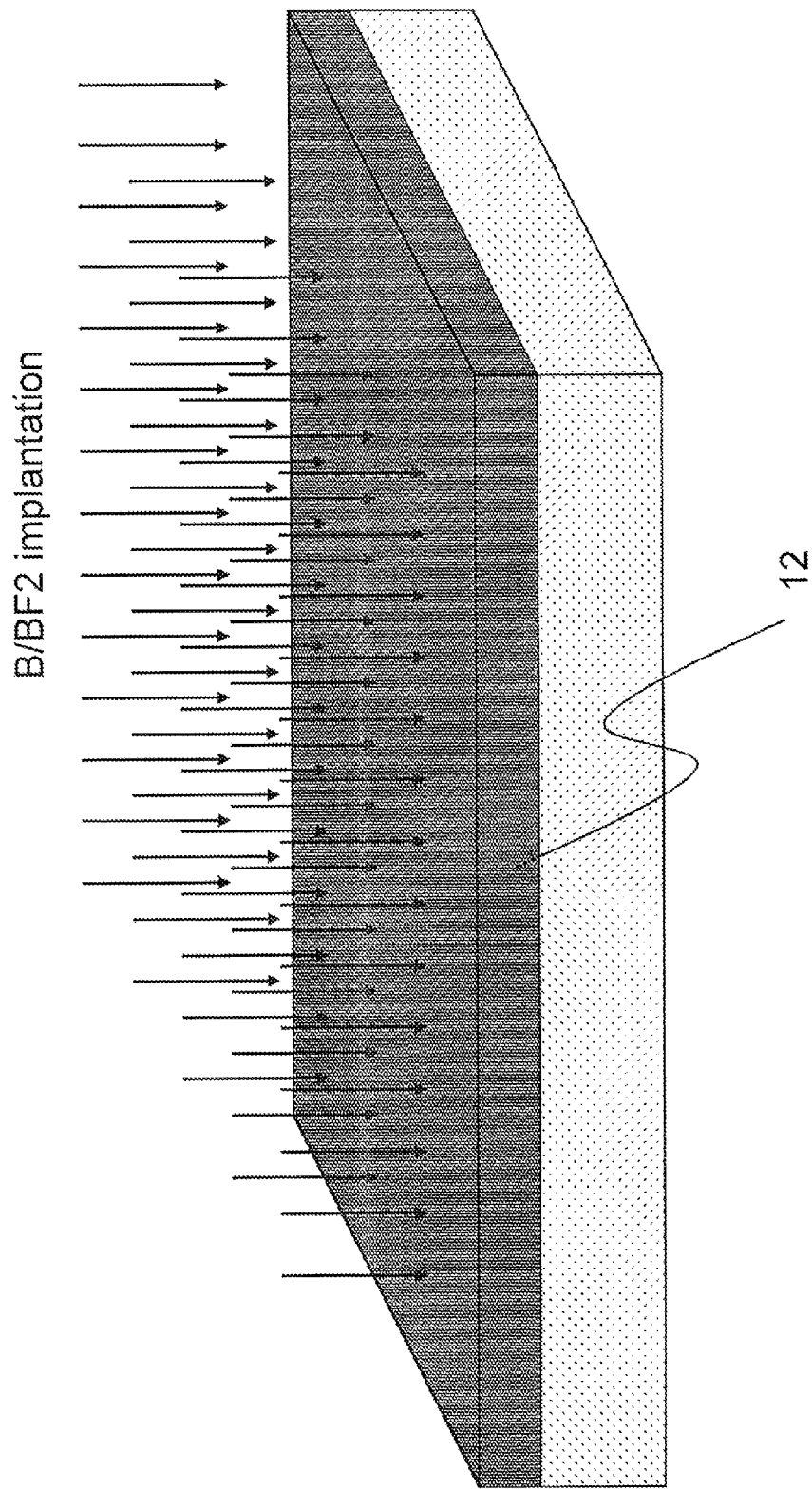
FIG. 17 shows a manufacturing process (Process 2) of the memory cell array of a second embodiment.
Figure 18:
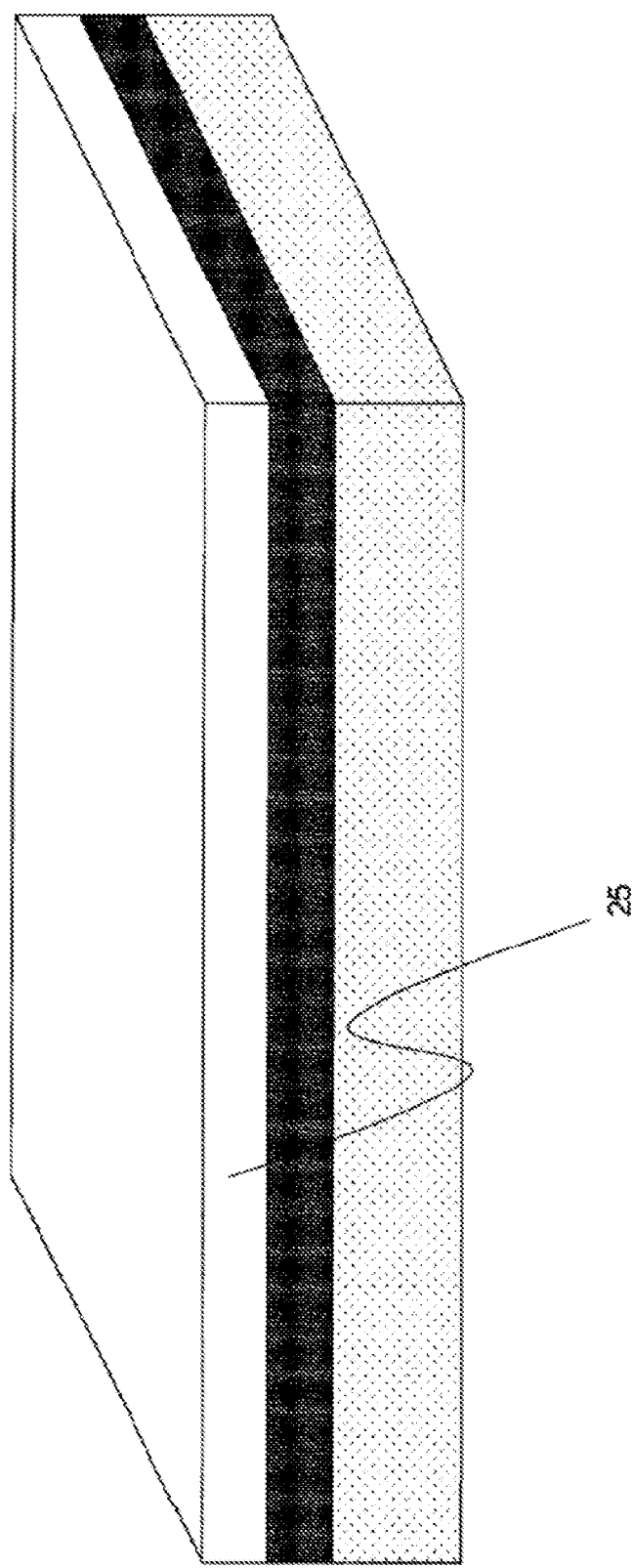
FIG. 18 shows a manufacturing process (Process 3) of the memory cell array of a second embodiment.
Figure 19:
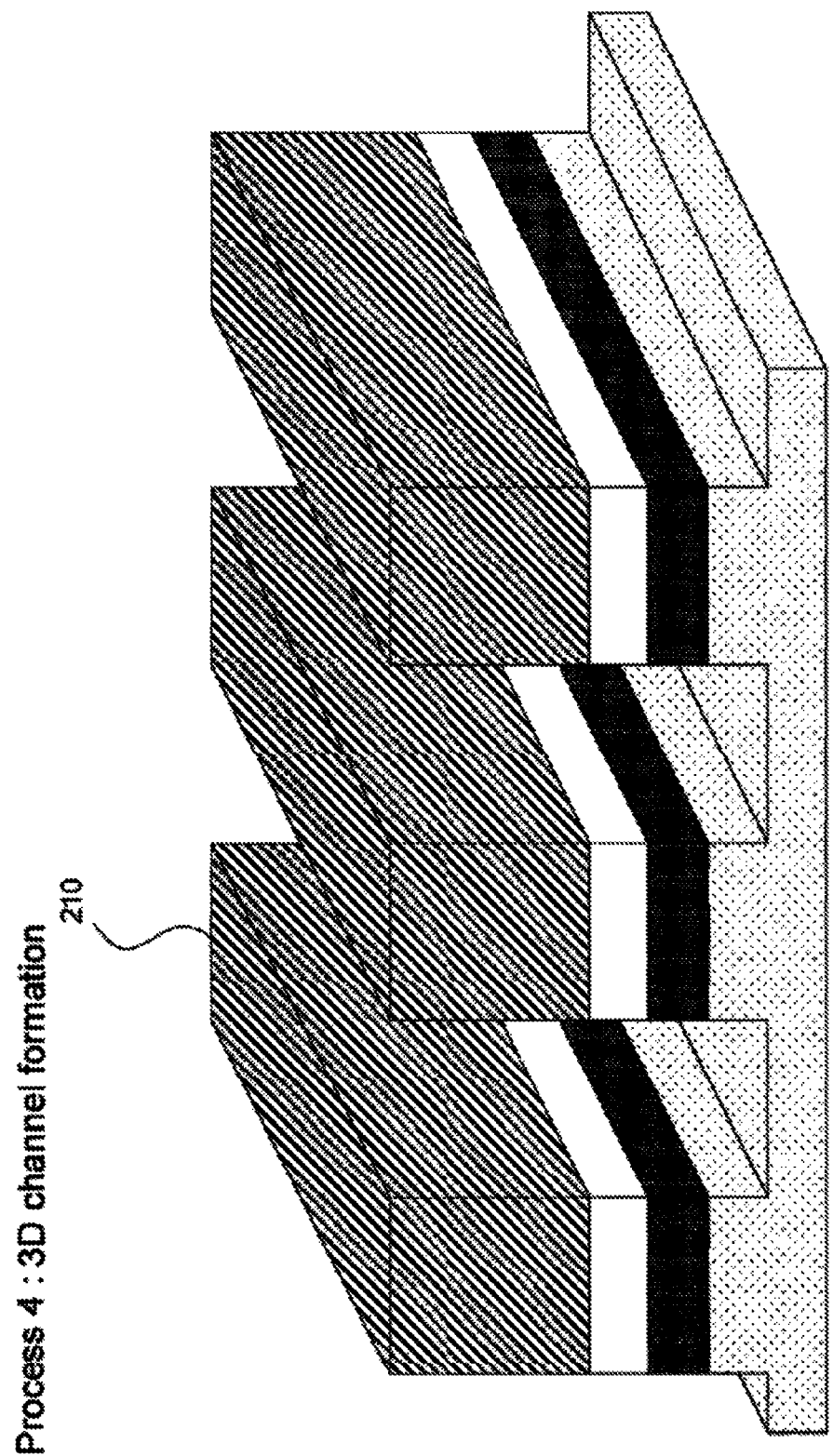
FIG. 19 shows a manufacturing process (Process 4) of the memory cell array of a second embodiment.

In the process 1 shown in FIG. 16, phosphorus is implanted into the entire surface of the silicon substrate 10 and an n type well 11 is formed. In the process 2 shown in FIG. 17, p type impurities (B or BF$_2$) are implanted into the entire surface region of the n type well 11 and a p type diffusion region 12 is formed. Furthermore, in the process 3 shown in FIG. 18, an oxide film layer 25 which will be used as an oblique injection mask (shade) is formed. Here, the entire surface in the process 1, the process 2 and all further processes means the entire block region of a memory cell array. When there are a plurality of block regions, a plurality of n type wells are formed. In these processes, openings made in a photo-resist are used for a memory cell array with a plurality of block regions.

In the process 4 shown in the p type diffusion layer 12 which is left by the patterning by the photo-resist 210 will become bit lines and source/drains of memory cell transistors. In addition, the surface regions of the n type well 11 which are in the grooves made by the above etching will become channel regions of memory cell transistors.

Figure 20:
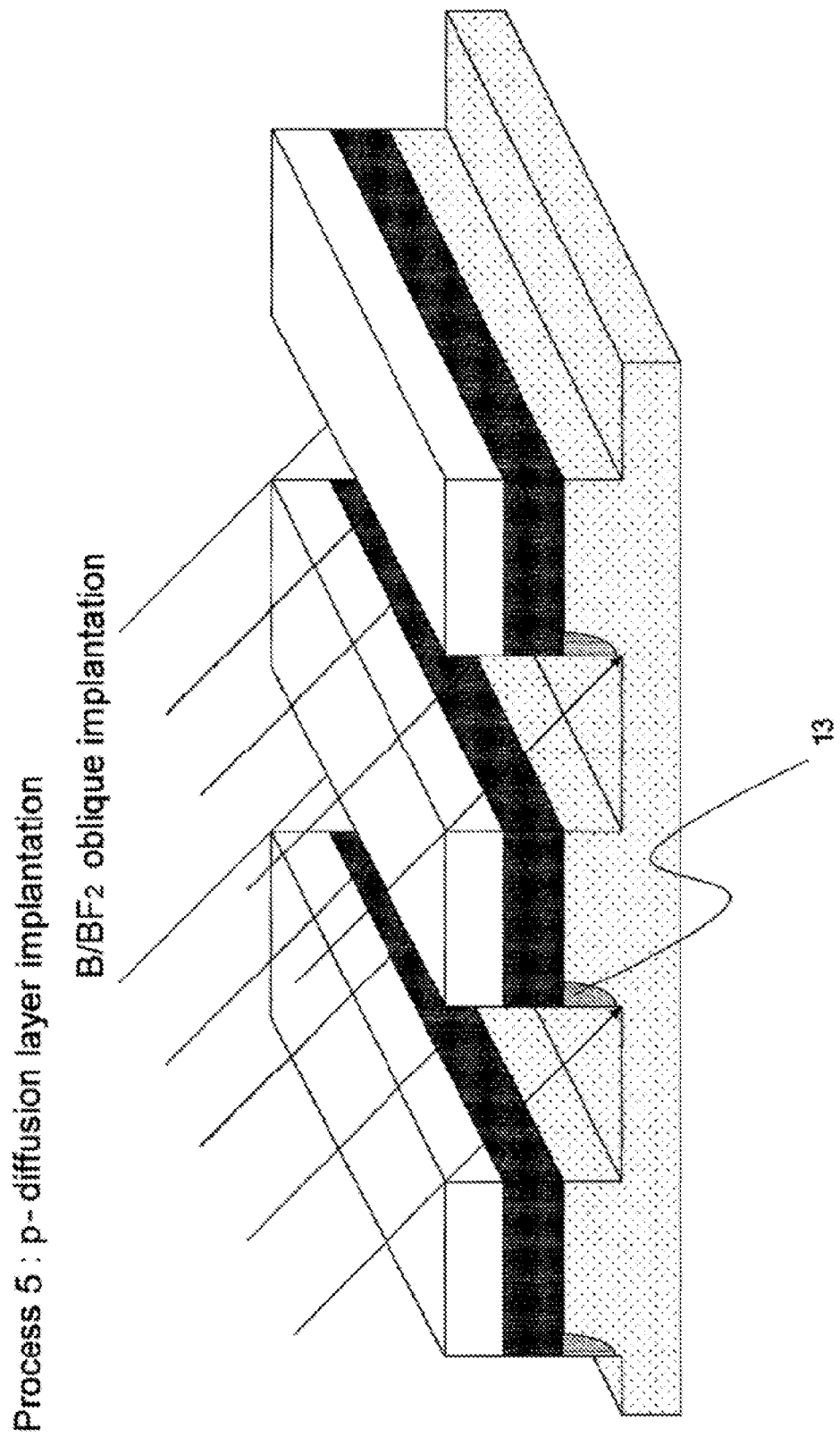
FIG. 20 shows a manufacturing process (Process 5) of the memory cell array of a second embodiment.

In the process 5 shown in FIG. 20, the photo-resist 210 is removed, and then p type impurities (B or BF$_2$) are obliquely implanted using the oxide film layer 25 patterned in the process 4. P– diffusion regions 13 are formed. The p– diffusion regions 13 are regions in which p type impurities are diffused at a lower concentration than the previously formed p type diffusion region 12 and functions as a LDD (Lightly Doped Drain) region in a memory cell transistor.

Figure 21:
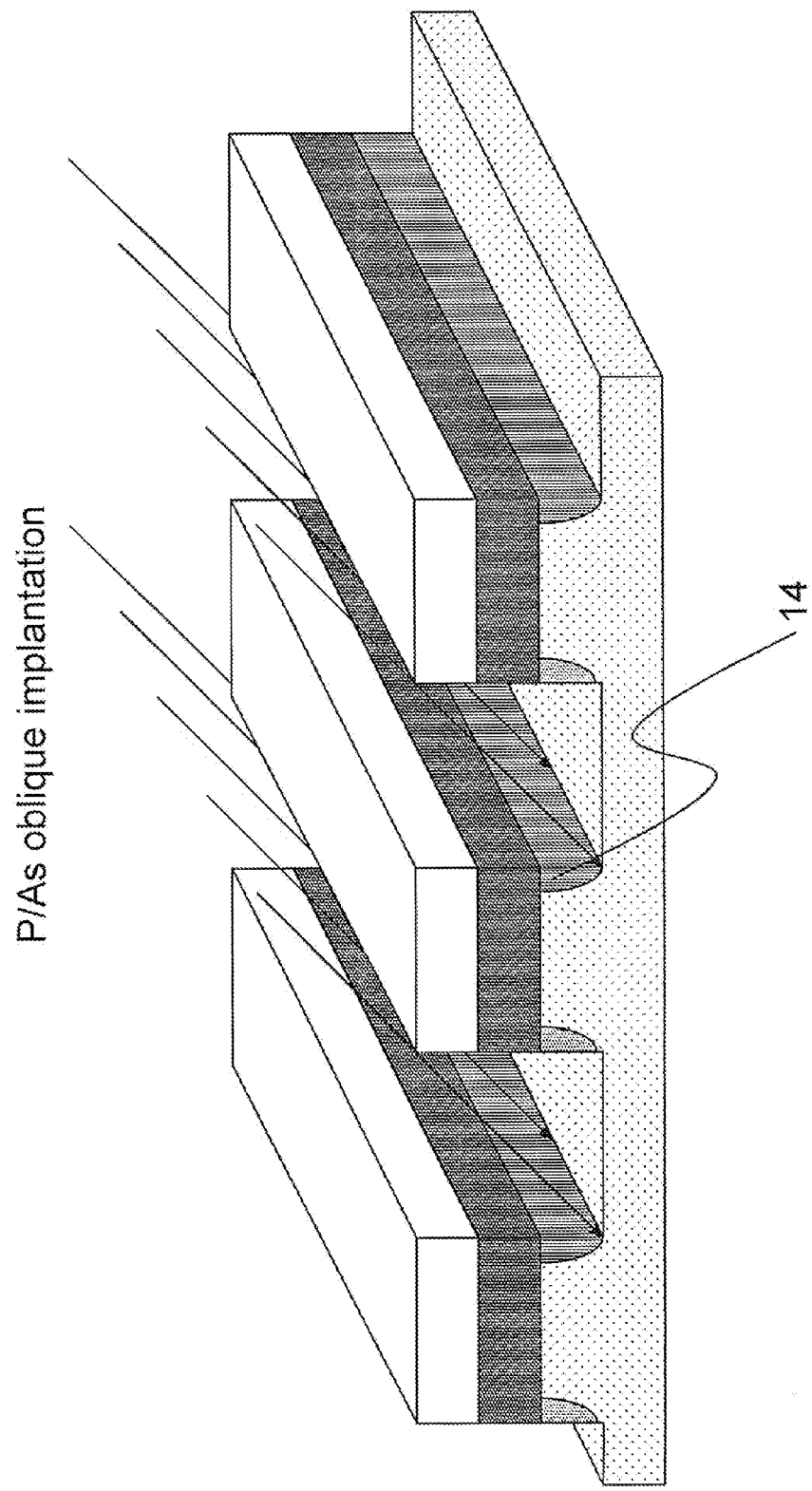
FIG. 21 shows a manufacturing process (Process 6) of the memory cell array of a second embodiment.

In the process 6 shown in FIG. 21, n type impurities (P or As) are obliquely implanted in the opposite direction to the process 5 using the oxide film layer 25 patterned in the process 4 and n type diffusion regions 14 is formed. The n type diffusion regions 14 are regions in which n type impurities are diffused at a higher concentration than the n type well 11 and function as halo regions in memory cell transistors.

Figure 22:
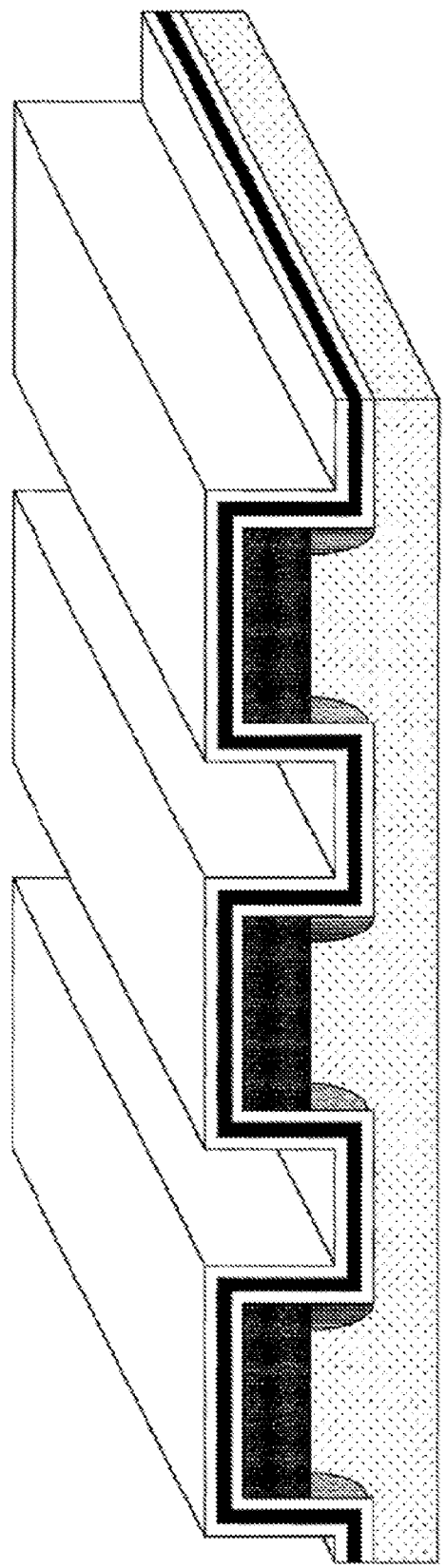
FIG. 22 shows a manufacturing process (Process 7) of the memory cell array of a second embodiment.

In the process 7 shown in FIG. 22, the oxide film layer 25 used as an oblique injection mask is removed, and ONO film 30 (tunnel oxide film 15, nitride silicon film, (charge storage layer) 16 and insulation oxide film 17) is formed. The oxide films 15 and 17 are formed by a thermal oxidization and the nitride film 16 is formed by CVD.

Figure 23:
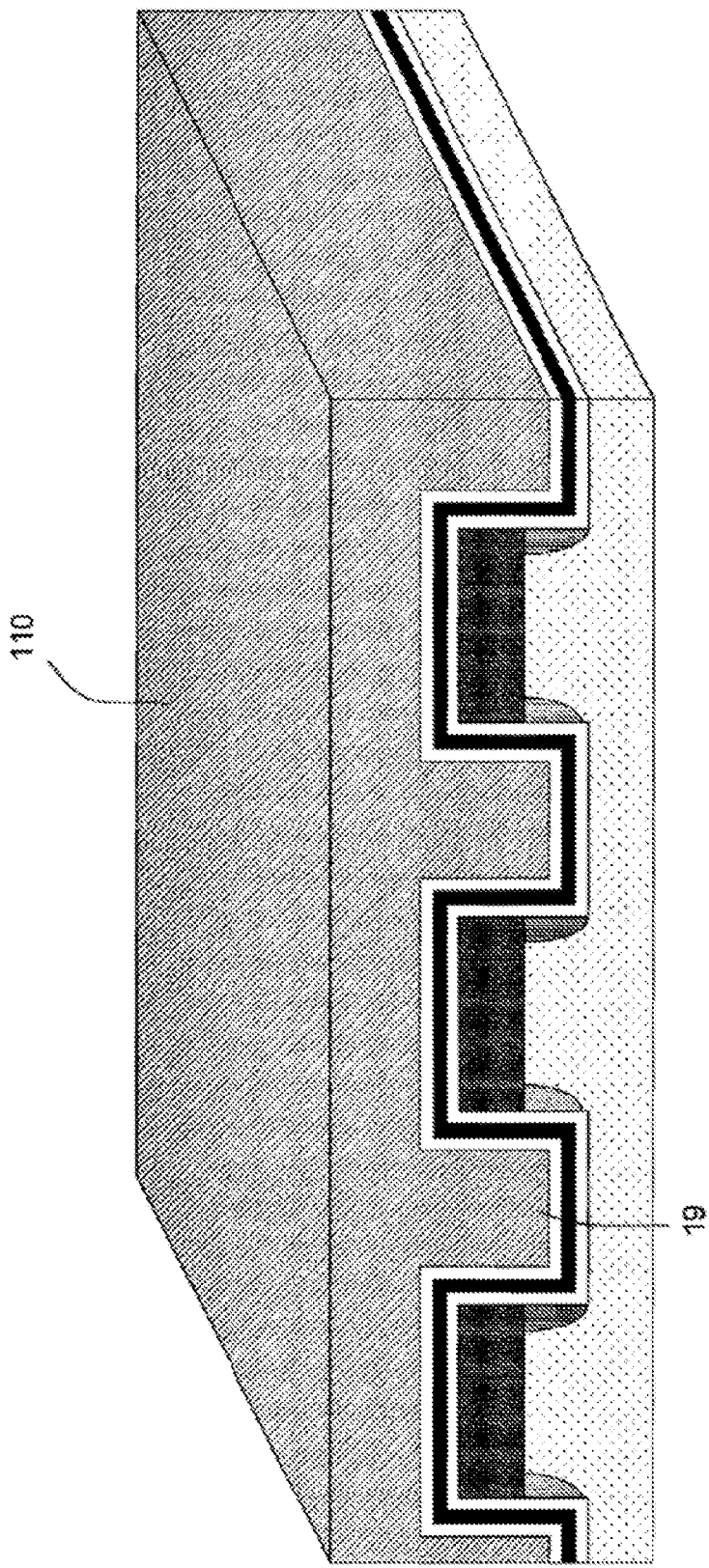
FIG. 23 shows a manufacturing process (Process 8) of the memory cell array of a second embodiment.

In process eight in FIG. 23, a polysilicon layer 110 is formed on the entire surface. This polysilicon layer 110 will later become word lines 18 and gate electrodes 19 when patterned.

Figure 24:
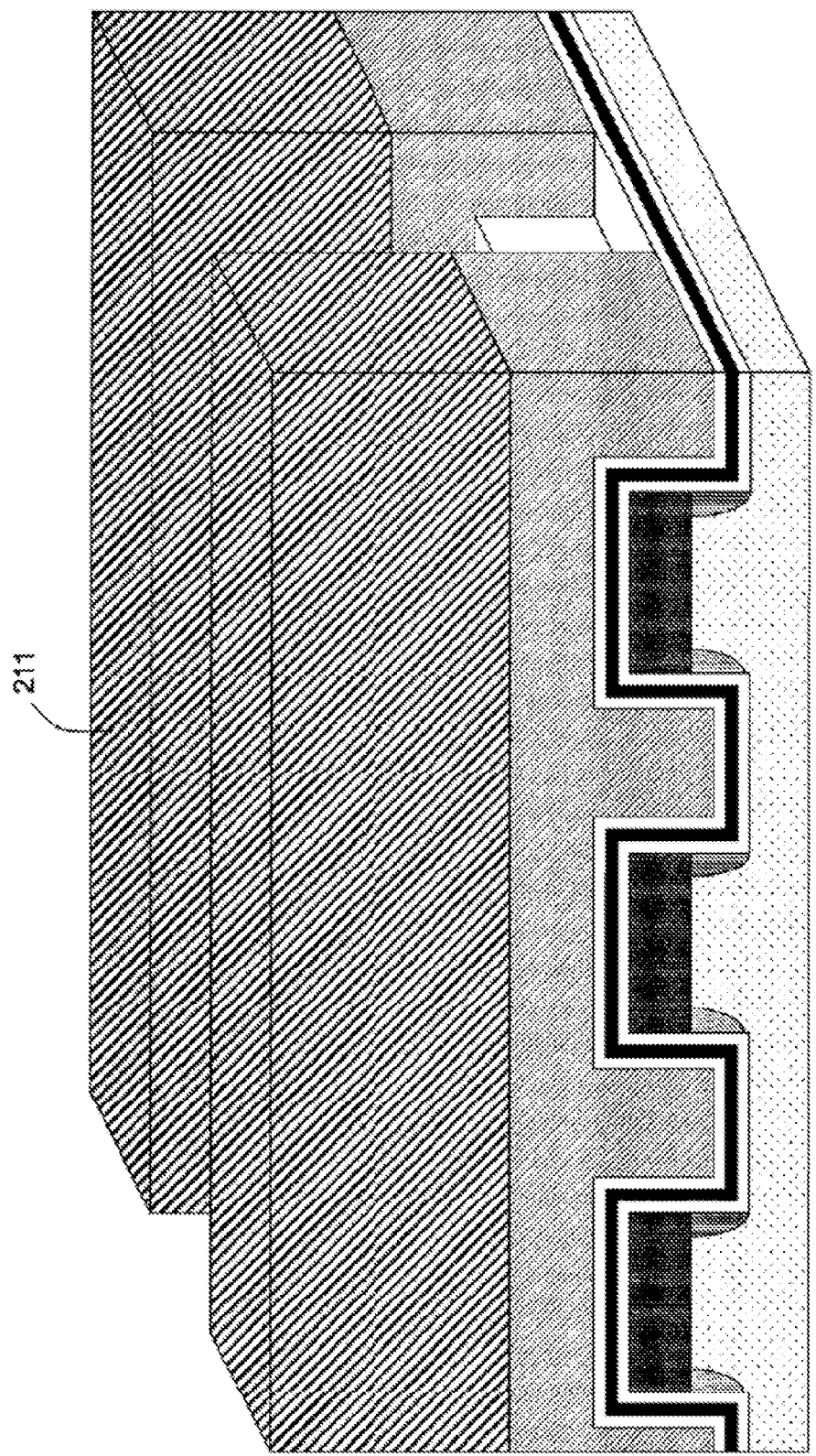
FIG. 24 shows a manufacturing process (Process 9) of the memory cell array of a second embodiment.

In the process 9 in FIG. 24, a photo-resist 211 of a stripe pattern (gate pattern) along the X direction which is perpendicular to the Y direction is formed. The polysilicon layer 110 is removed by etching and the gate electrodes 18 (word lines) and the gate electrodes 19 are formed.

The photo-resist 211 is, then, removed, and the memory cell array shown in FIG. 15 is formed. After the above processes 1-9 periphery circuits and upper wirings are formed and the non-volatile semiconductor memory device is complete.

Since each of the memory cells of this structure has a channel along the surface of the groove formed in the n type well region 11, it is possible to lengthen an effective channel length between the source and the drain even if the gap between the source and drain is shortened, thereby contributing to the miniaturization of a memory cell array.

It is also possible to omit the LDD region 13 with this structure.

Third Embodiment

A third embodiment of this invention comprising a memory cell array will be explained by referring to FIG. 25 to FIG. 34.

Figure 25:
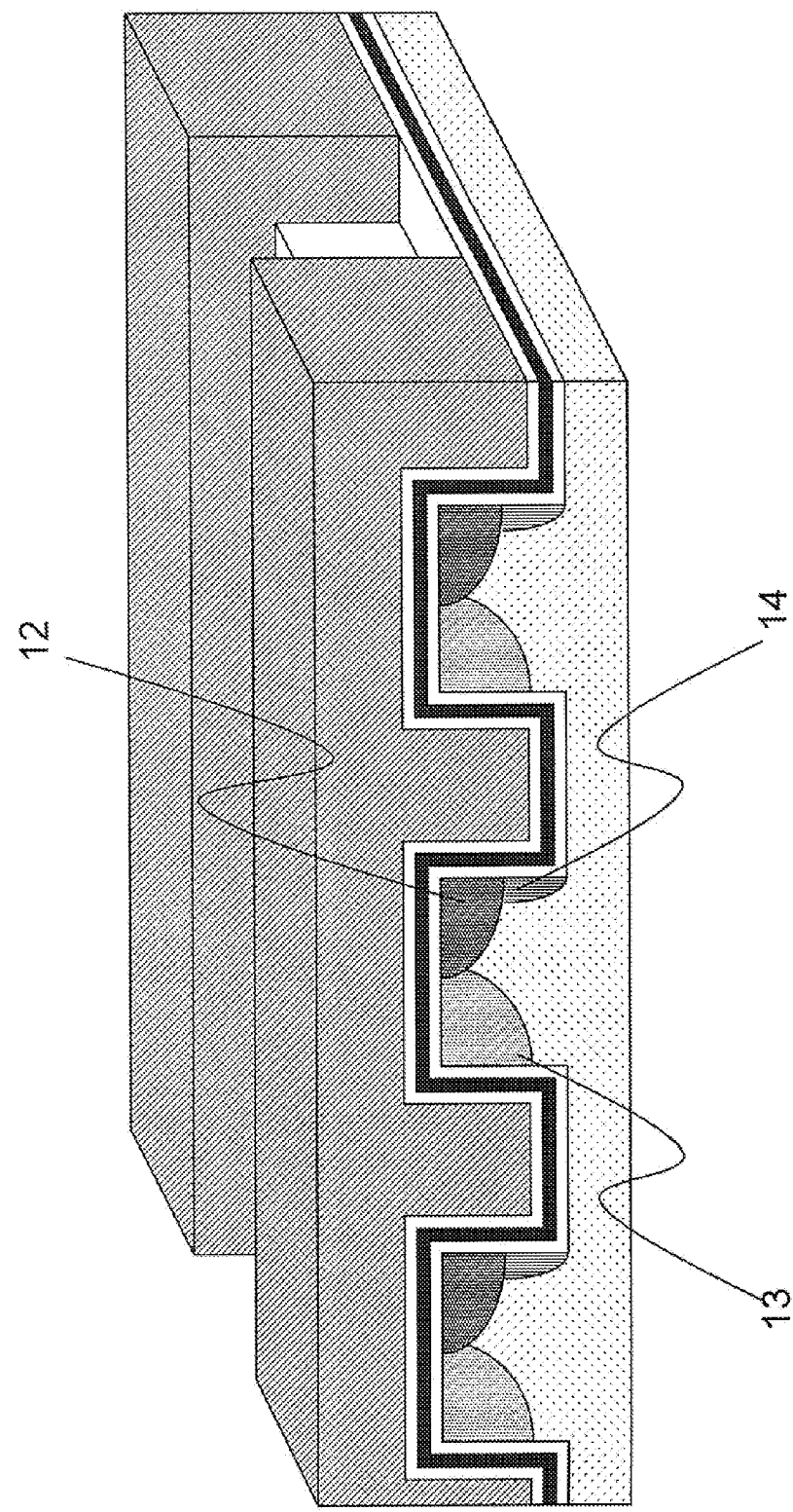
FIG. 25 shows a cross sectional oblique view of a third embodiment of the present invention.

FIG. 25 is a cross sectional oblique view which shows the structure of a memory cell array of the third embodiment of the present invention. This memory cell array has a p channel MONOS three dimensional structure in which a difference in height is made between channel regions and source and region regions. In the explanation in the third embodiment, the same elements as in the second embodiment have the same reference numerals and their explanation will be thus omitted.

The following points are different in the memory cell array in embodiment three from the memory cell array in second embodiment. In second embodiment the p type diffusion region which functioned as a bit line, source and drain were formed by patterning after the entire surface was formed. In embodiment three, the p type diffusion region is formed by oblique injection after patterning an oxide film layer 26 for a mask in a Y direction.

Further, the memory cell array in this embodiment has a three dimensional structure which is different to the structure in the first embodiment, however, because the equivalent circuits and operation mechanisms are the same as the memory cell array in the first embodiment, these explanations will be omitted.

Here, an outline of the manufacturing process of the above mentioned memory cell array will be explained by referring to FIG. 26 to FIG. 34. This process is divided into process 1 to 9 and explained in FIG. 26 to FIG. 34 respectively.

Figure 26:
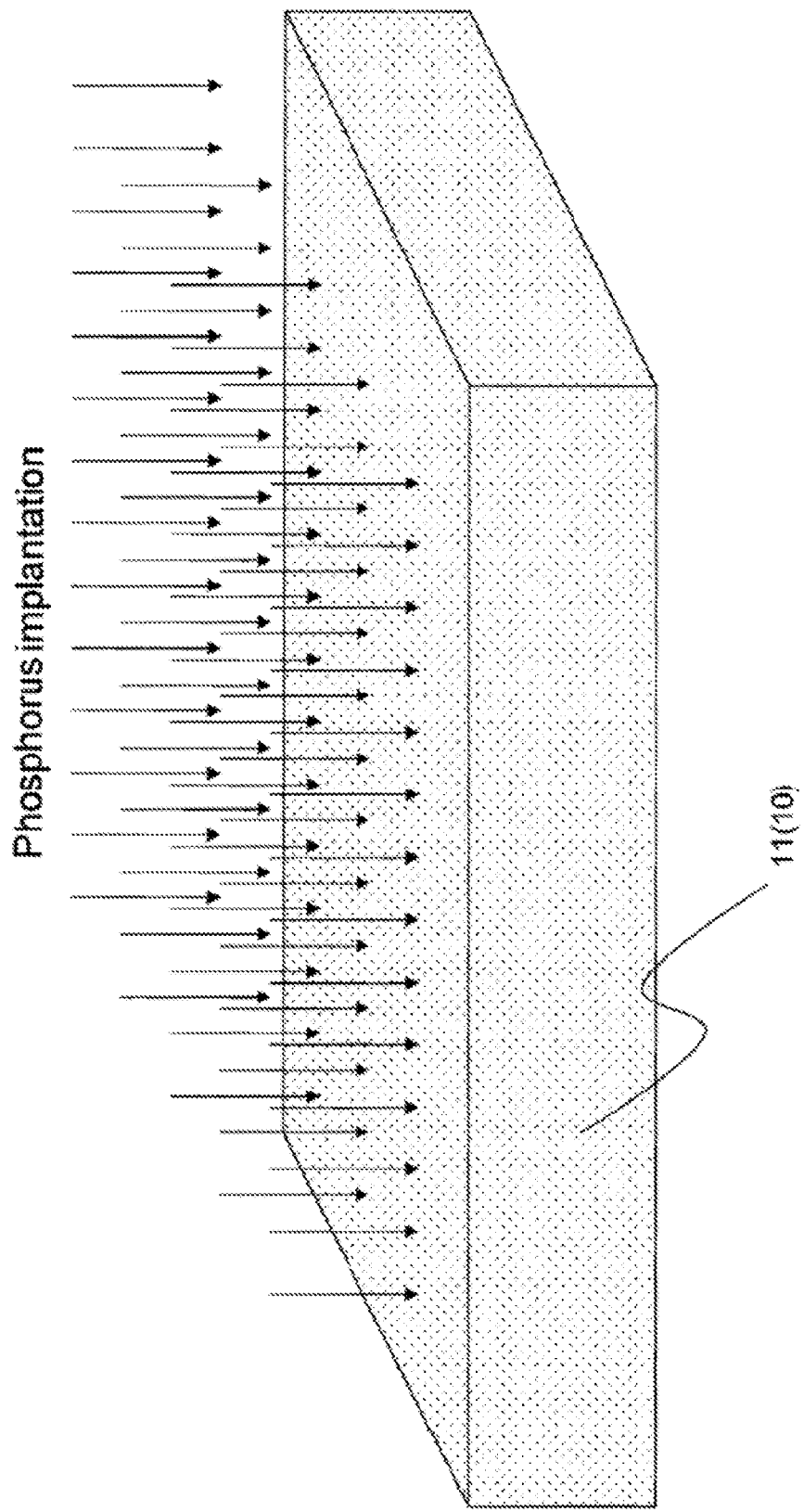
FIG. 26 shows a manufacturing process (Process 1) of the memory cell array of a third embodiment.
Figure 27:
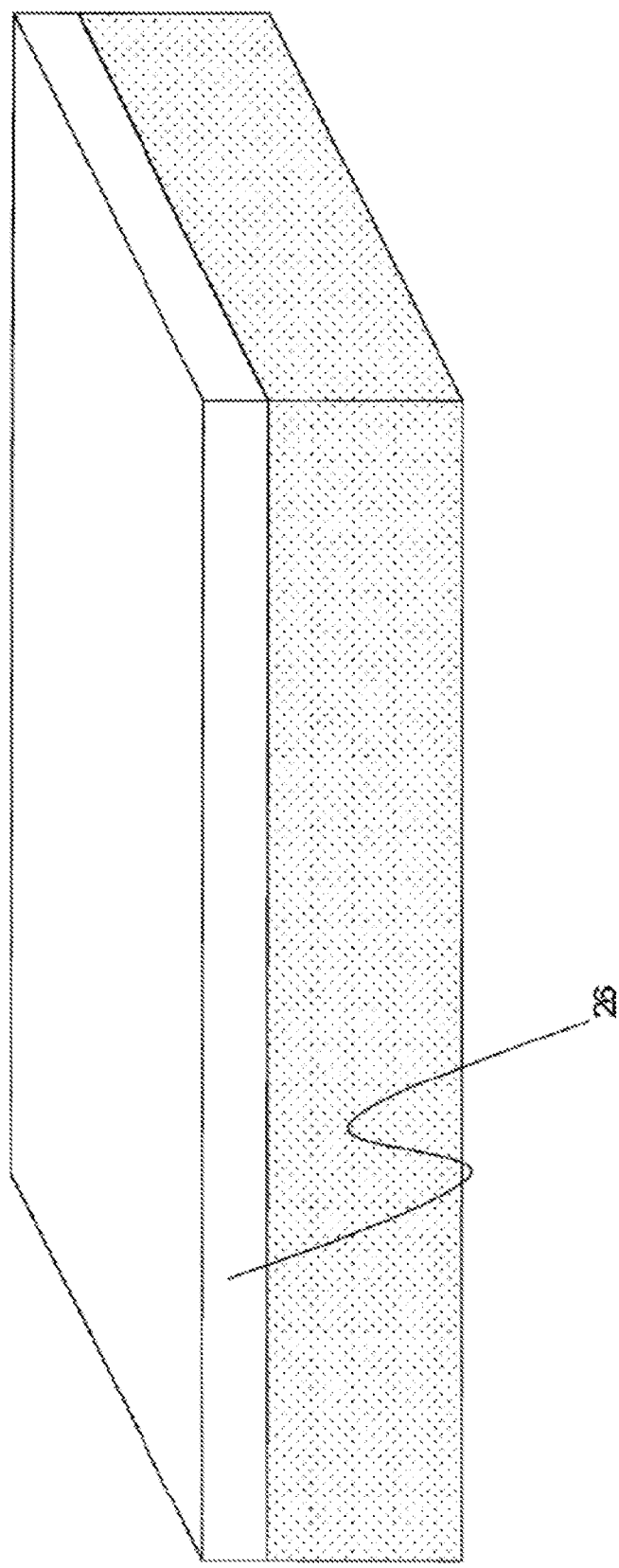
FIG. 27 shows a manufacturing process (Process 2) of the memory cell array of a third embodiment.

In the process 1 shown in FIG. 26, phosphorus is ion-implanted into the entire surface of the silicon substrate 10 and an n type well 11 is formed. In the process 2 shown in FIG. 27, an oxide film layer 26 which is used as an oblique injection mask (shading) is formed. Here, the entire surface in the process 1, the process 2 and all further processes means the entire block region of a memory cell array. When there are a plurality of block regions, a plurality of n type wells are formed. In these processes, openings made in a photo-resist are used for a memory cell array with a plurality of block regions.

Figure 28:
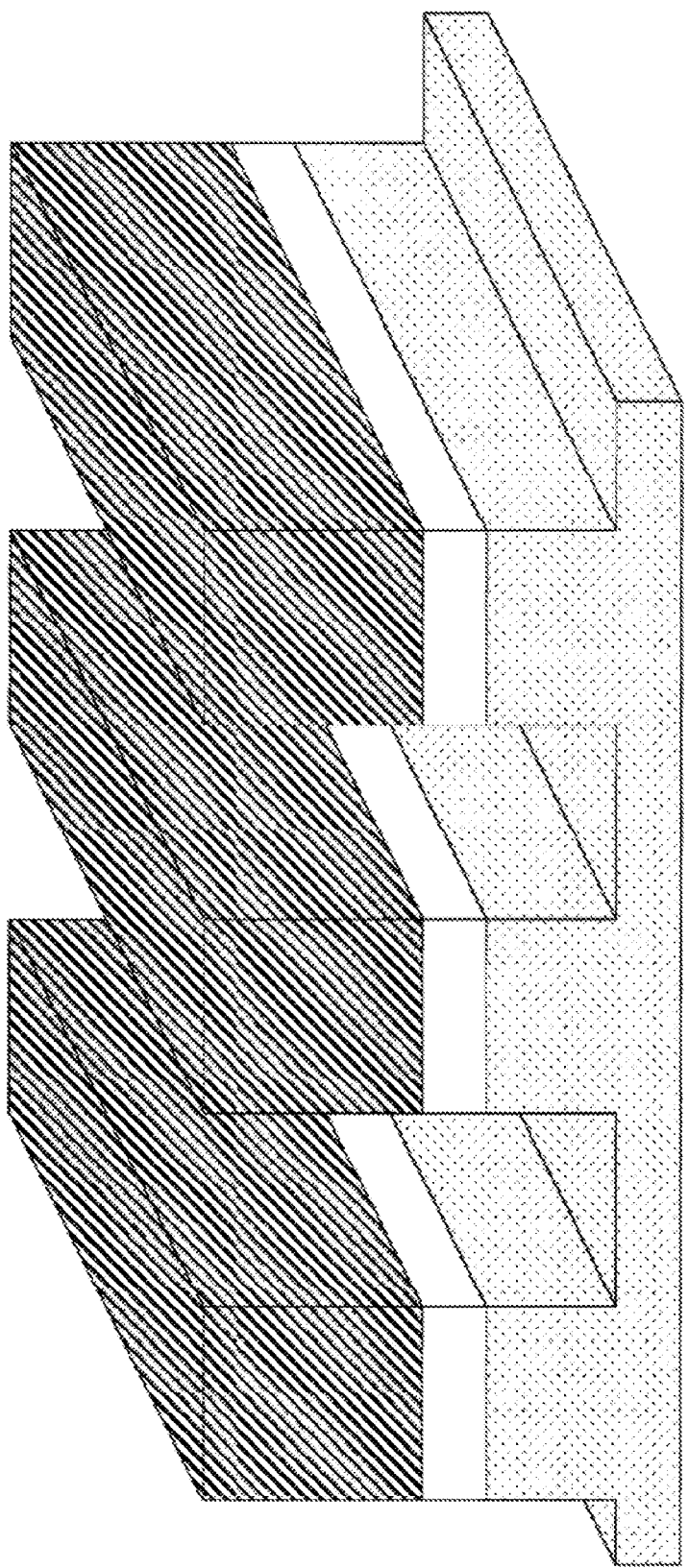
FIG. 28 shows a manufacturing process (Process 3) of the memory cell array of a third embodiment.

In the process 3 shown in FIG. 28, a photo-resist 211 is formed in a stripe shape in a Y direction, and the substrate is etched together with the oxide film layer 26. The etching is performed into the n type well 11 of the surface of the silicon substrate 10 and grooves are formed. P type diffusion layers 12 and channels will be formed in the surface of the grooves formed in the n type well 11.

Figure 29:
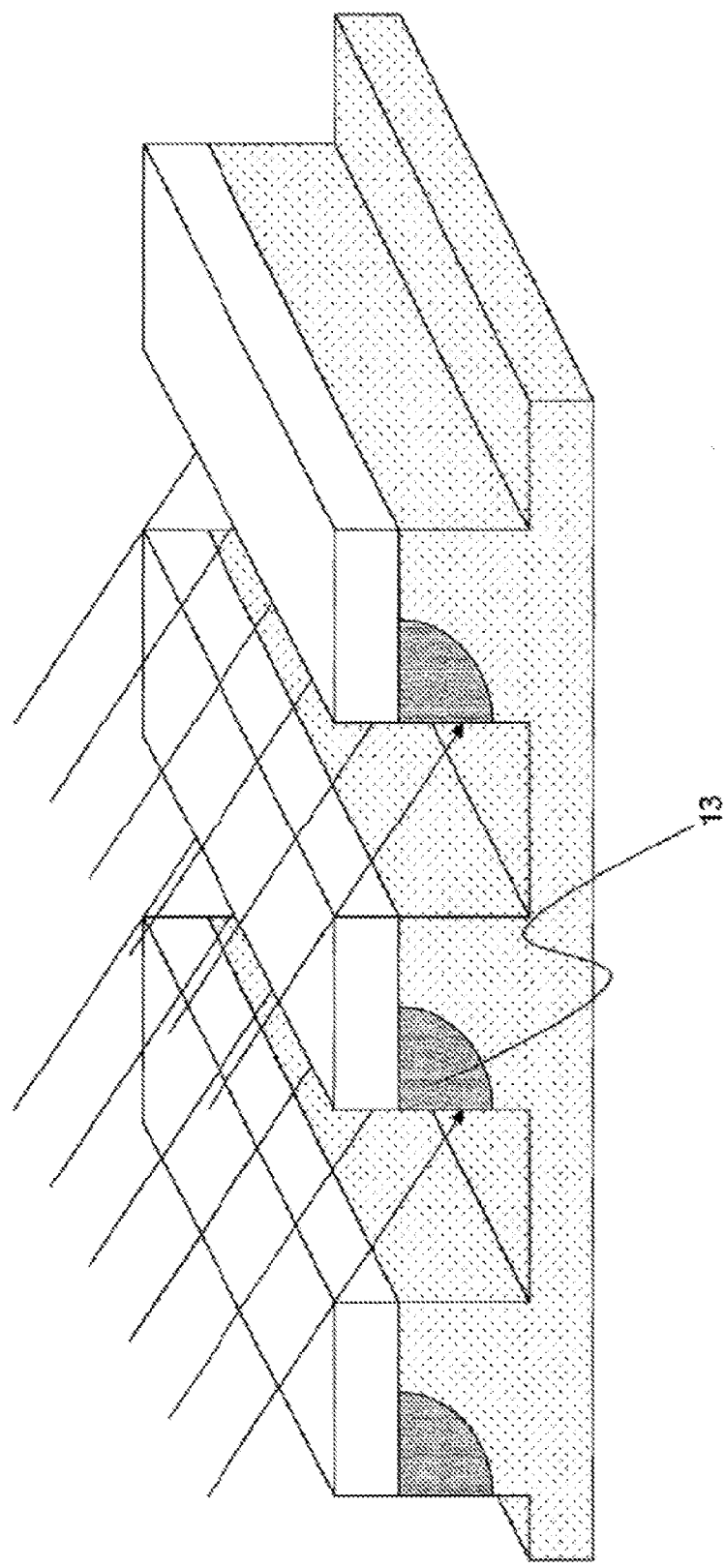
FIG. 29 shows a manufacturing process (Process 4) of the memory cell array of a third embodiment.

In the process 4 shown in FIG. 29, the photo-resist 211 is removed and p type impurities (B or $BF_2$) are obliquely implanted using the oxide film layer 26 patterned in the process 3. P– diffusion regions 13 are then formed. The p–diffusion regions 13 are regions in which p type impurities are diffused at a lower concentration than the p type diffusion region 12 formed in a later process and function as an LDD region in a memory cell transistor.

Figure 30:
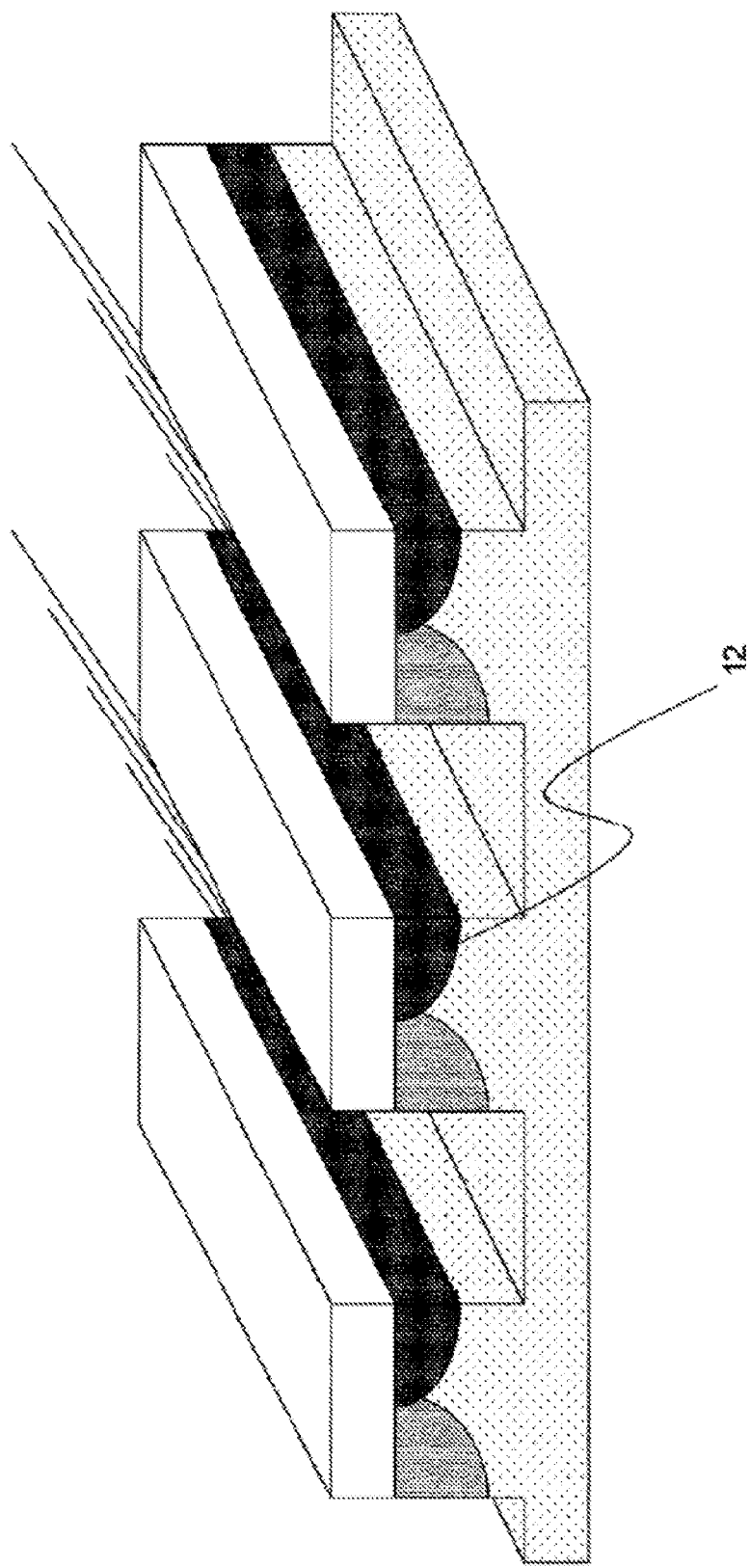
FIG. 30 shows a manufacturing process (Process 5) of the memory cell array of a third embodiment.

In the process 5 shown in FIG. 30, p type impurities (B or $BF_2$) are obliquely implanted in the opposite direction to the process 5 using the oxide film layer 26 patterned in the process 4. P type diffusion regions 12 are formed. The p type diffusion regions 12 function as bit lines and drains of a memory cell transistor.

Figure 31:
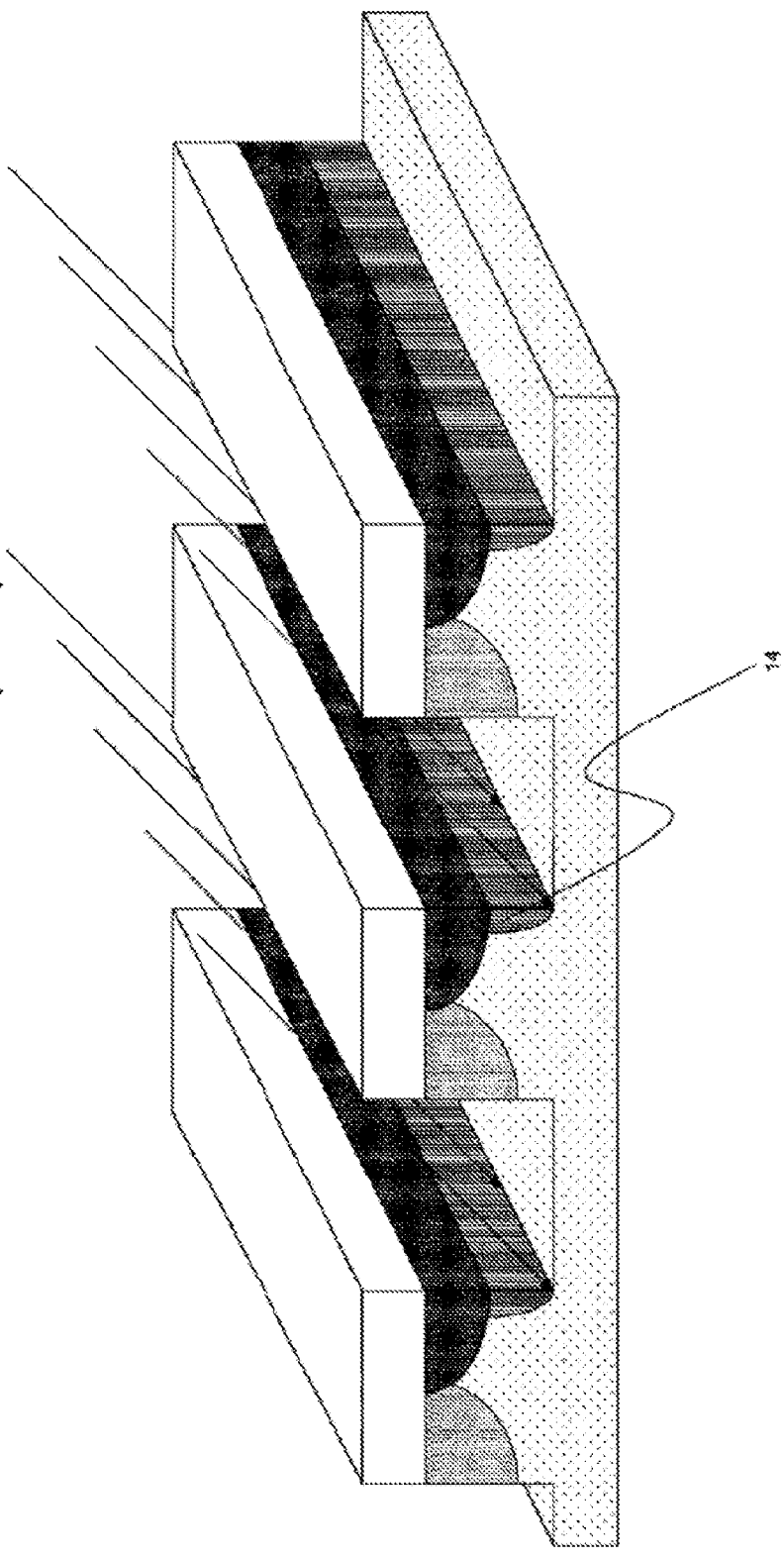
FIG. 31 shows a manufacturing process (Process 6) of the memory cell array of a third embodiment.

In the process 6 shown in FIG. 31, n type impurities (P or As) are obliquely implanted in the same direction as the process 5 at greater angle using the oxide film layer 26 patterned in the process 4 as a mask. N type diffusion regions 14 are formed near the edge of grooves in the n type well 11. The n type diffusion regions 14 are regions in which n type impurities are diffused at a higher concentration than the n type well 11 and function as halo regions in memory cell transistors.

Figure 32:
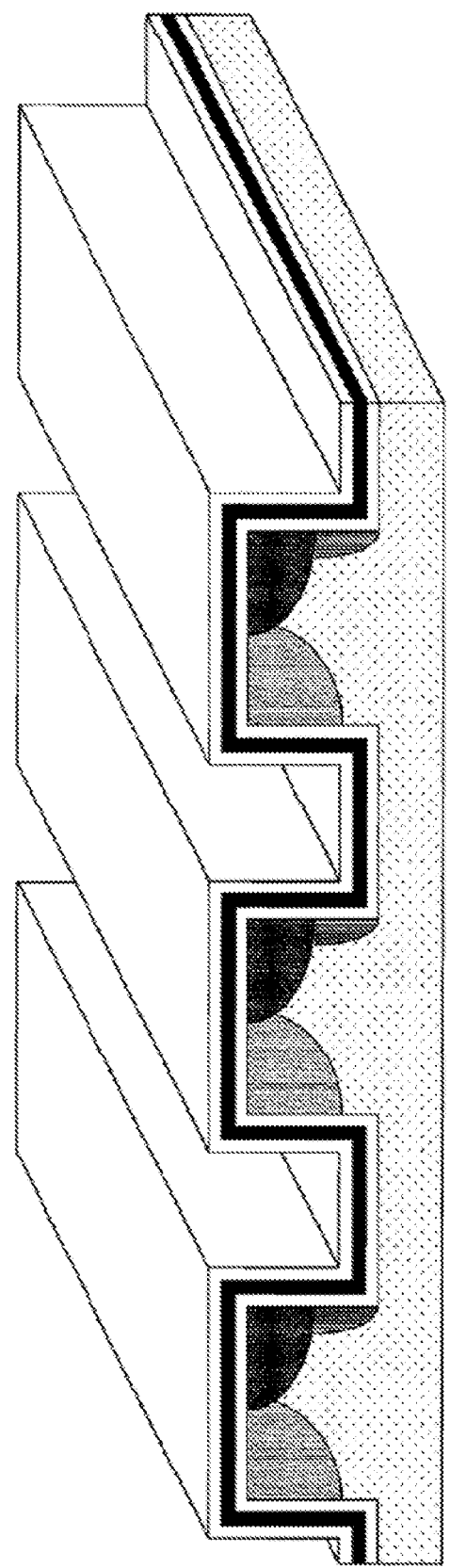
FIG. 32 shows a manufacturing process (Process 7) of the memory cell array of a third embodiment.

In the process 7 shown in FIG. 32, the oxide film layer 26 is removed, and ONO film 30 (tunnel oxide film 15, nitride silicon film, (charge storage layer) 16, insulation oxide film 17) is formed in the entire surface region of the substrate which is non-flat. The oxide films 15, 17 are formed by a thermal oxidization and the nitride film 16 is formed by CVD.

Figure 33:
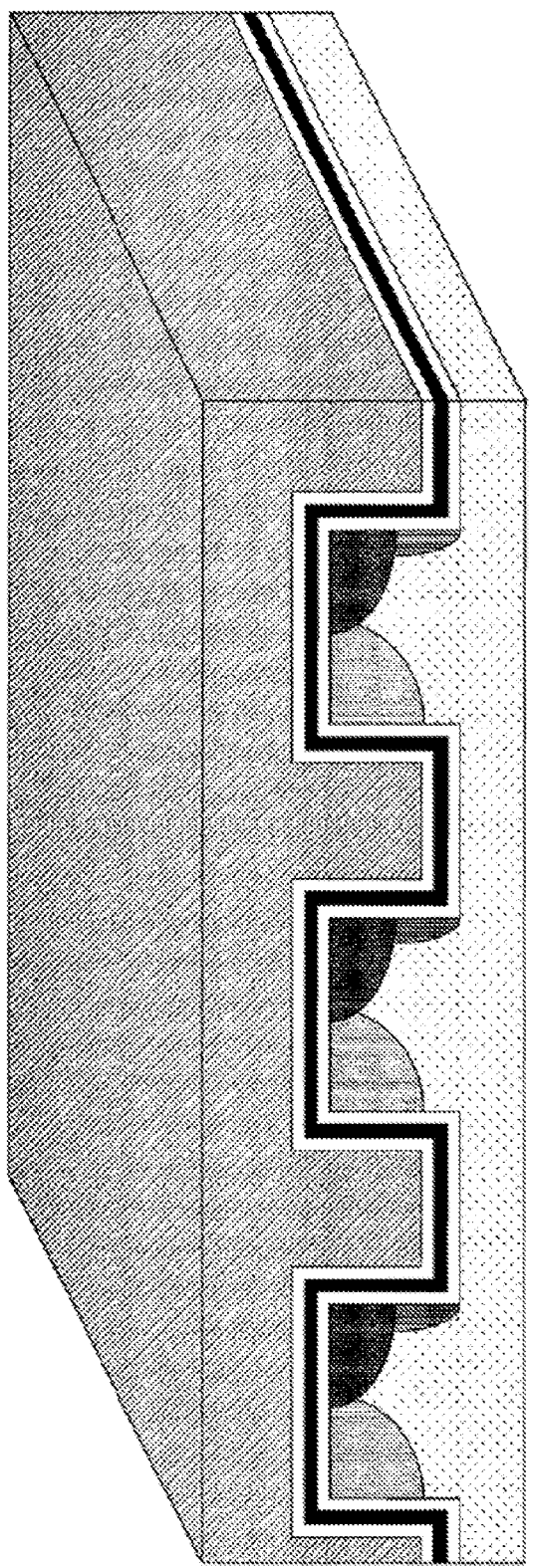
FIG. 33 shows a manufacturing process (Process 8) of the memory cell array of a third embodiment.

In the process 8 shown in FIG. 33, a polysilicon layer 110 is formed on the entire surface. This polysilicon layer 110 will later become word lines 18 and gate electrodes 19 when patterned.

Figure 34:
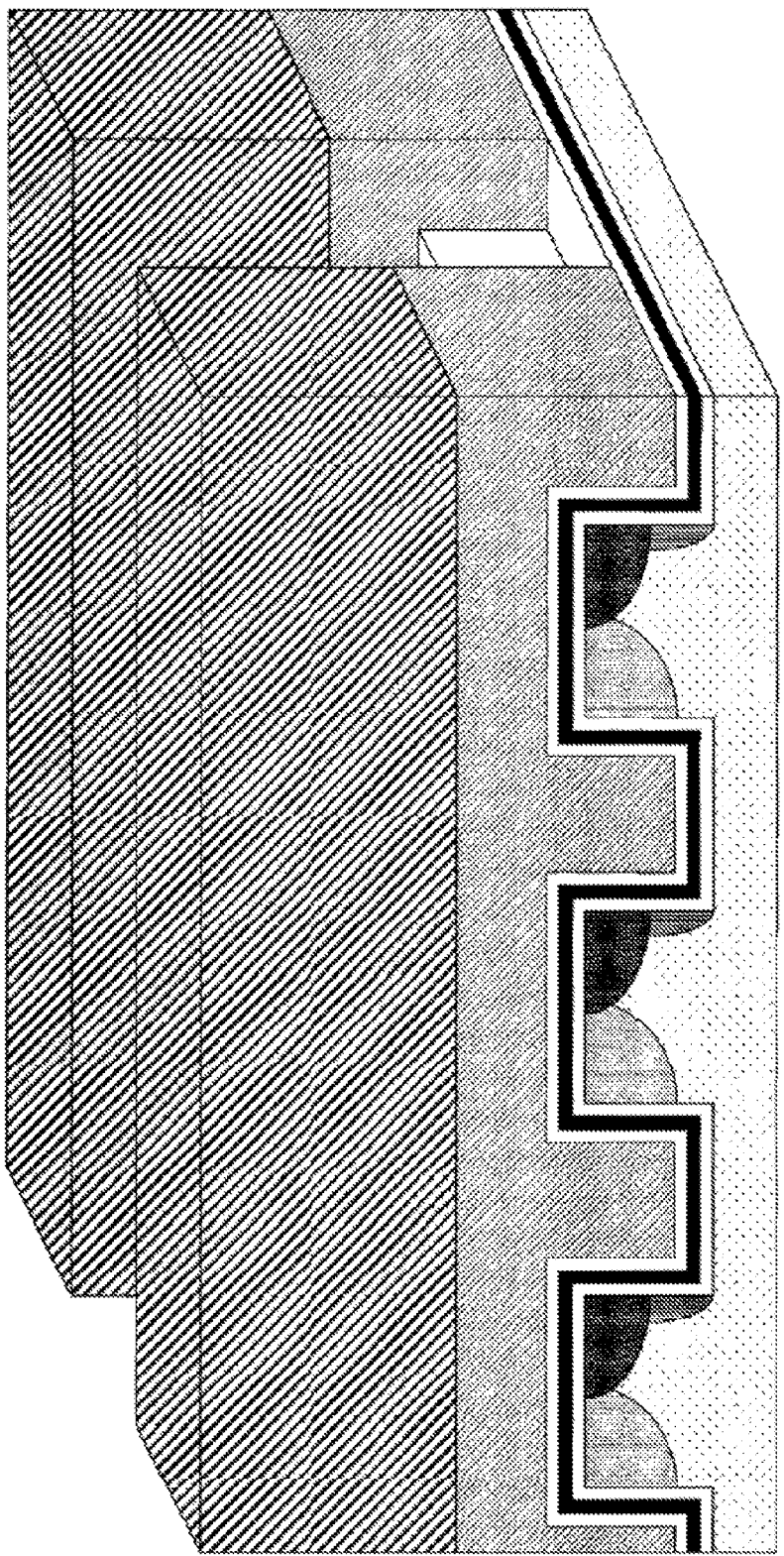
FIG. 34 shows a manufacturing process (Process 9) of the memory cell array of a third embodiment.

In the process 9 shown in FIG. 34, a photo-resist 211 of a pattern (gate pattern) of a stripe shape in a X direction is formed, and the polysilicon layer 110 is removed by etching and the gate electrodes 18 (word lines) and the gate electrodes 19 are formed.

The photo-resist 211 is removed, and the memory cell array shown in FIG. 25 is formed. After the processes 1 to 9, periphery circuits and upper wirings are formed and the non-volatile semiconductor memory device is complete.

Since each of the memory cells of this structure has a channel along the surface of the groove formed in the n type well region 11, it is possible to lengthen an effective channel length between the source and the drain even if the gap between the source and drain is shortened, thereby contributing to the miniaturization of a memory cell array.

It is also possible to omit the LDD region 13 with this structure.

Fourth Embodiment

A fourth embodiment of this invention comprising a memory cell will be explained by referring to FIG. 35 to FIG. 45.

Figure 35:
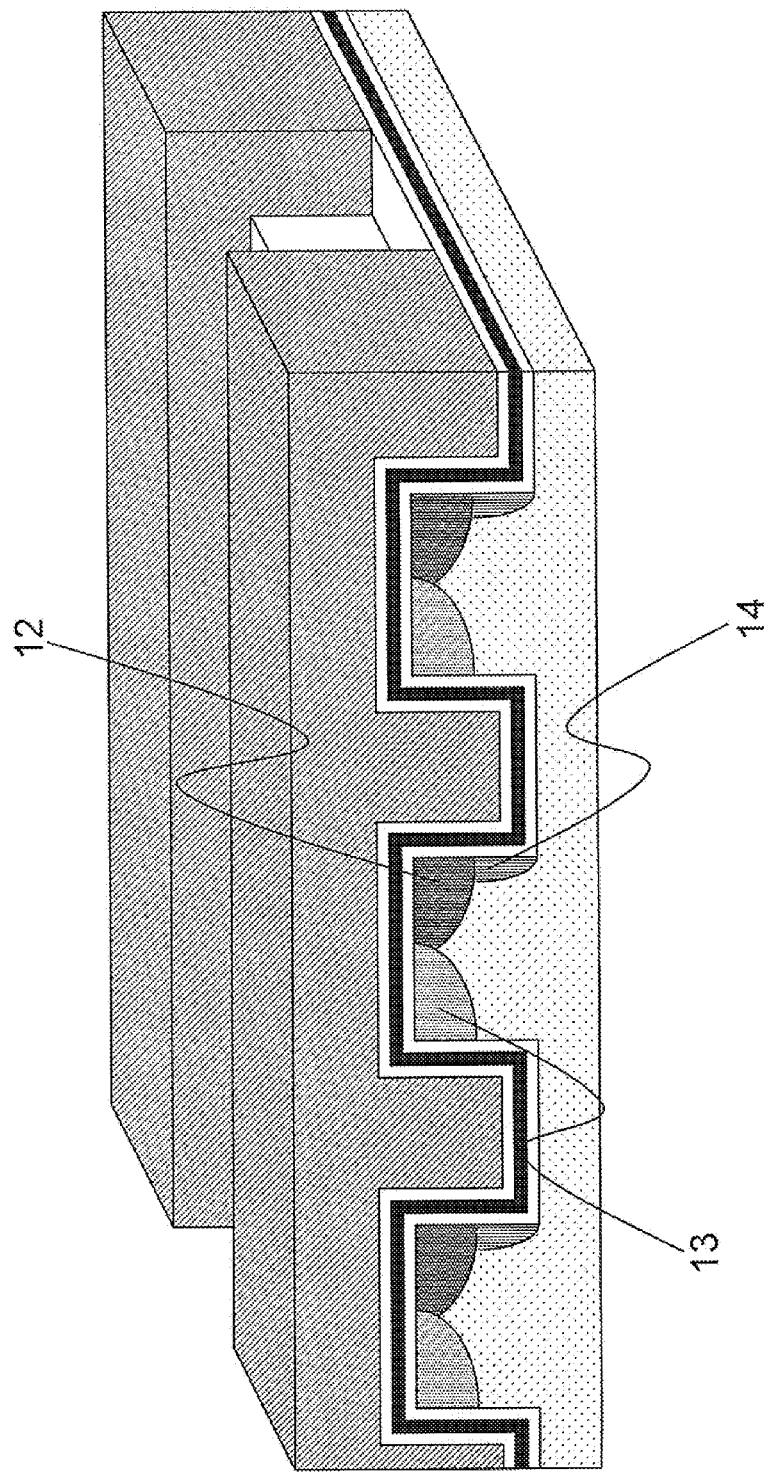
FIG. 35 shows a cross sectional oblique view of a fourth embodiment of the present invention.

FIG. 35 is a cross sectional oblique view which shows the structure of a memory cell array of the fourth embodiment of the present invention. This memory cell array has a three dimensional p channel MONOS structure. In the explanation in fourth embodiment, the same elements as in the embodiment three have the same reference numerals and their explanation will be omitted.

The differences between the third embodiment and the fourth embodiment are as follows. In the third embodiment, p type diffusion regions (bit lines, sources and drains) and p–diffusion region (LDD regions) are formed after a substrate (n type well 11) is etched. However, in the fourth embodiment, the substrate is etched after the p type diffusion regions and the p– diffusion regions are formed on the substrate surface.

The memory cell array in the fourth embodiment has a three dimensional structure different to the structure in the first embodiment, however, because the equivalent circuits and operation fundamentals are the same as the memory cell array in the first embodiment, their explanation on the operations will be omitted.

Here, an outline of the manufacturing process of the above mentioned memory cell array will be explained by referring to FIG. 36 to FIG. 45. This process is divided into process 1 to 9 explained in FIG. 36 to FIG. 45 respectively.

Figure 36:
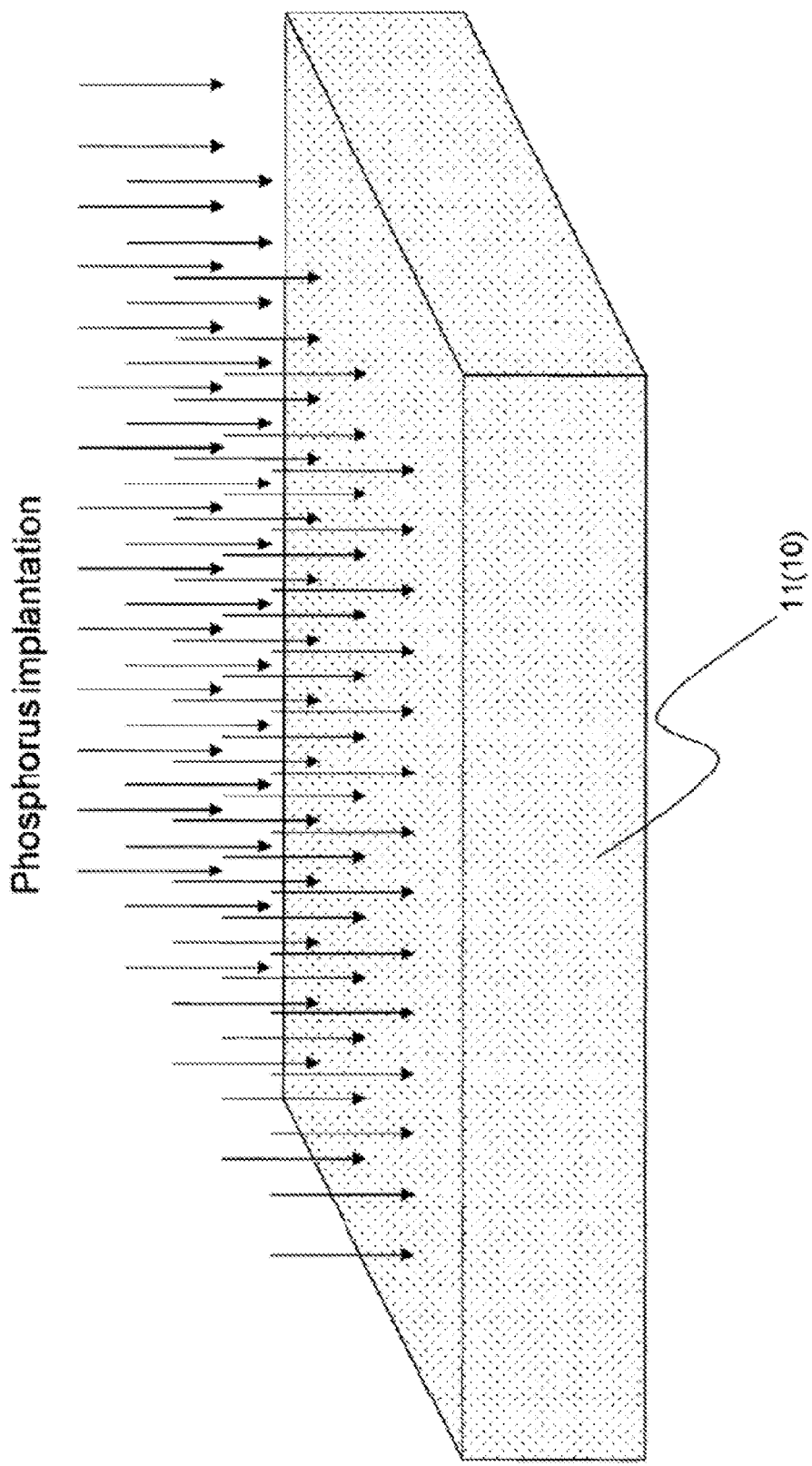
FIG. 36 shows a manufacturing process (Process 1) of the memory cell array of a fourth embodiment.
Figure 37:
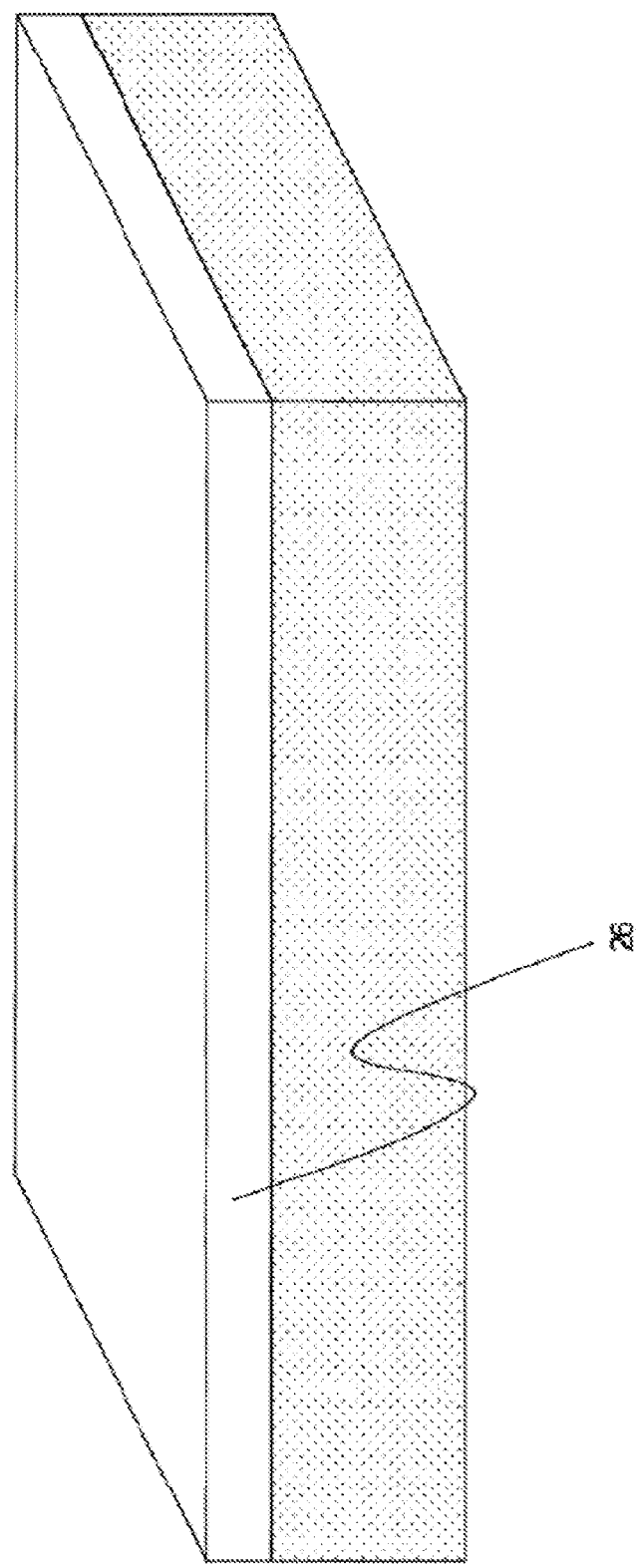
FIG. 37 shows a manufacturing process (Process 2) of the memory cell array of a fourth embodiment.

In the process 1 shown in FIG. 36, phosphorus is ion implanted into the entire surface of the silicon substrate 10 and an n type well 11 is formed. In process two in FIG. 37, an oxide film layer 26 which is used as an oblique injection mask is formed. Here, the entire surface in the process 1, the process 2 and all further processes means the entire block region of a memory cell array. When there are a plurality of block regions, a plurality of n type wells are formed. In these processes, openings made in a photo-resist are used for a memory cell array with a plurality of block regions.

Figure 38:
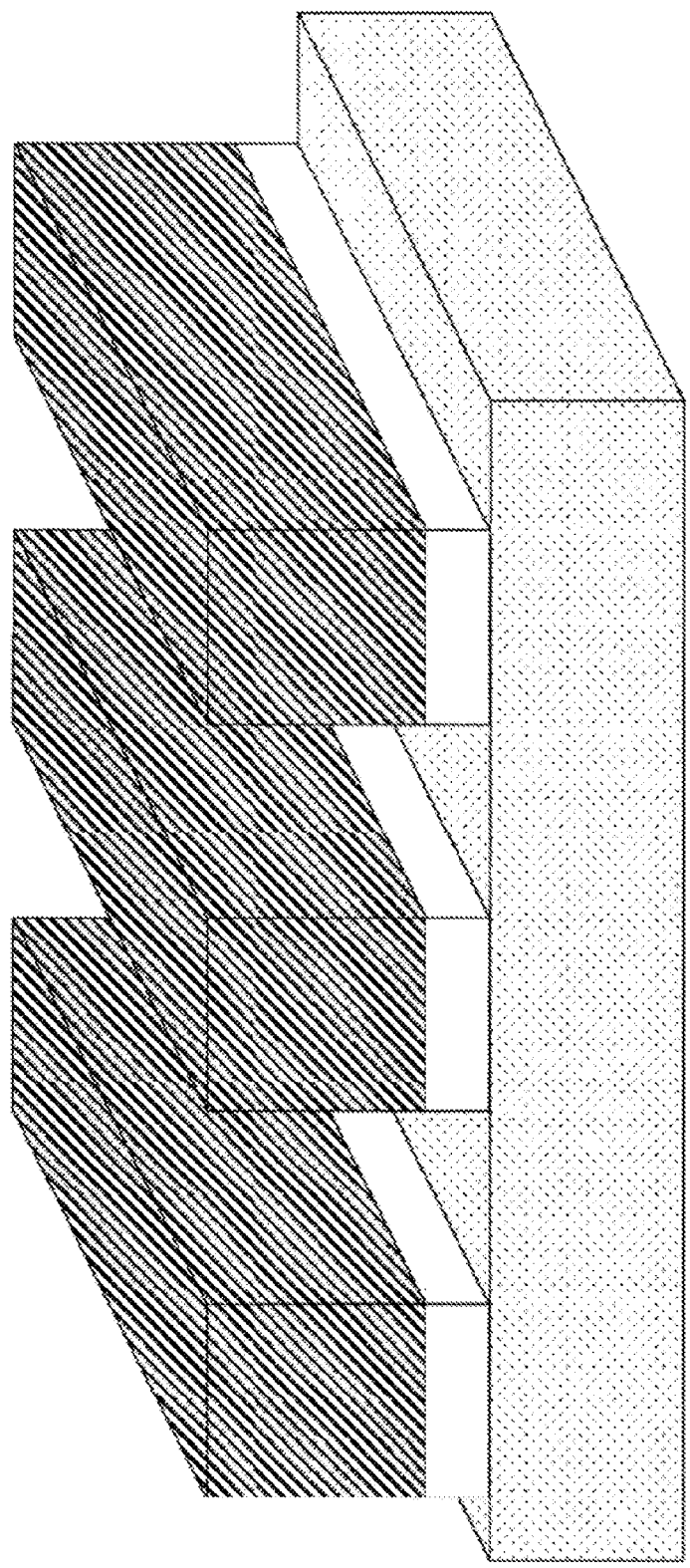
FIG. 38 shows a manufacturing process (Process 3) of the memory cell array of a fourth embodiment.

In the process 3 shown in FIG. 38, a photo-resist 211 is formed in a stripe shape in a Y direction and the oxide film layer 26 is removed by etching.

Figure 39:
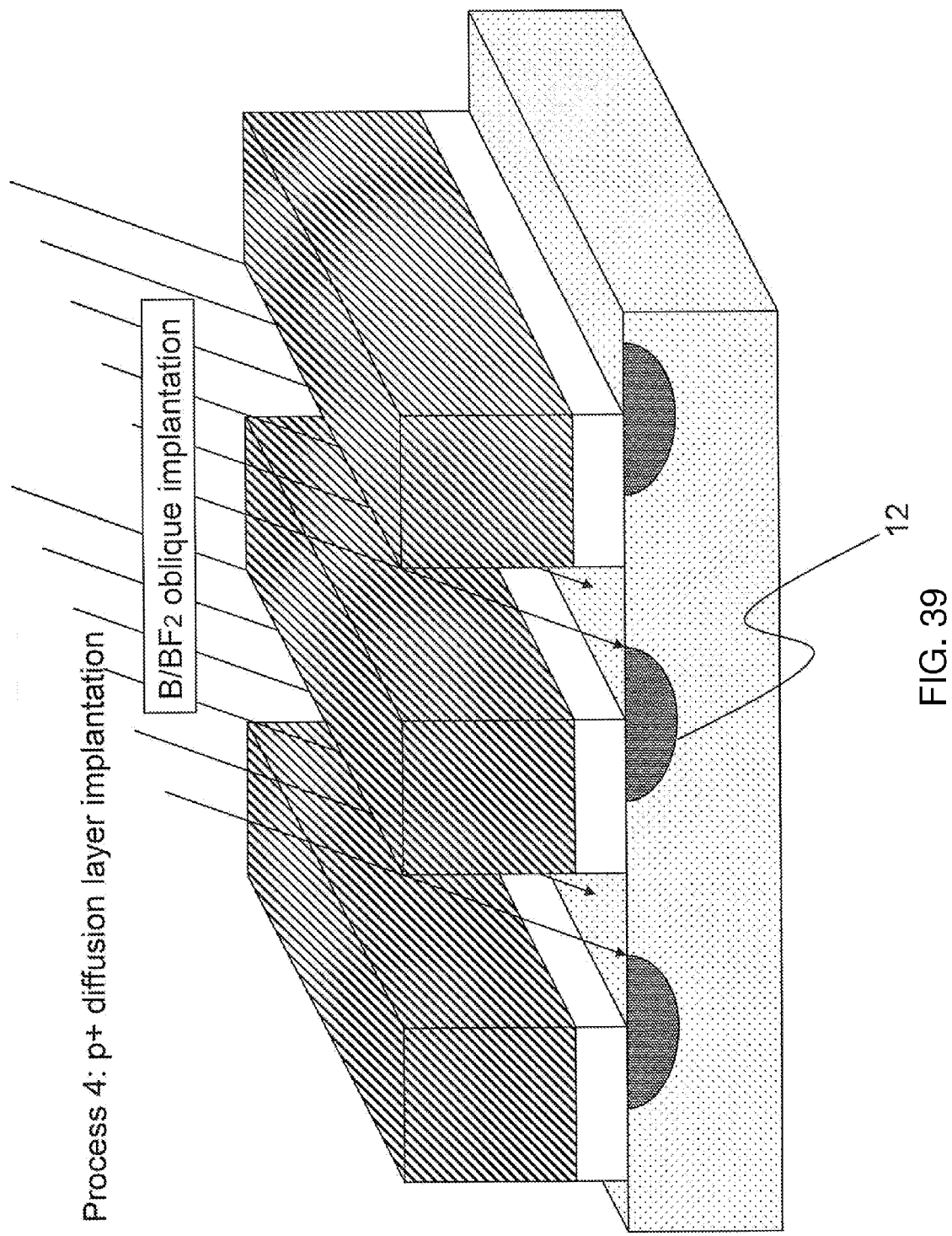
FIG. 39 shows a manufacturing process (Process 4) of the memory cell array of a fourth embodiment.

In process four in FIG. 39, using the photo-resist 211 formed in the process 3, p type impurities (B or $BF_2$) are obliquely implanted. P type diffusion regions 12 are formed. The p type diffusion regions 12 will later become bit lines.

Figure 40:
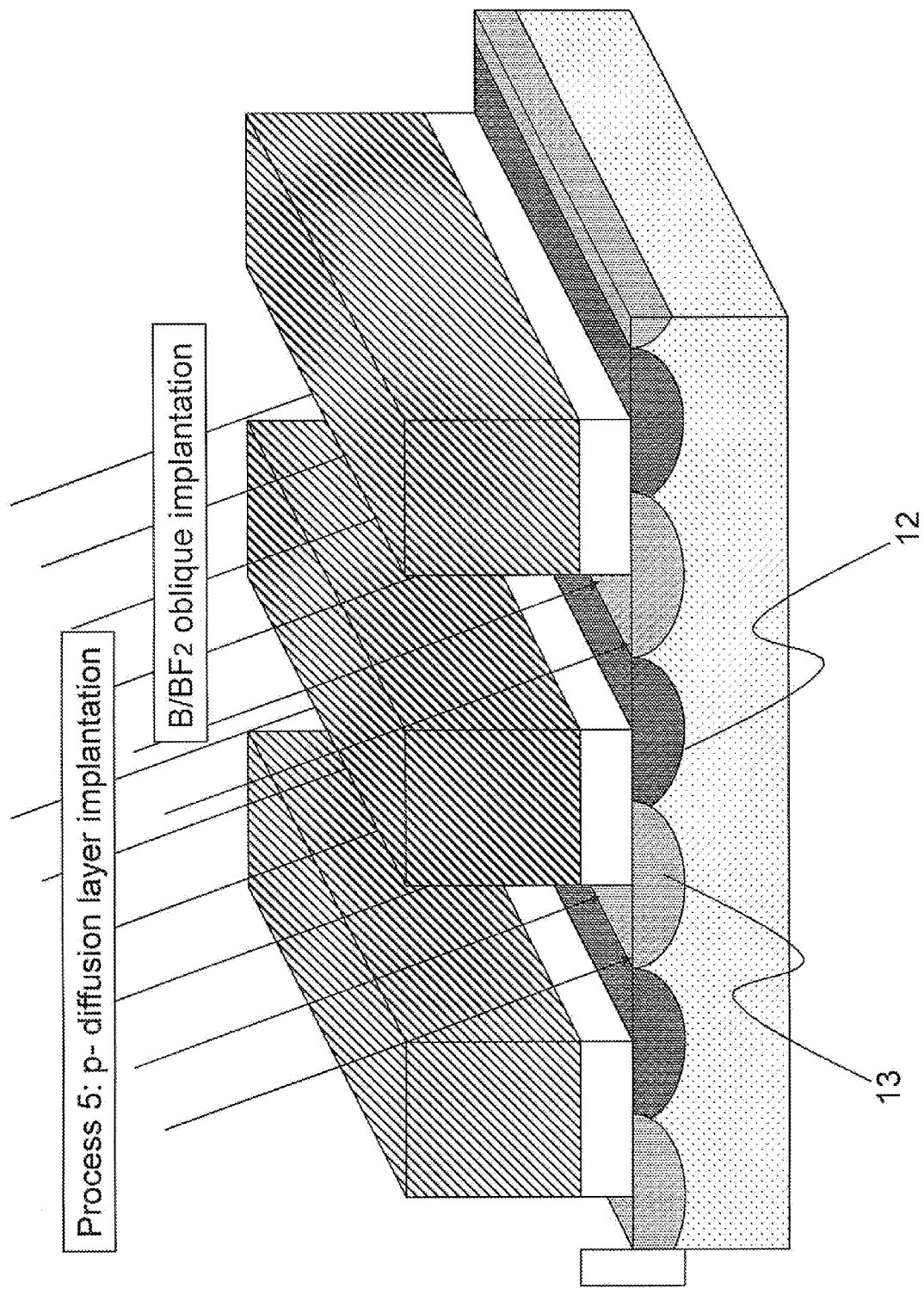
FIG. 40 shows a manufacturing process (Process 5) of the memory cell array of a fourth embodiment.

In the process 5 shown in FIG. 40, p type impurities (B or $BF_2$) are obliquely implanted in the opposite direction to the process 4 using the photo-resist 211 which was patterned in the process 3. P– diffusion regions 13 are formed. The p– diffusion regions 13 are regions in which p type impurities are diffused at a lower concentration than the p type diffusion regions 12 formed in the process 4 and will later become LDD regions of memory cell transistors when patterned.

Figure 41:
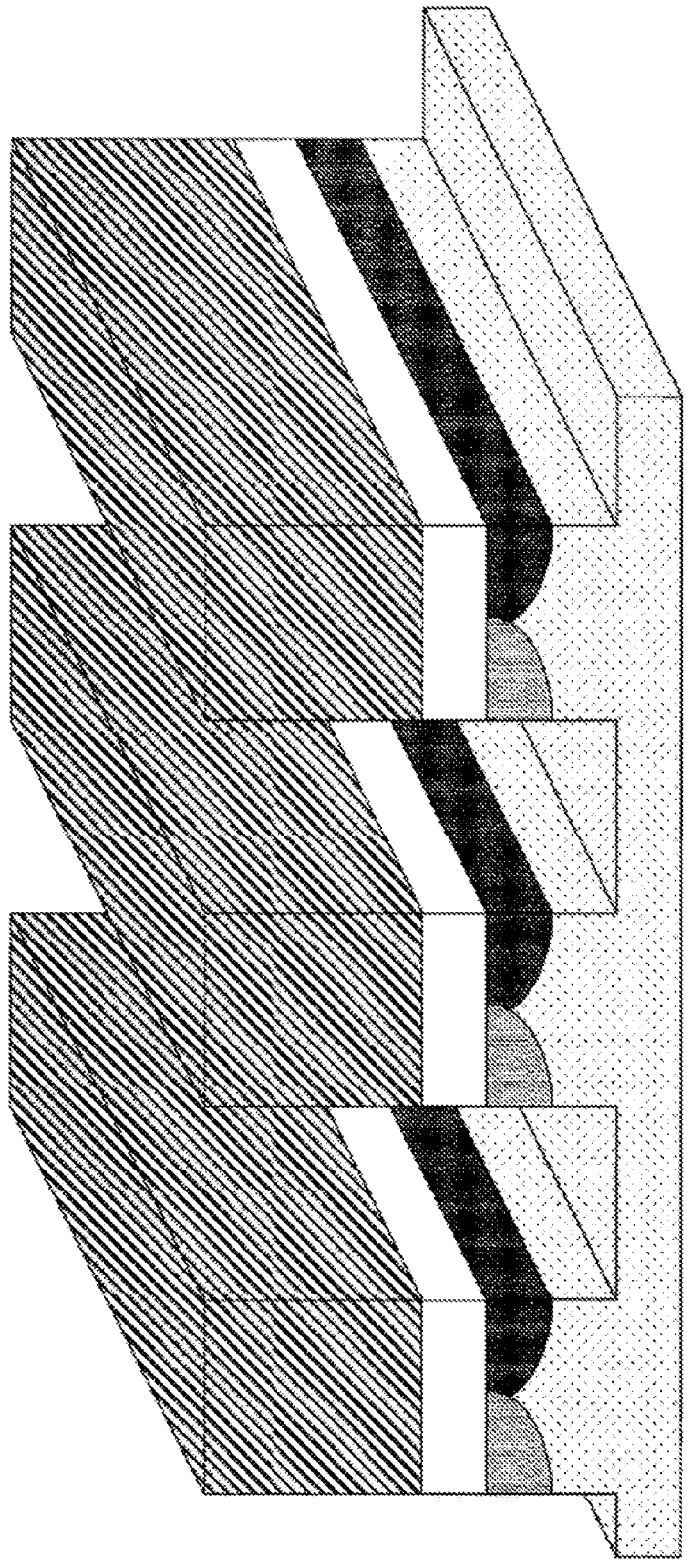
FIG. 41 shows a manufacturing process (Process 6) of the memory cell array of a fourth embodiment.

In the process 6 shown in FIG. 41, using the photo-resist 211 which is not removed, additional etching is performed. The n type well 11 is etched and removed in a groove shape halfway into the surface of the silicon substrate and patterned in a Y direction, forming a three dimensional channel. In this way, the p type diffusion layers 12 and the p– diffusion layers 13 which have already been formed are patterned so that they are exposed on the upper part of both side wall surfaces of the grooves of the n type well 11.

Figure 42:
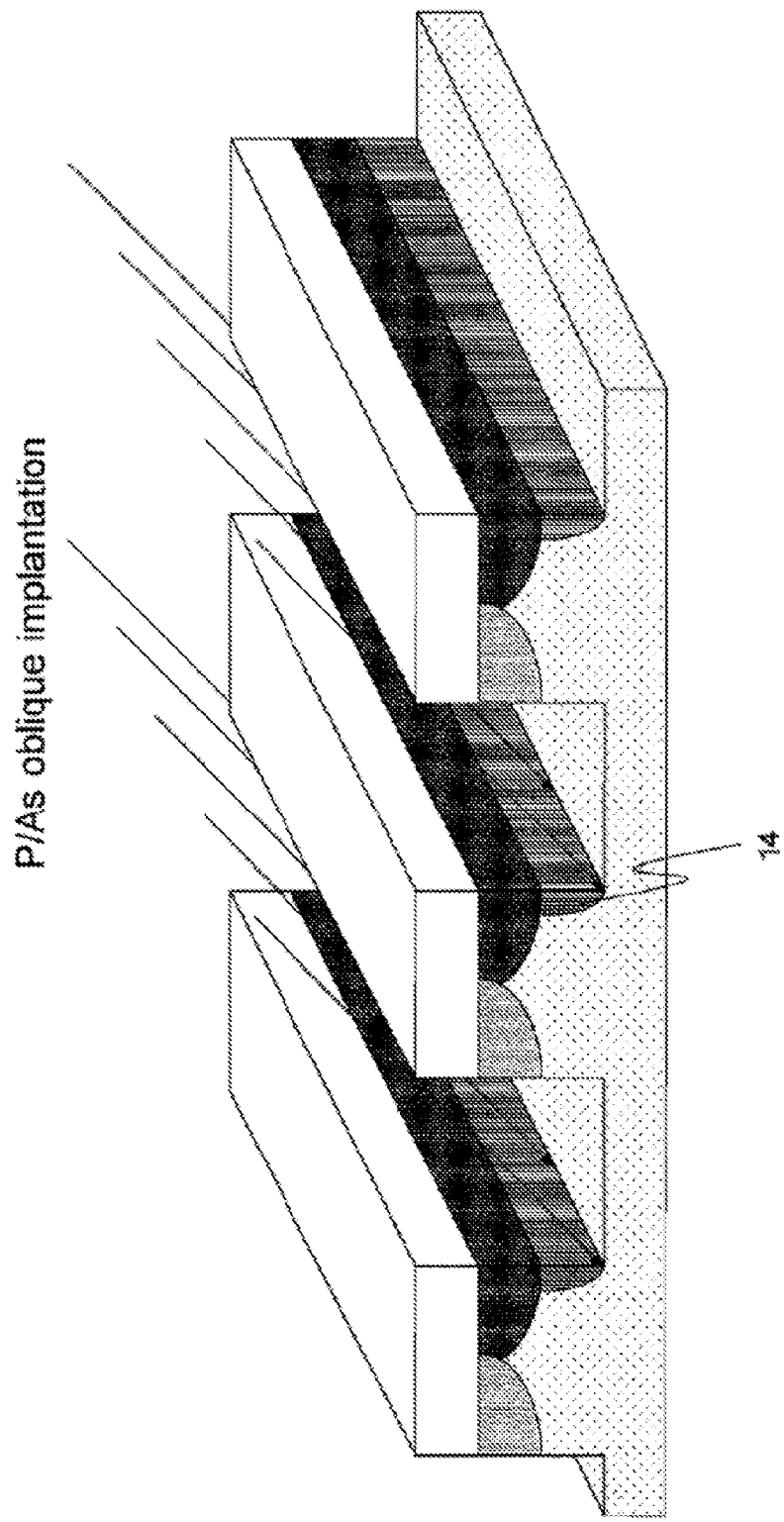
FIG. 42 shows a manufacturing process (Process 7) of the memory cell array of a fourth embodiment.

In the process 7 shown in FIG. 42, the photo-resist 211 is removed and n type impurities (P or As) are obliquely implanted in the same direction as the process 4 at a greater angle using the oxide film layers 26 which was patterned in the process 3 and an n type diffusion regions 14 are formed near the shallower edge of side walls near the p type regions 12 in the n type well 11. The n type diffusion regions 14 are regions in which n type impurities are diffused at a higher concentration than the n type well 11 and functions as halo regions in memory cell transistors.

Figure 43:
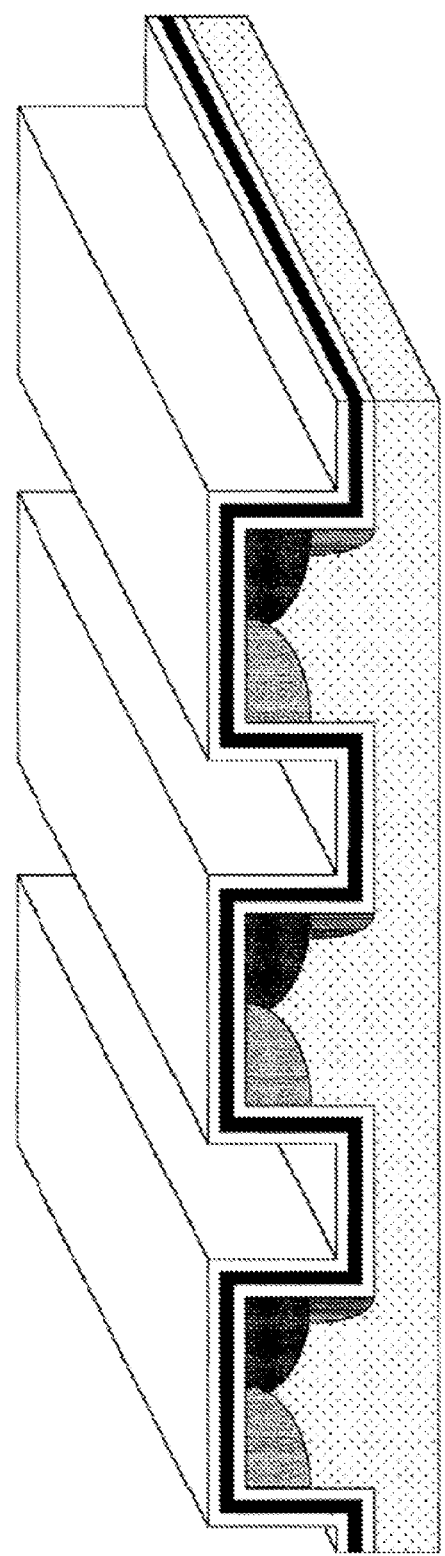
FIG. 43 shows a manufacturing process (Process 8) of the memory cell array of a fourth embodiment.

In the process 8 shown in FIG. 43, the oxide film layer 26 is removed and ONO film 30 (tunnel oxide film 15, nitride silicon film, (charge storage layer) 16, insulation oxide film 17) is formed over the entire surface region of the substrate which is non-flat. The oxide films 15, 17 are formed by thermal oxidization and the nitride film 16 is formed by CVD.

Figure 44:
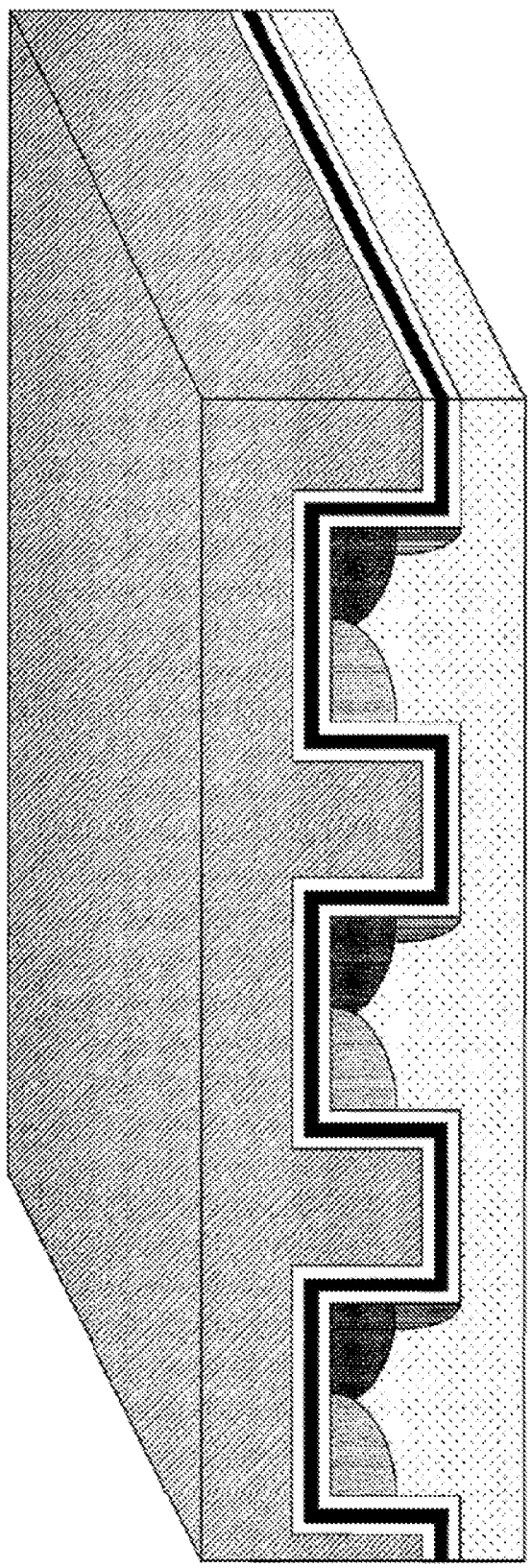
FIG. 44 shows a manufacturing process (Process 9) of the memory cell array of a fourth embodiment.

In the process 9 shown in FIG. 44, a polysilicon layer 110 is formed on the entire surface. This polysilicon layer 110 will later becomes word lines 18 and gate electrodes 19 when patterned.

Figure 45:
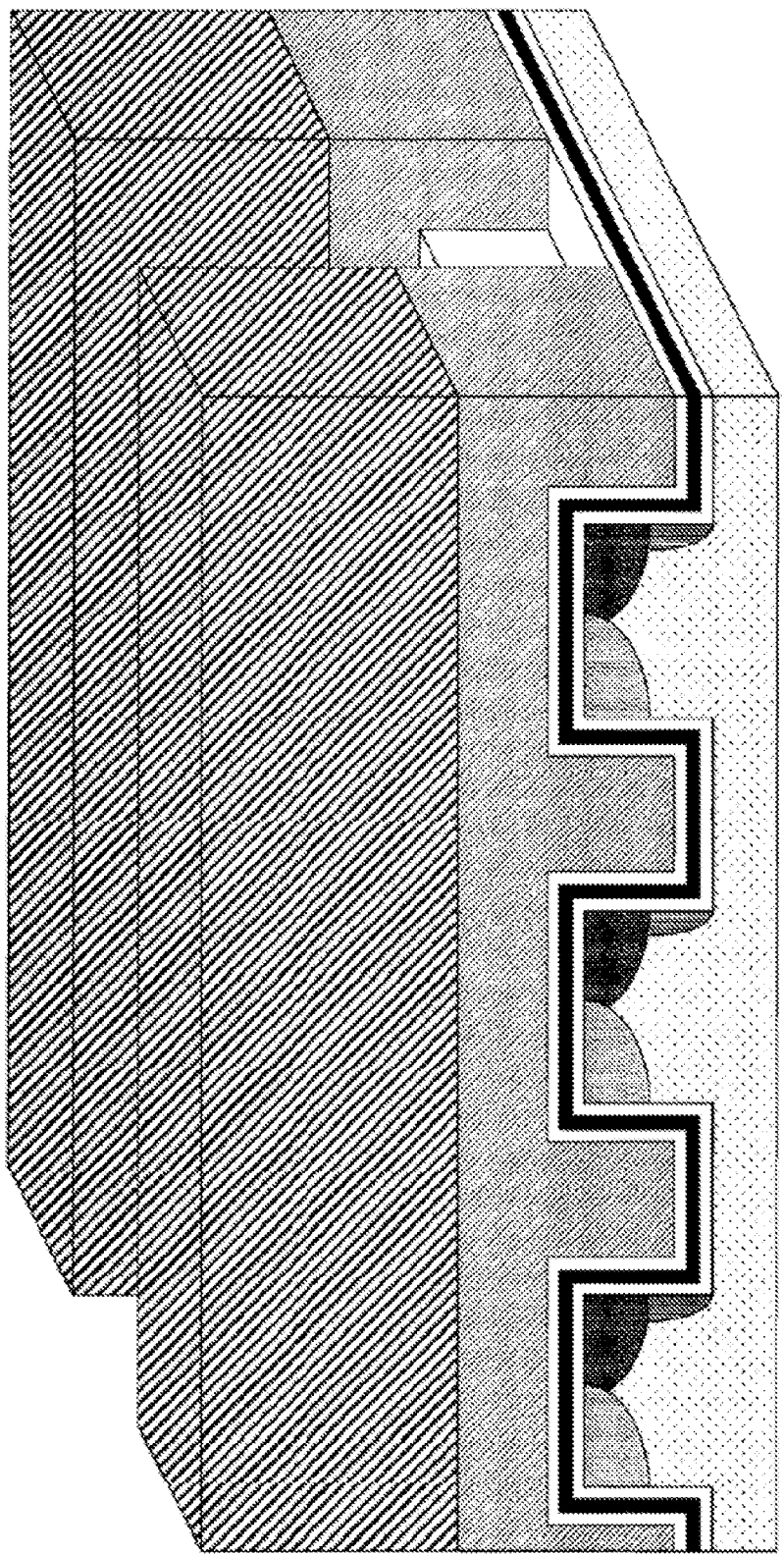
FIG. 45 shows a manufacturing process (Process 10) of the memory cell array of a fourth embodiment.

In the process 10 shown in FIG. 45, a photo-resist 211 of a stripe pattern along the X direction is formed, the polysilicon layer 110 etched and the gate electrodes 18 (word lines) and the gate electrodes 19 are formed.

The photo-resist 211 is removed, and the memory cell array shown in FIG. 25 is formed. After the processes 1 to 9, periphery circuits and upper wirings are formed and the non-volatile semiconductor memory device is complete.

Since each of the memory cells of this structure has a channel along the surface of the groove formed in the n type well region 11, it is possible to lengthen an effective channel length between the source and the drain even if the gap between the source and drain is shortened, thereby contributing to the miniaturization of a memory cell array.

Fifth Embodiment

A fifth embodiment of this invention comprising a memory cell array will be explained by referring to FIG. 46 to FIG. 55.

Figure 46:
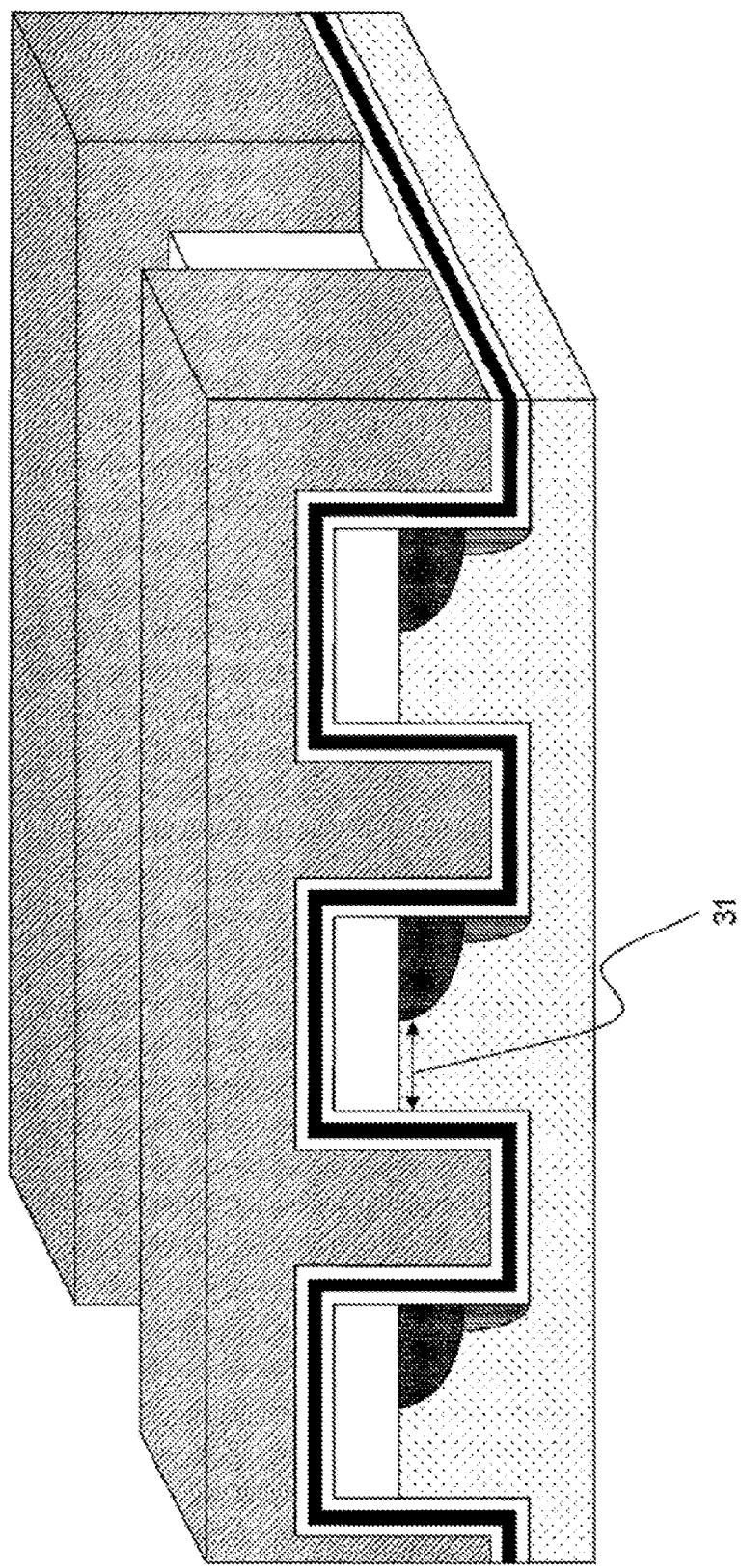
FIG. 46 shows a cross sectional oblique view of a fifth embodiment of the present invention.

FIG. 46 is a cross sectional oblique view which shows the structure of a memory cell array of the fifth embodiment of the present invention. This memory cell array has a three dimensional p channel MONOS structure as similar to the fourth embodiment. In the explanation in the fifth embodiment, the same elements as in fourth embodiment have the same reference numerals and their explanations will be thus omitted.

The differences between the fourth and fifth embodiments are that the offsets 31 exist between the 3D channel and the p type diffusion region 12; that an insulation oxide film layer 27 on the upper part of the p type diffusion region 12 is formed; and that a p– diffusion region (LDD region) is omitted.

The memory cell array in the fourth embodiment has a three dimensional structure different to the structure in the first embodiment, however, because the equivalent circuits and operation fundamentals are the same as the memory cell array in the first embodiment, their explanation on the operations will be omitted.

Here, an outline of the manufacturing process of the above mentioned memory cell array will be explained by referring to FIG. 47 to FIG. 55. This process is divided into processes 1 to 9 explained in FIG. 47 to FIG. 55 respectively.

Figure 47:
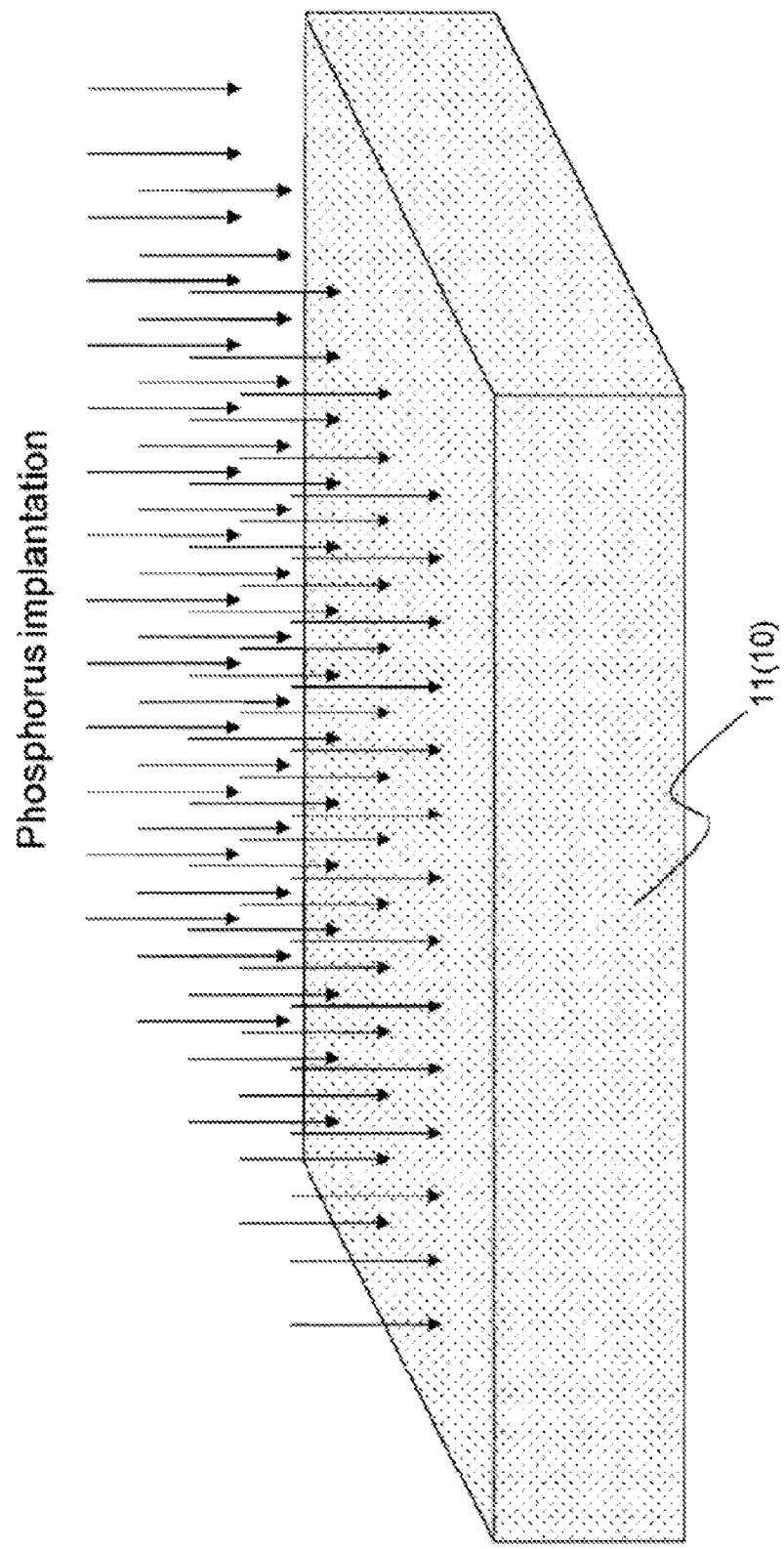
FIG. 47 shows a manufacturing process (Process 1) of the memory cell array of a fifth embodiment.
Figure 48:
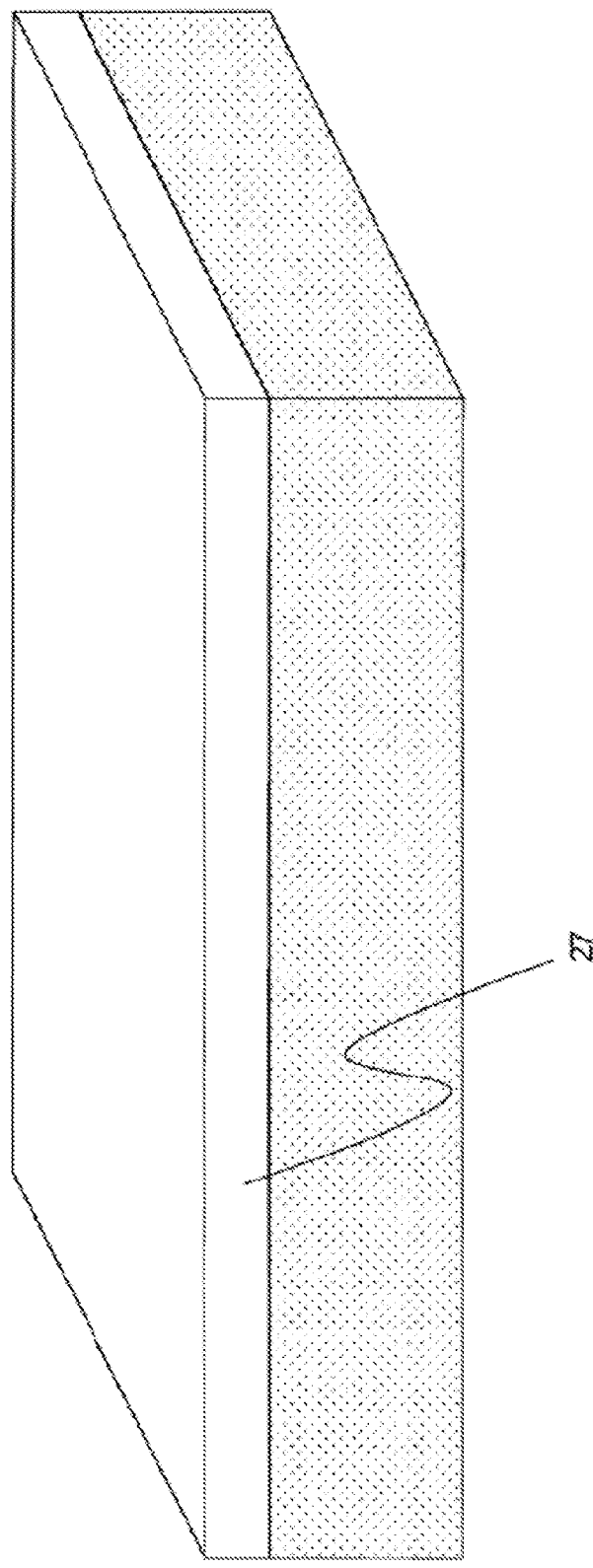
FIG. 48 shows a manufacturing process (Process 2) of the memory cell array of a fifth embodiment.

In the process 1 shown in FIG. 47, phosphorus is ion implanted into the entire surface of the silicon substrate 10 and an n type well 11 is formed. In the process 2 shown in FIG. 48, an oxide film layer 27 is formed. Here, the entire surface in the process 1, the process 2 and all further processes means the entire block region of a memory cell array. When there are a plurality of block regions, a plurality of n type wells are formed. In these processes, openings made in a photo-resist are used for a memory cell array with a plurality of block regions.

Figure 49:
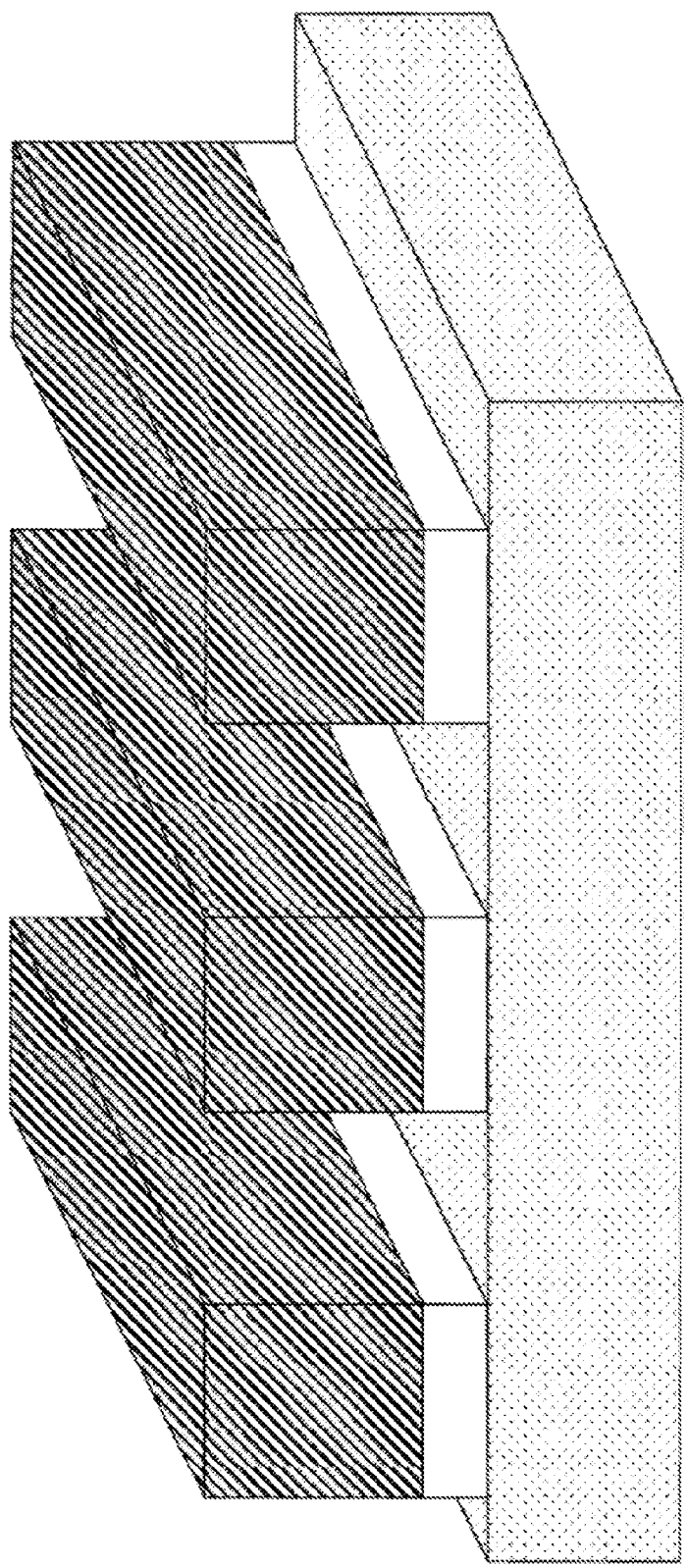
FIG. 49 shows a manufacturing process (Process 3) of the memory cell array of a fifth embodiment.

In the process 3 shown in FIG. 49, a photo-resist 211 is formed in a stripe shape in a Y direction and the insulation oxide film layer 27 is removed by etching.

Figure 50:
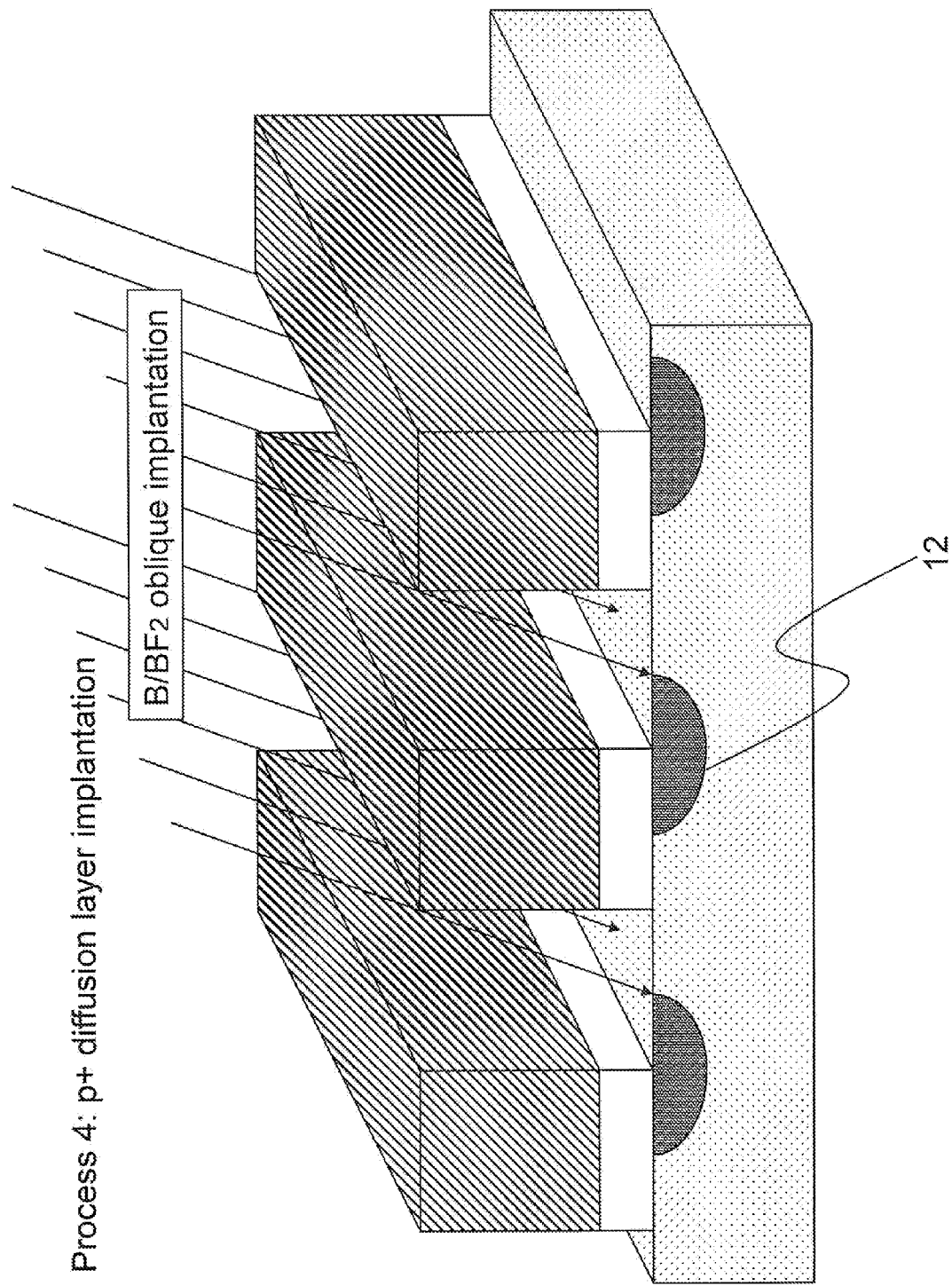
FIG. 50 shows a manufacturing process (Process 4) of the memory cell array of a fifth embodiment.

In the process 4 shown in FIG. 50, using the photo-resist 211 which was formed in the process 3, p type impurities (B or $BF_2$) are obliquely implanted and p type diffusion regions 12 are formed. The p type diffusion regions 12 will later become bit lines.

Figure 51:
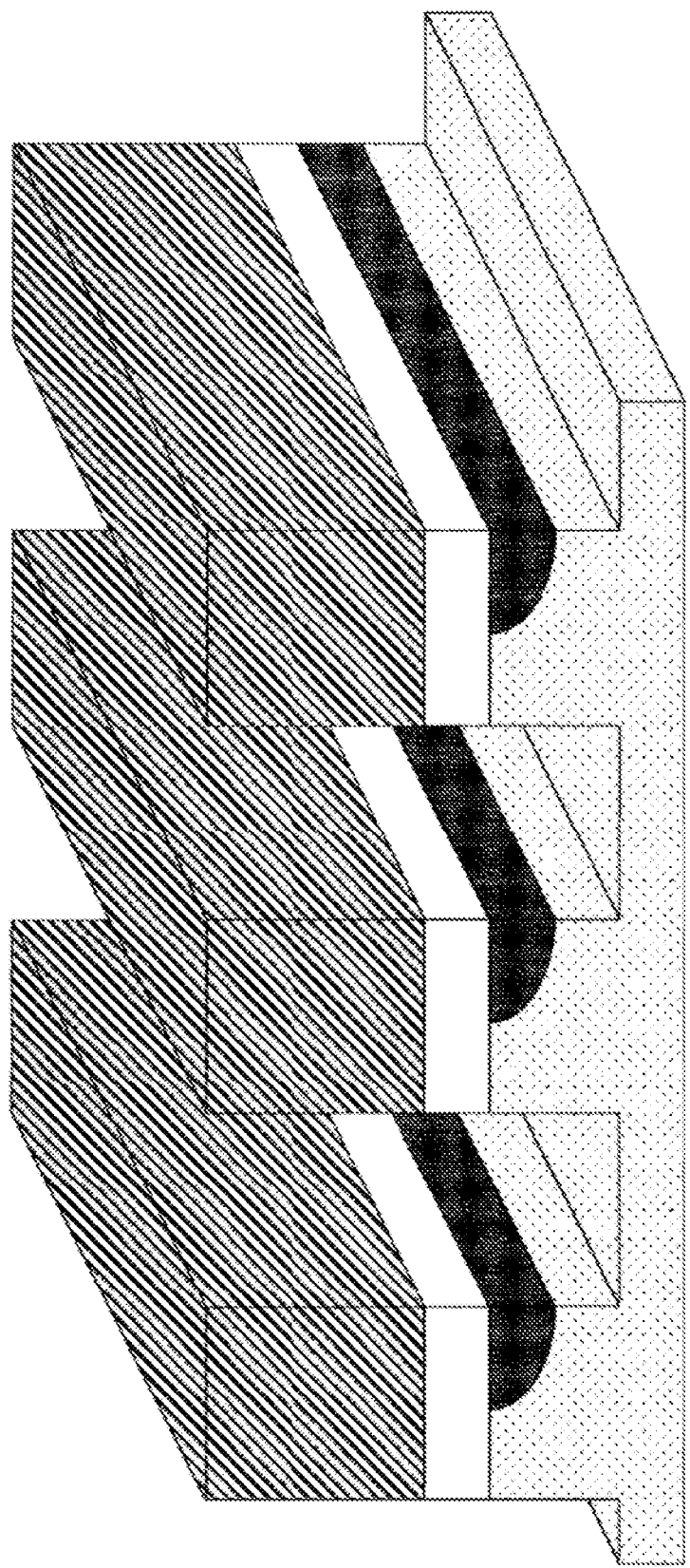
FIG. 51 shows a manufacturing process (Process 5) of the memory cell array of a fifth embodiment.

In the process 5 shown in FIG. 51, using the photo-resist 211 which is not removed, additional etching is performed, and the n type well 11 is etched and removed in a groove shape half way into the silicon substrate. The grooves are patterned in a Y direction, forming a three dimensional channel. The p type diffusion layer 12 which has already been formed is patterned so that it is exposed on the upper part of both side wall surfaces of the grooves in the n type well 11.

Figure 52:
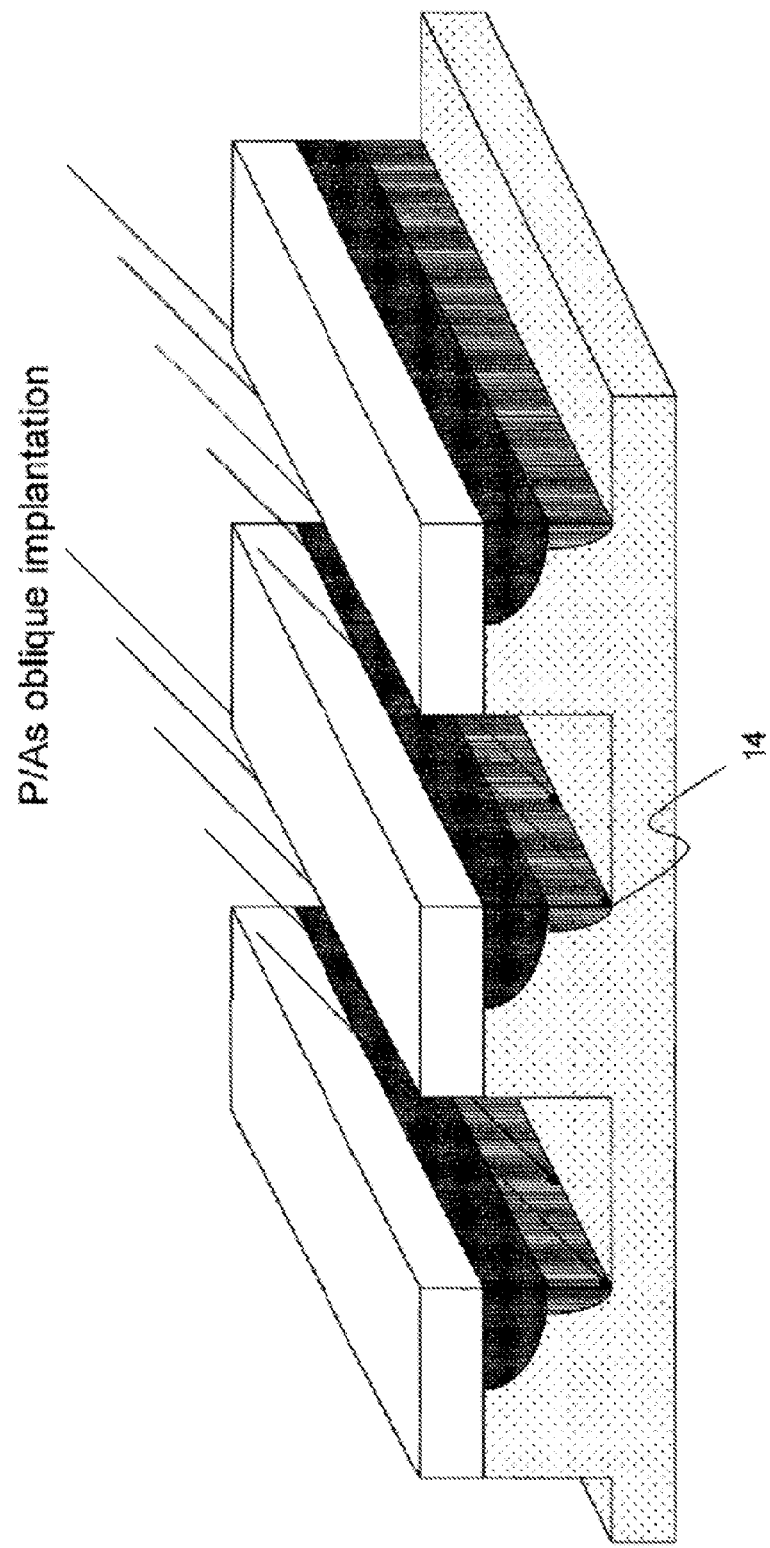
FIG. 52 shows a manufacturing process (Process 6) of the memory cell array of a fifth embodiment.

In the process 6 shown in FIG. 52, the photo-resist 211 is removed and n type impurities (P or As) are obliquely implanted in the same direction as the process 4 at a greater angle using the insulation oxide film layer 27 which was patterned in the process 3 and n type diffusion regions 14 are formed near the shallower edge of side walls on the p type regions 12. The n type diffusion regions 14 are regions in which n type impurities are diffused at a higher concentration than the n type well 11 and function as halo regions in memory cell transistors.

Figure 53:
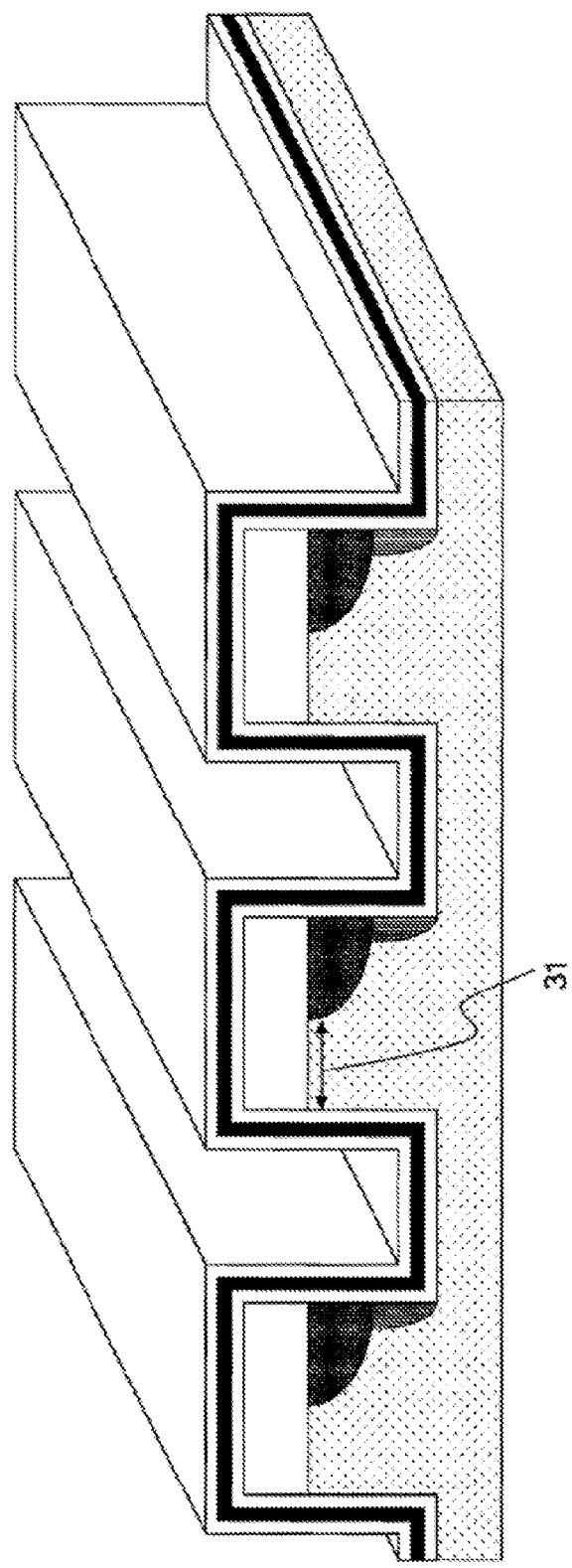
FIG. 53 shows a manufacturing process (Process 7) of the memory cell array of a fifth embodiment.

In the process 7 shown in FIG. 53, ONO film 30 (tunnel oxide film 15, nitride silicon film, (charge storage layer) 16, insulation oxide film 17) is formed over the entire surface region of the substrate which is non-flat. The oxide films 15, 17 are formed by CVD or thermal oxidization and the nitride film 16 is formed by CVD.

Figure 54:
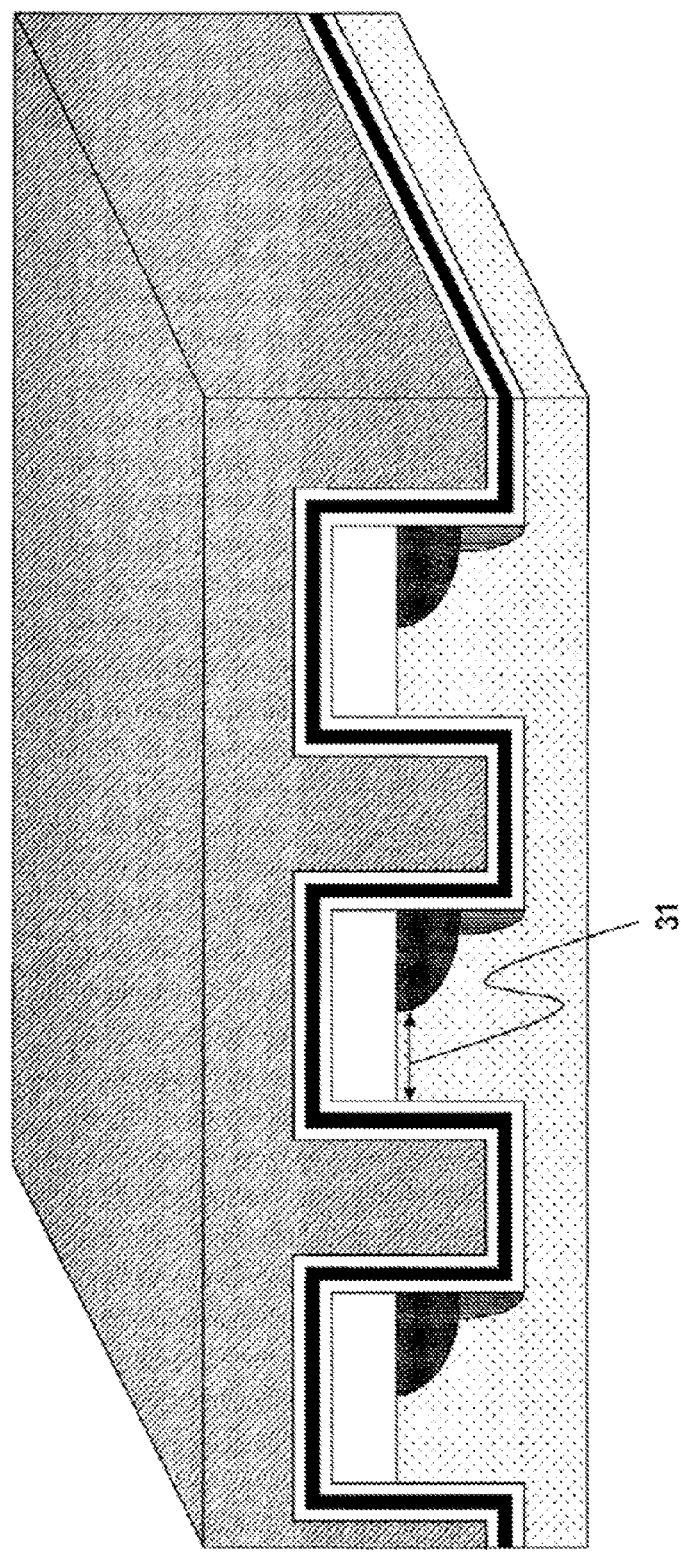
FIG. 54 shows a manufacturing process (Process 8) of the memory cell array of a fifth embodiment.

In the process 8 shown in FIG. 54, a polysilicon layer 110 is formed on the entire surface. This polysilicon layer 110 will later become word lines 18 and gate electrodes 19 when patterned.

Figure 55:
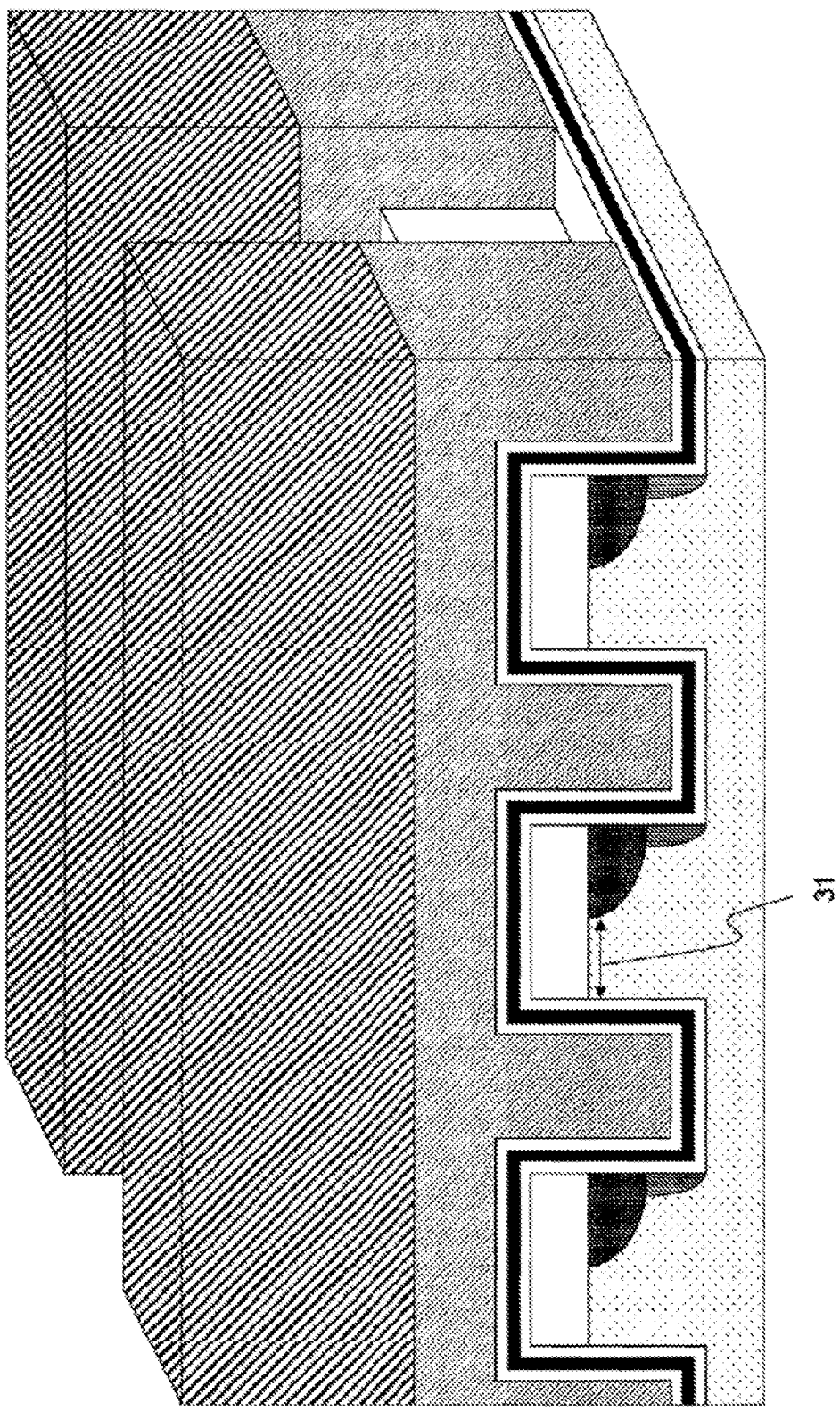
FIG. 55 shows a manufacturing process (Process 9) of the memory cell array of a fifth embodiment.

In the process 9 shown in FIG. 55, a photo-resist 211 of a stripe pattern (gate pattern) along the X direction is formed, the polysilicon layer 110 is removed by etching and the gate electrodes 18 (word lines) and the gate electrodes 19 are formed.

The photo-resist 211 is then removed, and the memory cell array shown in FIG. 46 is formed. After these processes 1-9, periphery circuits and upper wirings are formed and the non-volatile semiconductor memory device is complete.

In the memory cell array of the fifth embodiment, a non-selected memory cell is prevented from being programmed by offsetting the charge storage layer 16 from the adjacent one of bit lines 12 (−X side) by the insulation oxide film layer 27.

Since the ONO film 30 is formed on the upper part of the insulation oxide film 27 and the side surfaces plays no role during programming, it may be omitted.

Since each of the memory cells of this structure has a channel along the surface of the groove formed in the n type well region 11, it is possible to lengthen an effective channel length between the source and the drain even if the gap between the source and drain is shortened, thereby contributing to the miniaturization of a memory cell array.

Sixth Embodiment

A representative structure of another aspect of the present invention is summarized as follows. A memory transistor is formed by a standard CMOS process and a nonvolatile memory has a construction formed from a selection transistor and a memory transistor as a pair of series circuits. Data of the memory transistor is stored in a flip flop which is arranged separately from the memory transistor.

The memory transistor includes a gate electrode via a gate insulation film above a channel between a source and a drain, insulation film side spacers in a side (part) of the gate electrode, a drain side junction area which has an LDD construction which includes an area of low level impurity concentration and a source side junction area which has a non-LDD construction.

Also, a drive circuit for driving the nonvolatile memory applies a positive voltage (comparing with a voltage of the drain of the memory transistor) to the gate electrode and the source, channel hot electrons are injected to the insulation film side spacers, data programming is performed, a positive voltage (comparing with the voltage of the gate electrode and the drain) is applied to the source, channel hot electrons are injected to the insulation film side spacers and data erasure is performed.

The representative effects among the inventions disclosed in the present application are as follows. (1) The characteristics of nonvolatile elements obtained by making an offset structure of only one side of a transistor which is formed by a usual CMOS process are poor reliability and reproducibility and a high possibility of operation defects. However, according to the present invention, because the current differential of a pair of memory transistors is evaluated, operational stability is significantly improved.

(2) Because a gate voltage of the memory transistor is supplied from a driver circuit, it becomes possible to evaluate data in a region in which a voltage Vgs between the gate and source of the memory transistor is large, that is, a region with a large amount of current, and improve a sensor margin.

(3) Because the memory transistor and flip flop have an electrically separable construction, even in the case where the memory cell is used as output data for a fuse, electrical field stress is not applied to the memory transistor and reliability is improved.

Figure 56:
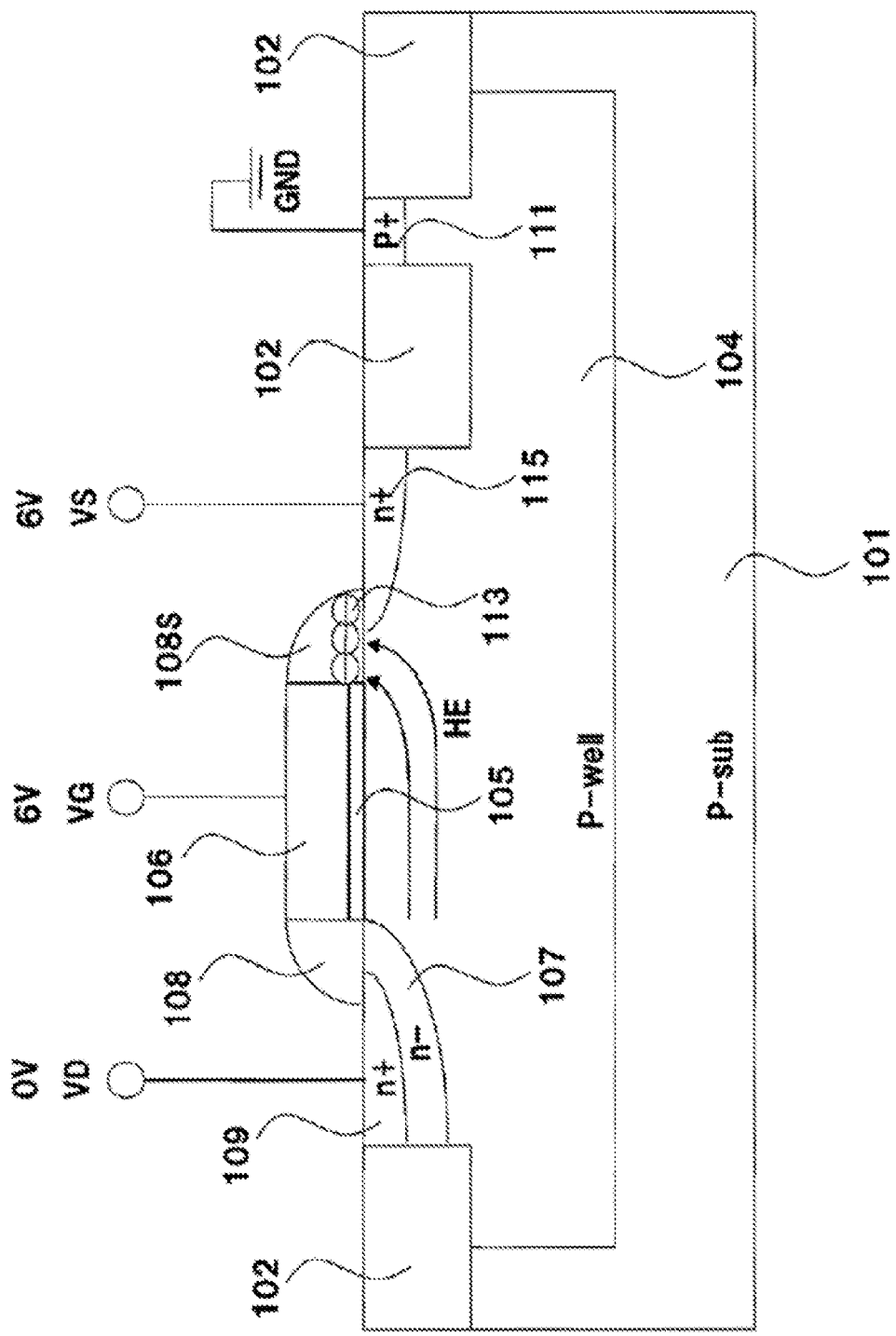
FIG. 56 shows a diagram of a cross sectional construction of a memory transistor used in an embodiment of the present invention.

First, the memory transistor which is used in the embodiments of the present invention will be explained. FIG. 56 is a diagram which shows a cross sectional structure of a memory transistor used in the embodiments below. This diagram shows a voltage arrangement when programming.

In FIG. 56, a P type well 104 with a depth of 0.8 µm and an average boron concentration of $2\times10^{17}$ cm$^{-3}$ is formed on a surface region of a P type silicon substrate 101 with a resistance of 10 Ωcm. Two memory transistors MCN1 and MCN2 which are separated by a plurality of 250 nm deep trenches 102 (element separation), are formed in this P type well 104. In this diagram, only one of the transistors (MCN1) is shown.

The memory transistor is an N channel type transistor and includes a drain 109 and a source 115 formed adjacent to the trenches 102 on both sides and a drain extension 107 formed in a periphery region of the drain 109 on the surface region of the P type well 104. The drain 109 and the source 115 are each formed with an average arsenic concentration of $1\times10^{20}$ cm$^{-3}$ and the drain extension 107 is formed with an average arsenic concentration of $5\times10^{18}$ cm$^{-3}$.

In addition, a gate electrode 106 consisting of a 5 nm thick gate oxide film 105 and a 200 nm thick polysilicon film with a phosphorus concentration of $2\times10^{20}$ cm$^{-3}$ is formed on the substrate of a channel region which is the region between the drain 109 and the source 115 on the surface of the P type well 104. Also, side spacers 108 and 108S formed from a 50 nm thick insulation film, are formed on both sides of the gate oxide film 105 and the gate electrode 106. Furthermore, because there is no extension region formed near the source 115 the source-side side-spacer 108S becomes exposed from the channel region of the substrate.

In addition, a P type diffusion layer 111 with an average boron concentration of $1\times10^{20}$ cm$^{-3}$ which is an electrode for grounding this P type well 104, is formed in the region separated from the above stated memory transistor by the trench 1102 within the P well 104 region.

By injecting carriers into the source-side side-spacer 108S, it is possible to increase the threshold voltage of this memory transistor. In addition, as explained in FIG. 61, by extracting the carriers injected to the side spacer 108S, it is possible to restore the threshold voltage to its initial state. Accordingly, this memory transistor stores data in a nonvolatile way.

This memory transistor can be manufactured by a standard CMOS process and a standard initial threshold voltage is 0.8V. However, because this transistor has a particular structure the threshold voltage variance is large and therefore using this memory transistor alone as a memory element and securing reliability is difficult. As a result, in the memory cell unit of this embodiment, a pair of these memory transistors (MCN1, MCN2) is used and reliability is improved by using a pair of these memory transistors (MCN1, MCN2) and comparing the threshold voltage of each memory transistor.

The detailed description of the sixth embodiment is as follows.

A memory cell unit (nonvolatile semiconductor memory element) and a memory device (nonvolatile semiconductor memory device) comprising this memory cell unit related to a first embodiment of the present invention will be explained while referring to the diagrams FIG. 57 to FIG. 65. Furthermore, in the explanations that follow, a signal line and a signal and voltage which appear in this signal line are referred to by the same symbol.

Figure 57:
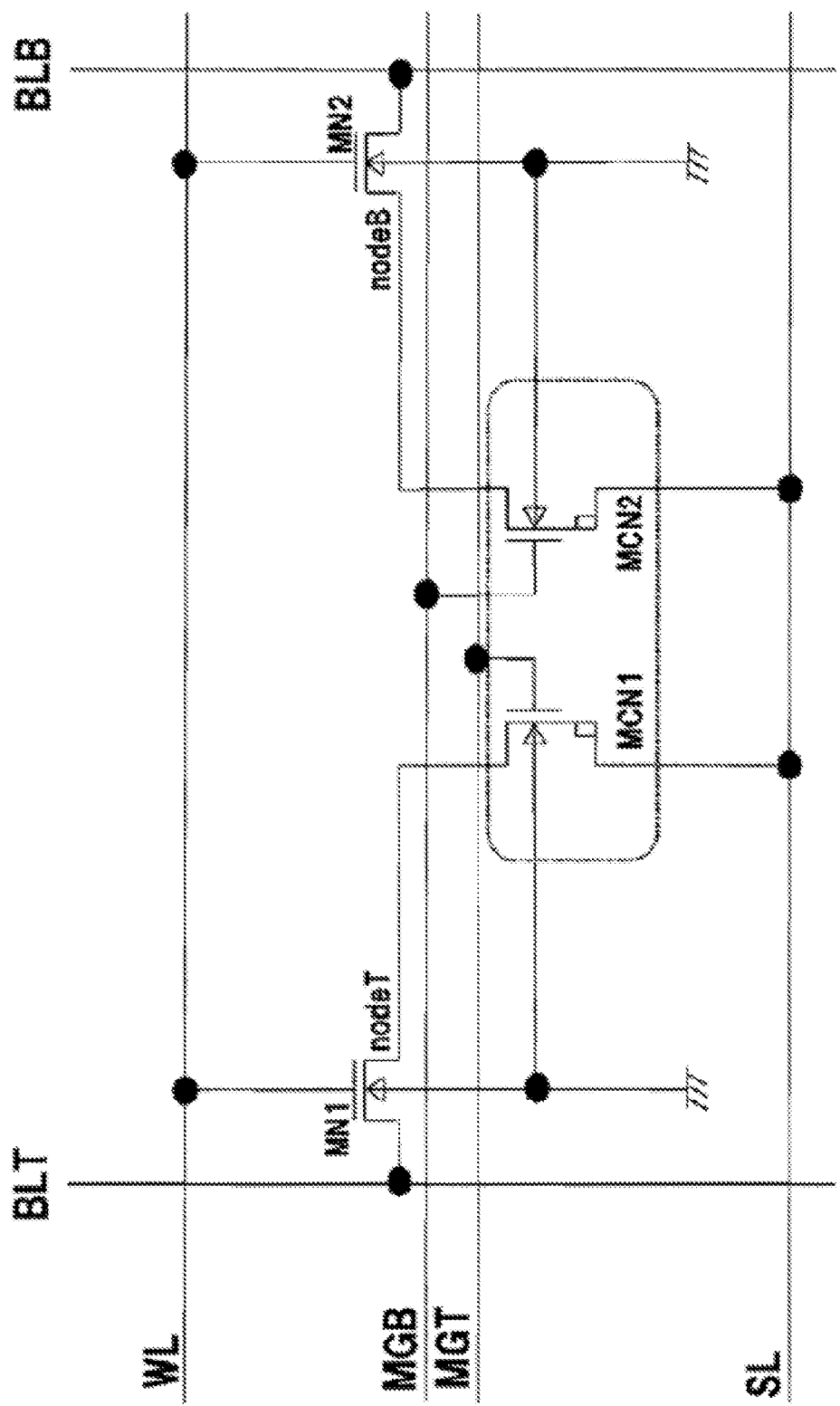
FIG. 57 shows a diagram of a construction of a memory cell unit which is a sixth embodiment of the present invention.

FIG. 57 is a circuit diagram of a memory cell unit comprising one cell of a memory device. In this memory cell unit programming and reading is performed via one word line WL and two bit lines BLT (BitLine—True) and BLB (BitLine—Bar).

The memory transistors MCN1 and MCN2 which are N type MOS transistors include a source-side side-spacer (part) which is formed as a charge storage region. In the memory transistors MCN1 and MCN2 a minus charge is injected into the side spacer (part) by channel hot electrons and programming is performed by a rise in threshold voltage. The memory transistors MCN1 and MCN2 share a threshold voltage via a source line SL. The gate of the memory transistor MCN1 is connected to a gate control line MGT and the gate of the memory transistor MCN2 is connected to another gate control line MGB. The drain (part) (node T) of the memory transistor MCN1 is connected with the bit line BLT via a transfer gate MN1 which is an N type MOS transistor. In addition, the drain (part) (node B) of the memory transistor MCN2 is connected with the bit line BLB via a transfer gate MN2 which is an N type MOS transistor. These transfer gates MN1 and MN2 are connected to a word line WL.

Figure 58:
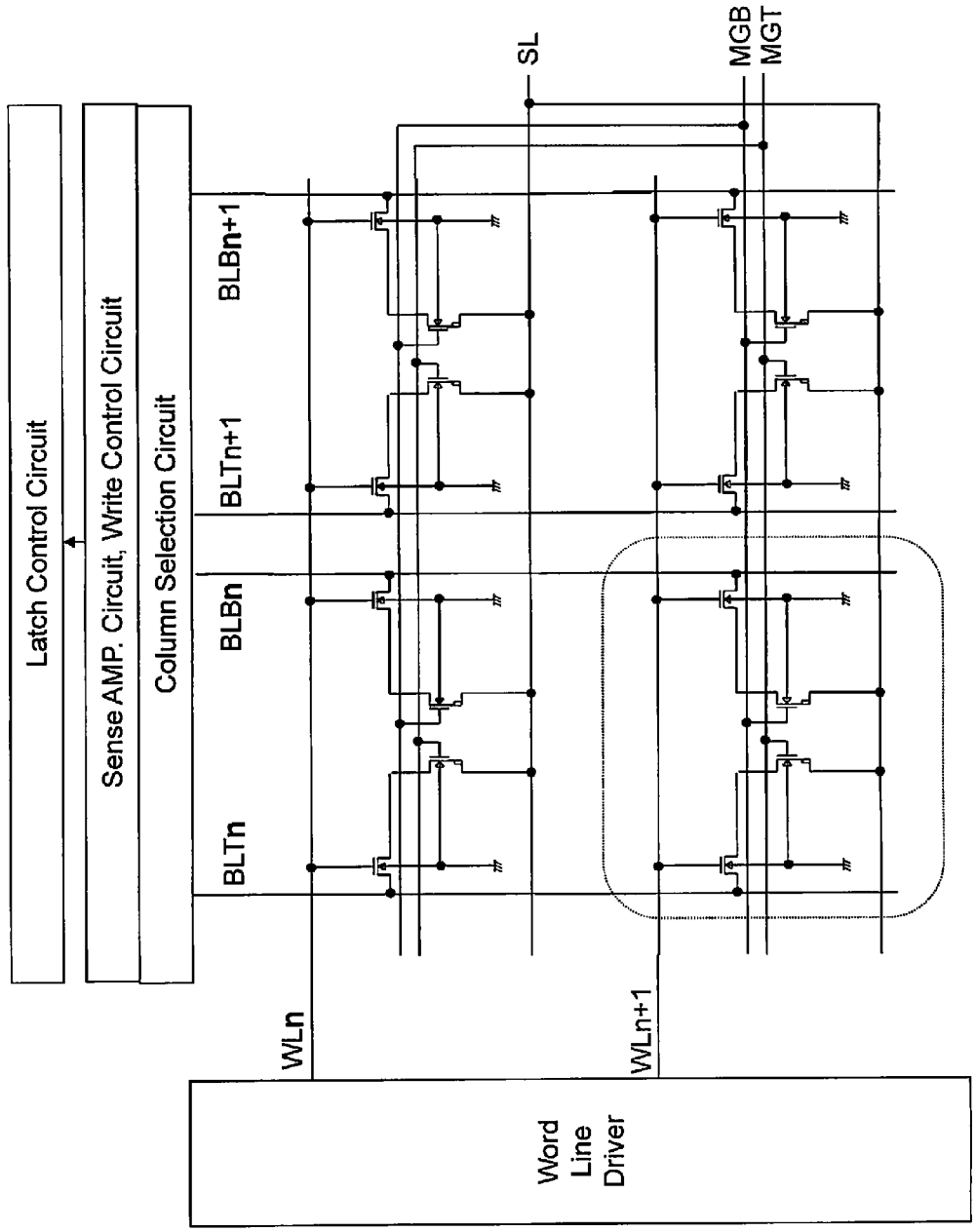
FIG. 58 shows a diagram of a construction of the memory device arranged with an array of the memory cell units in a sixth embodiment.

FIG. 58 is a diagram which shows the structure of a memory device consisting of a plurality of the memory cell units shown in FIG. 57 which are connected in rows (row: X) and columns (column: Y) in the shape of an array. In this memory device word lines WL are arranged on each row and are each independently controlled by a word line driver. In addition, the bit lines BLT and BLB are arranged on each column and are each independently controlled by a column selection circuit. Signal lines other than these (SL, MGT, MGB) are commonly arranged on all the memory cell units (block) and are commonly controlled.

Because the memory device of this embodiment has a structure in which a memory cell unit does not include a flip flop within the memory cell unit itself, a flip flop is arranged outside of the array, that is, on the exterior of a sense amplifier circuit. The data of a memory cell which is read by the sense amplifier is transferred to the flip flop and can be externally read.

Figure 59:
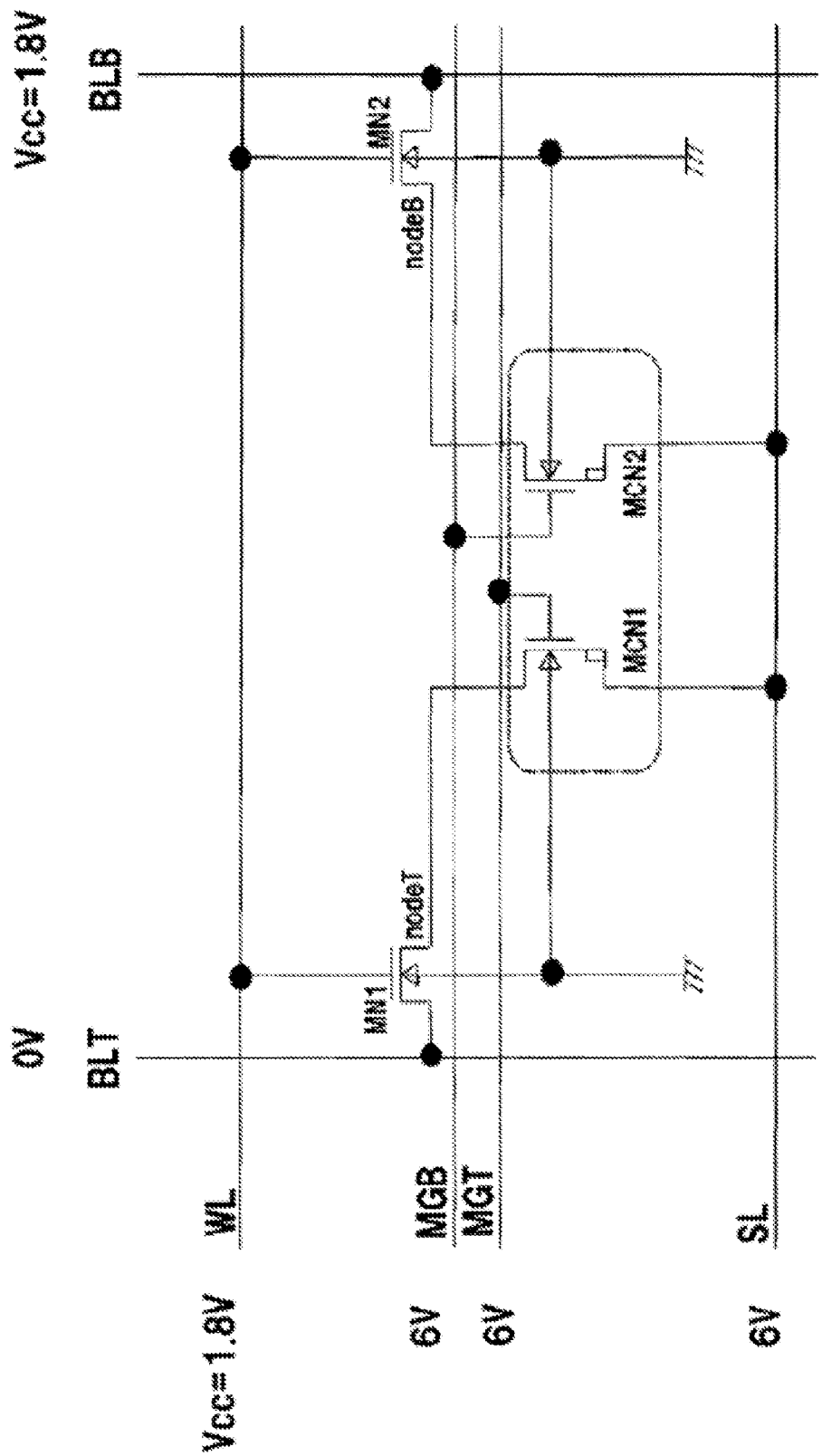
FIG. 59 shows a diagram of the voltage application conditions when programming data to the memory cell unit of a sixth embodiment.

FIG. 59 is a diagram which shows the application conditions of a programming voltage to a memory cell unit. In FIG. 59, the conditions in the case when data "0" is programmed, that is, when the threshold voltage of the memory transistor MCN1 is raised, are shown. When "0" is programmed, the word line WL is set to Vcc, the True side bit line BLT is set to 0V and the Bar side bit line is set to Vcc under the condition that a source voltage SL and gate voltages MGT and MGB are set to 6V. In this way, the node T becomes 1V for example, because the True side transistor MCN1 is switched ON and a current of 300 μA, for example, flows to the memory transistor MCN1. Due to this current, channel hot electron occurs in the source SL side of the memory transistor MCN1 and because electrons are injected into the SL side side spacer (part) the threshold voltage of the memory transistor increases (programming is performed).

The transfer gate MN2 is switched OFF and node B increases to 5V (6V−Vthn:Vthn=threshold voltage of MCN2) by charging from the source line SL side. However, because there is no current pass in the memory transistor MCN2, channel hot electron injection does not occur and the threshold voltage of the memory transistor MCN2 which is not to be programmed does not change.

In addition, in the voltage application conditions in the case where data "1" is programmed, that is, the voltage application conditions for increasing the threshold voltage of the memory transistor MCN2, the voltage of the True side bit line BLT is exchanged for the voltage of the Bar side bit line BLB and BLT is set at Vcc and BLB is set at 0V. Other conditions remain the same as when programming data "0".

Furthermore, in the present embodiment, 6V is applied to both the gate MGT and the drain SL of the memory transistor MCN1. However, the voltage which is applied to the gate MGT and drain SL of the memory transistor MCN1 is not limited to 6V. The gate MGT and the drain SL may each be applied with different voltages.

Figure 60:
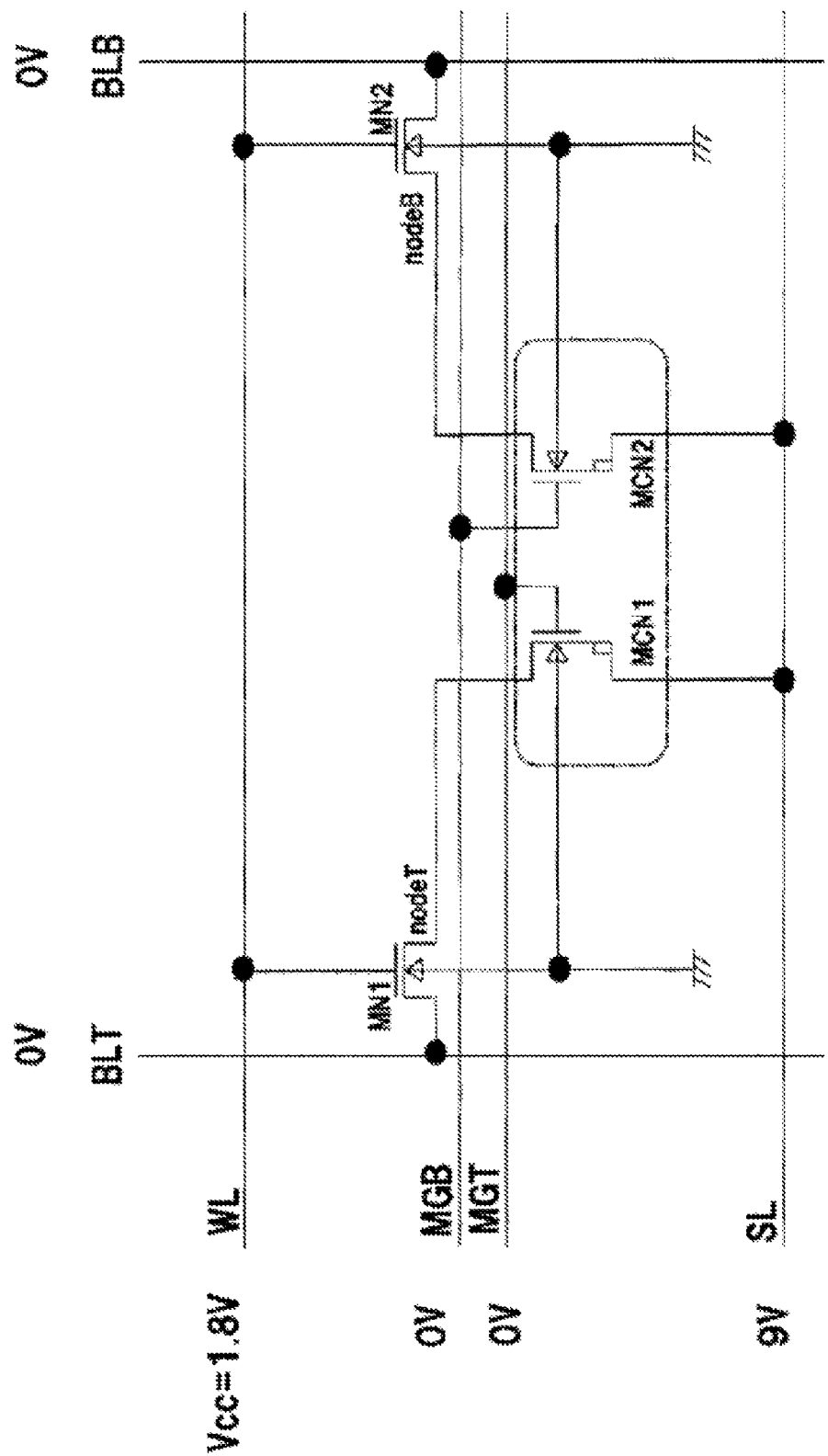
FIG. 60 shows a diagram of the voltage application conditions when erasing data from the memory cell unit of a sixth embodiment.

FIG. 60 is a diagram which shows the application conditions of an erase voltage which is applied to a memory cell unit. An erasure operation is carried out (simultaneously) to all the memory cells (block). The word line WL is set at Vcc and the bit lines BLT and BLB are set at 0V under the condition that the source line SL is set at 9V and the gate voltages MGT and MGB of the memory transistors MCN1 and MCN2 are set at 0V. Because the memory transistors MCN1 and MCN2 are switched OFF by this voltage arrangement, node T and node B become 0V and avalanche hot holes are injected into the source-side side-spacer from the source side (source line SL) within the memory transistors MCN1 and MCN2. The negative charge (electrons) which is trapped by the programming operation in FIG. 59 is neutralized by this positive charge and the threshold voltage of the memory transistors MCN1 and MCN2 is decreased to a pre-programming state.

Figure 61:
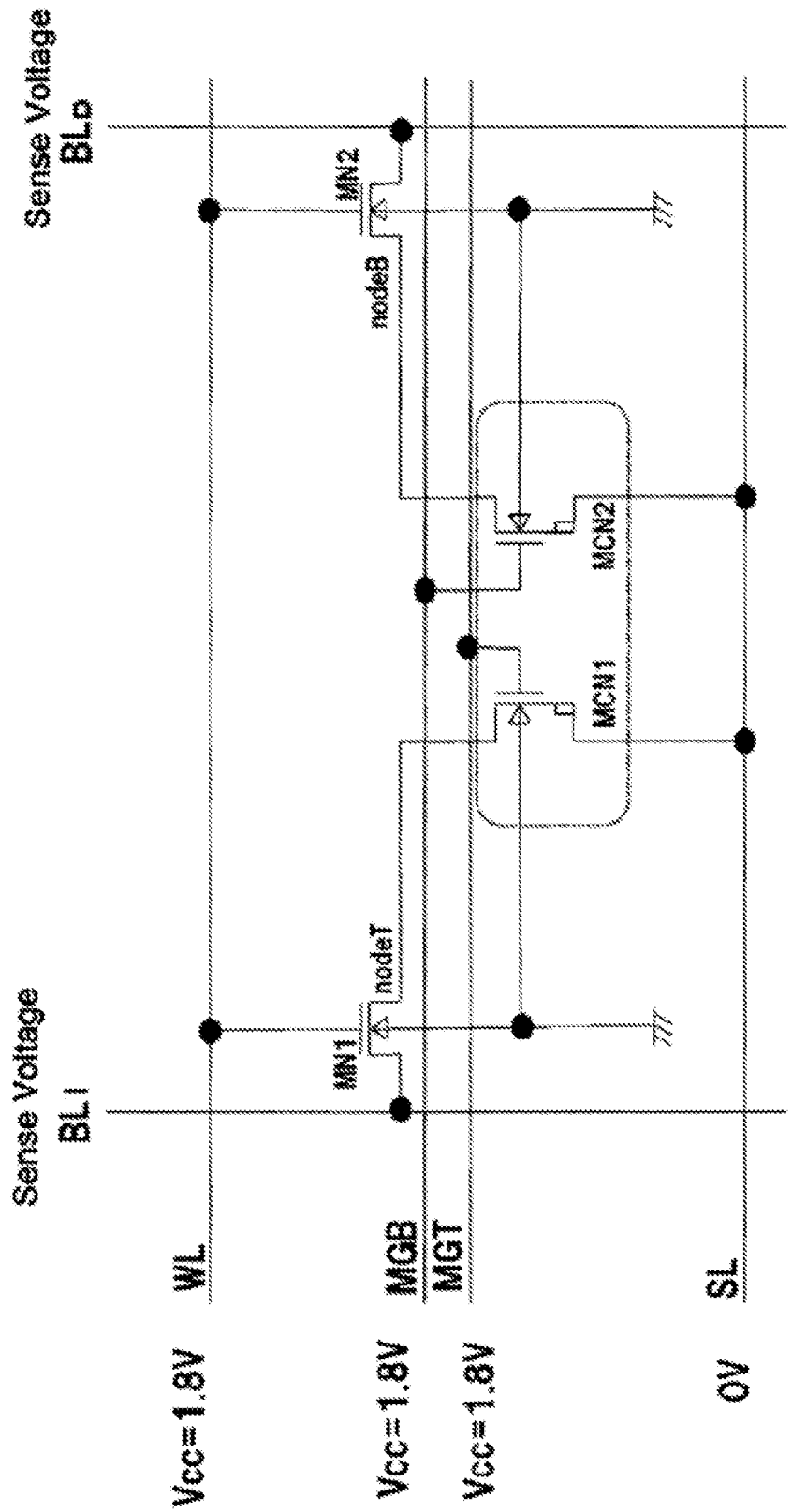
FIG. 61 shows a diagram of the voltage application conditions when reading data from the memory cell unit of a sixth embodiment.

FIG. 61 is a diagram which shows the application conditions of a read voltage which is applied to a memory cell unit. In the voltage application conditions shown in FIG. 61 it is presupposed that data in a memory cell unit which is to be read is not indefinite, that is, both the threshold voltages of the memory transistors MCN1 and MCN2 in a nonvolatile data memory (part) are not Vth0. First, a source voltage SL of the memory transistors MCN1 and MCN2 is 0V and the gate voltages MGT and MGB are Vcc. Under these conditions the memory transistor of the memory transistors MCN1 and MCN2 which is not programmed (low threshold voltage) is switched ON and the programmed memory transistor (high threshold voltage) remains switched OFF. In this state, when the word line WL is set to Vcc and the transfer gates MN1 and MN2 are switched ON, because a current flows only in the memory transistor which is switched ON, the current difference appears as a change in the voltage of the bit lines BLT and BLB. This potential difference is read by a differential sense amplifier and reading of the data is completed by transferring the data to the flip flop which is arranged outside of the memory array. After transferring the data to the flip flop, it is possible to relieve the electrical field stress on the memory transistors MCN1 and MCN2 by making the gate voltages MGT and MGB of the memory transistors 0V.

Figure 62:
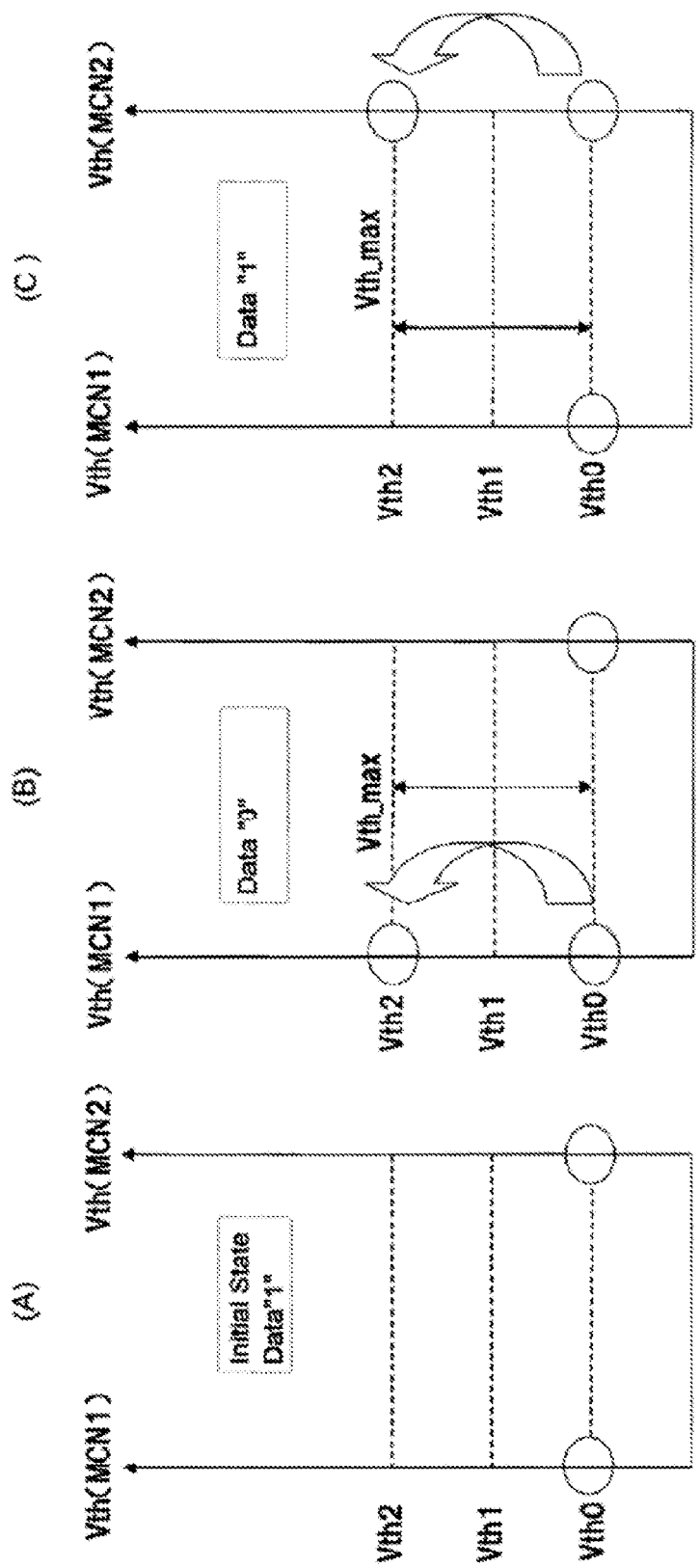
FIG. 62 shows a diagram which explains a data potential and a read margin in the memory cell unit.

FIG. 62 is a diagram which explains a threshold voltage which the memory transistors MCN1 and MCN2 are set to by the above stated programming operation. That is, FIG. 62 is a diagram which explains a method for setting data to a nonvolatile memory cell. Here, when the threshold voltage of the memory transistor MCN1 is in a low state (ON) and the threshold voltage of the memory transistor MCN2 is in a high state (OFF) data is "1", and when the threshold voltage of the memory transistor MCN1 is in a high state (OFF) and the threshold voltage of the memory transistor MCN2 is in a low state (ON) data is "0".

(A) in FIG. 62 shows the case before data is set, that is, when the initial state of both threshold voltages of the memory transistors MCN1 and MCN2 is Vth0. Even in this state, the state of this nonvolatile memory cell is determined to be data "1" by the procedure shown in FIG. 77 or FIG. 79.

(B) in FIG. 62 shows a threshold voltage when data "0" is set in a nonvolatile memory cell. Programming of data "0" is realized by increasing the threshold voltage of the memory transistor MCN1 to Vth2 (Vth2>Vth0) from the initial state shown in (A) in FIG. 62.

(C) in FIG. 62 shows a threshold voltage when data "1" is set in a nonvolatile memory cell. Programming of data "1" is realized by increasing the threshold voltage of the memory transistor MCN2 to Vth2 (Vth2>Vth0) from the initial state shown in (A) in FIG. 62.

When the erase operation explained in FIG. 60 is performed, even if the threshold voltage is controlled as in (B) and (C) in FIG. 62, the threshold voltage is restored to the state shown in (A) in FIG. 62.

In this way, even if the threshold voltages of the memory transistors MCN1 and MCN2 are increased, because it is possible for the threshold voltages to decrease again to the initial state Vth0, and even in the case where both memory transistors MCN1 and MCN2 are in an initial state Vth0, because it is possible to forcibly determine data as "1", even if this memory cell is used for the reprogramming of data multiple times, it is possible to sufficiently obtain a large read margin which is the difference in threshold voltage of the True side (memory transistor MCN1) and the Bar side (memory transistor MCN2).

In the previously stated control method, it is presupposed that data in a memory cell unit which is to be read is not indefinite, that is, both the threshold voltages of he memory transistors MCN1 and MCN2 in a nonvolatile data memory (part) are not Vth0. However, in actual usage it is possible that data which is not indefinite must be read from an unknown memory cell unit.

Figure 63:
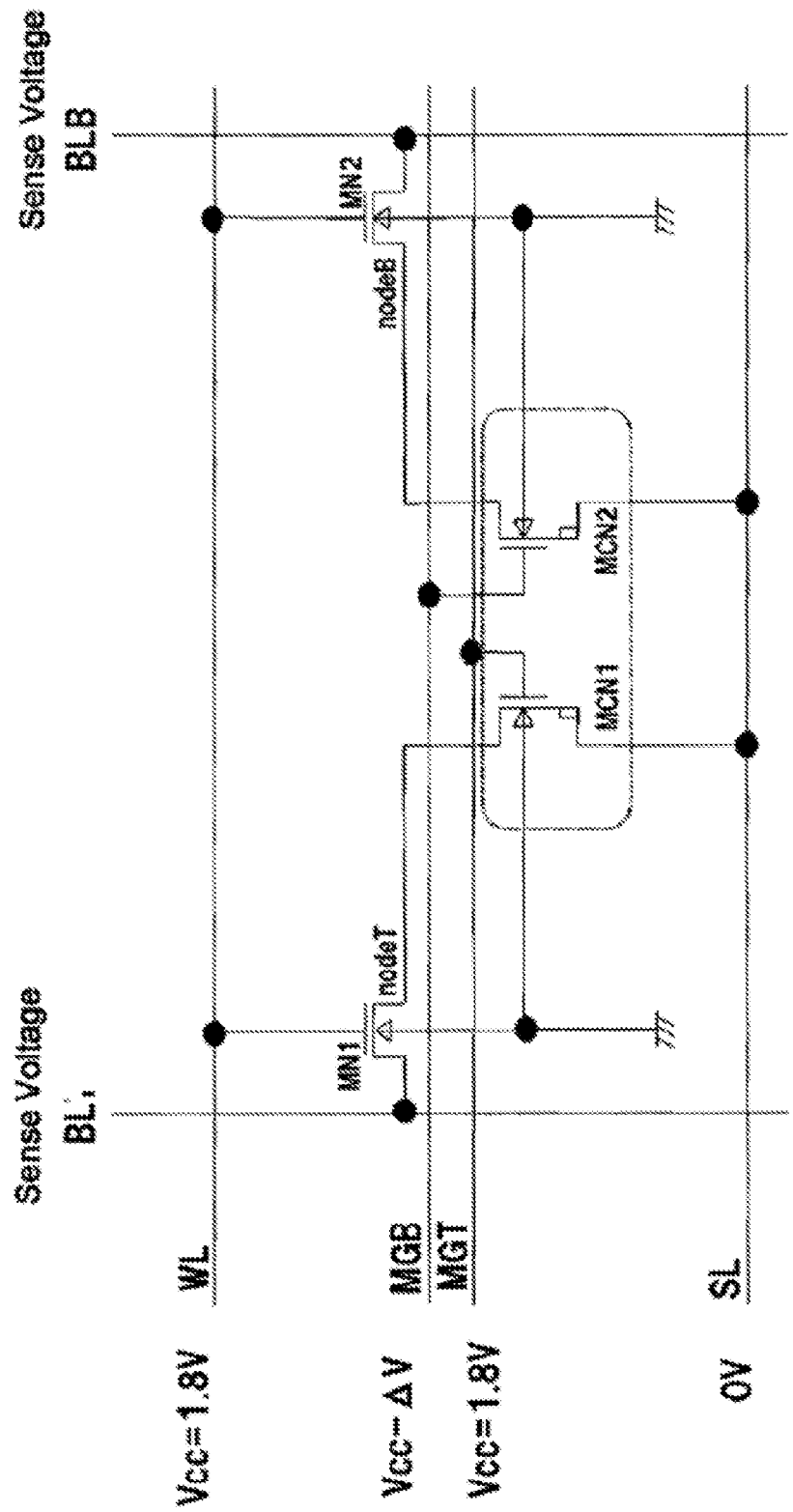
FIG. 63 shows a diagram of the voltage application conditions when data is read from the memory cell unit of a sixth embodiment.

FIG. 63 is a diagram which shows the voltage application conditions when a sense amplifier is made to recognize indefinite data as data "1" even in the case where a memory cell unit with indefinite data is included and where data is determined as data which is already programmed in a nonvolatile data memory (part). First, the source voltage SL of the memory transistors MCN1 and MCN2 is set to 0V, the gate voltage MGT of the memory transistor MCN1 is set to Vcc and the gate voltage MGB of the memory transistor MCN2 is set to Vcc−ΔV (for example, ΔV=0.2V). By setting the gate potential of the memory transistor MCN1 higher than the gate potential of the memory transistor MCN2 by ΔV, it becomes easier to switch ON the memory transistor MCN1 than the memory transistor MCN2 and in the case where indefinite data such as when the threshold voltages of both the memory transistors MCN1 and MCN2 are Vth0 it is possible to forcibly make a sense amplifier recognize the data as "1". However, in the case where data is already programmed, data is determined based on the threshold voltage differential between the memory transistors MCN1 and MCN2. This operation is the same as that explained in FIG. 61.

Here, the case where the threshold voltage of both memory transistors MCN1 and MCN2 is Vth0, indicates that reprogramming to the memory transistors MCN1 and MCN2 has not been performed and is possible that there is also no deterioration in the memory transistors together with reprogramming. As a result, it is sufficient to decide upon the size of ΔV by only considering the variance in the initial threshold voltage of a transistor, for example, about 0.2V is considered sufficient. Here, in the case where data is indefinite, the case was explained that the data which is read is forcibly determined as "1", however, by reversing the potential difference between MGT and MGB it is possible to determine the data as "0".

Figure 64:
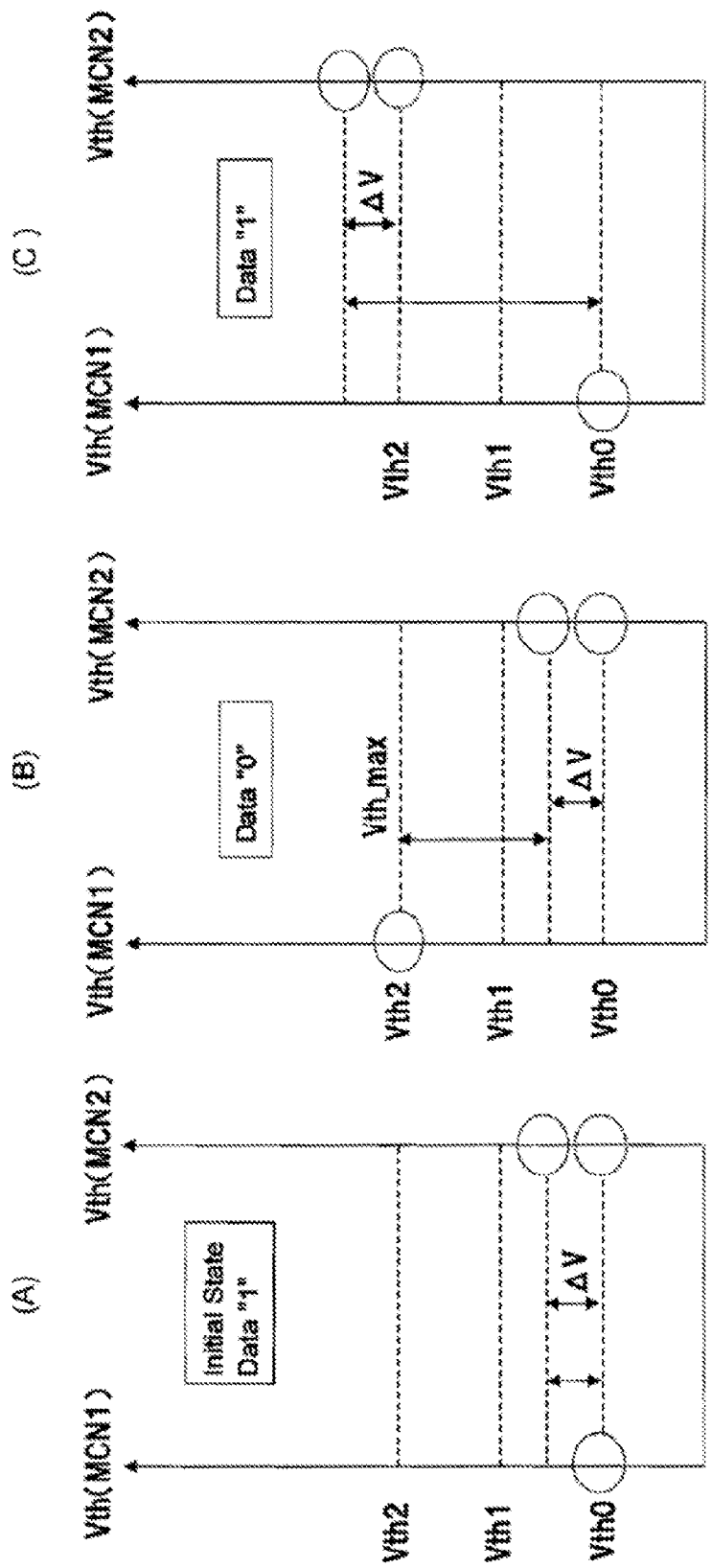
FIG. 64 shows a diagram of a data potential and a read margin in the memory cell unit.

FIG. 64 is a diagram which explains a margin of data determination in the case where the voltage application procedure shown in FIG. 63 is performed. In the initial state such as when both the threshold voltages of the memory transistors MCN1 and MCN2 are Vth0, as stated previously, by making the voltage MGB lower than the voltage MGT by only ΔV the threshold voltage of the MCN2 side which makes it appears increased by only ΔV and data is forcibly recognized as "1". In a memory cell unit which is already programmed with data "0" a margin only decreases by ΔV, however, the margin in the case where Vth2−Vth0=1V, ΔV=0.2V is supposed, becomes 0.8V. In a memory cell unit which is already programmed with data "1", reversely, the margin increases only by ΔV and the margin in the case where Vth2−Vth0=1V, ΔV=0.2 is supposed, becomes 1.2V.

Figure 65:
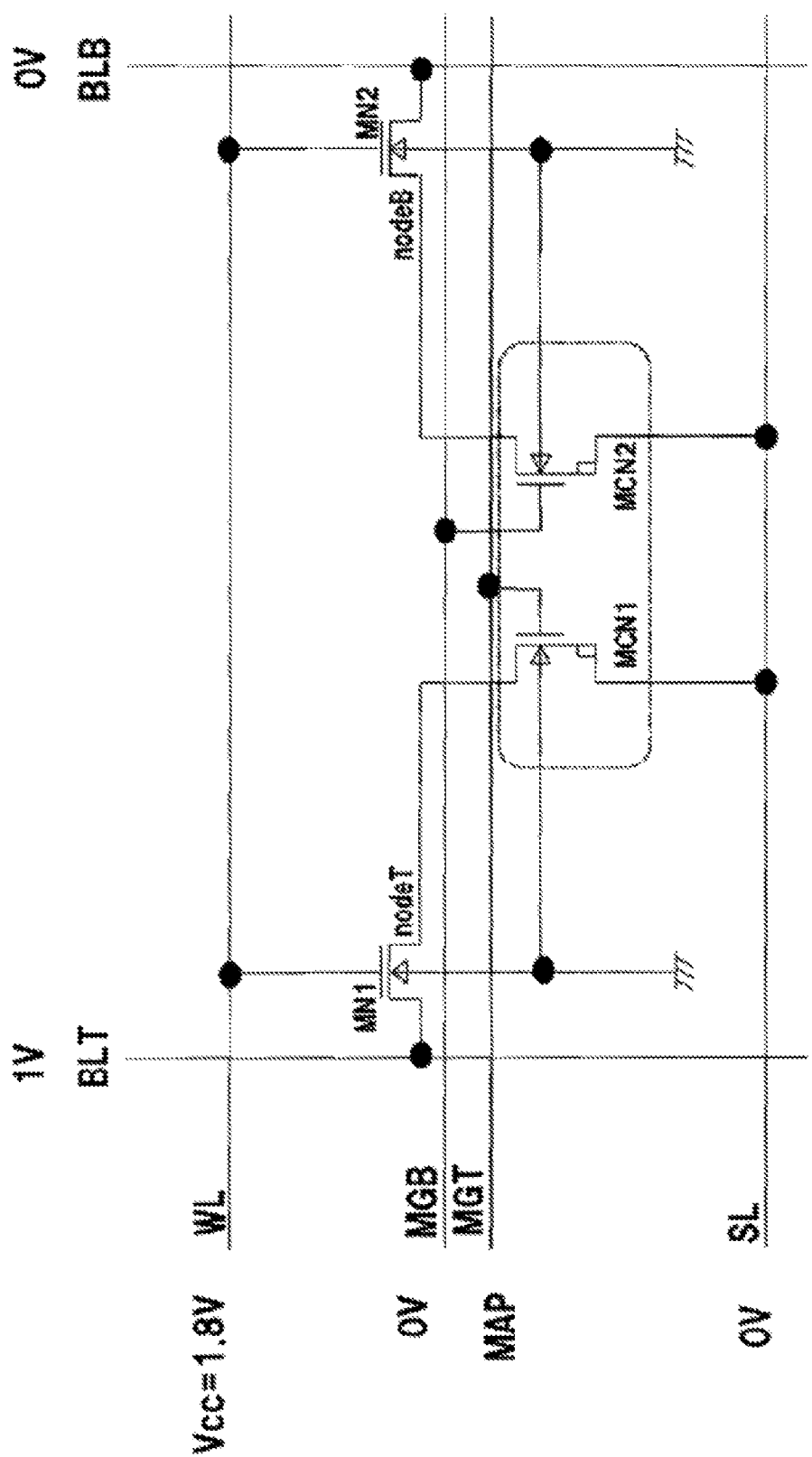
FIG. 65 shows a diagram which explains a threshold voltage detection method of a memory transistor of the memory unit of a sixth embodiment.

FIG. 65 is a diagram which explains a method for detecting a threshold voltage of the memory transistor MCN1. FIG. 65 shows the voltage application conditions when detecting a threshold voltage. By detecting a threshold voltage of a memory transistor using this method, it becomes possible to evaluate an initial state threshold voltage variance, the threshold voltage change amount in programming an erasure operations and high temperature retention characteristics etc.

A source voltage SL of the memory transistor MCN1 is set to 0V and 1V is supplied to the drain (node T). 1V is supplied to the drain from a bit line BLT via the transfer gate MN1. Under these conditions, a MAP voltage (variable) is applied to the gate of a memory transistor. By making the MAP voltage variable it becomes possible to determine the threshold voltage (required gate voltage for flowing a certain fixed current) of the memory transistor MCN1.

When a threshold voltage of the memory transistor MCN1 side is measured, the gate voltage MGB of the memory transistor MCN2 is set at 0V and the memory transistor MCN2 is switched OFF. Because the voltage between the source and drain of the memory transistor MCN2 is 0V, even if the transistor is switched ON, current does not flow, however, the memory transistor MCN2 is switched OFF so that the source voltage SL is not raised by a current leak for example. Even if the gate voltage MGB of the memory transistor MCN2 is set to the same MAP voltage as the gate voltage MGT of the memory transistor MCN1 a problem does not arise as far as operation is concerned.

FIG. 65 shows the voltage application conditions in the case where a threshold voltage of the memory transistor MCN1 is measured. However, in the case where a threshold voltage of the memory transistor MCN2 is measured, it is sufficient to reverse the control of the bit lines BLT, BLB and control of the gate voltages MGT and MGB.

Seventh Embodiment

Figure 66:
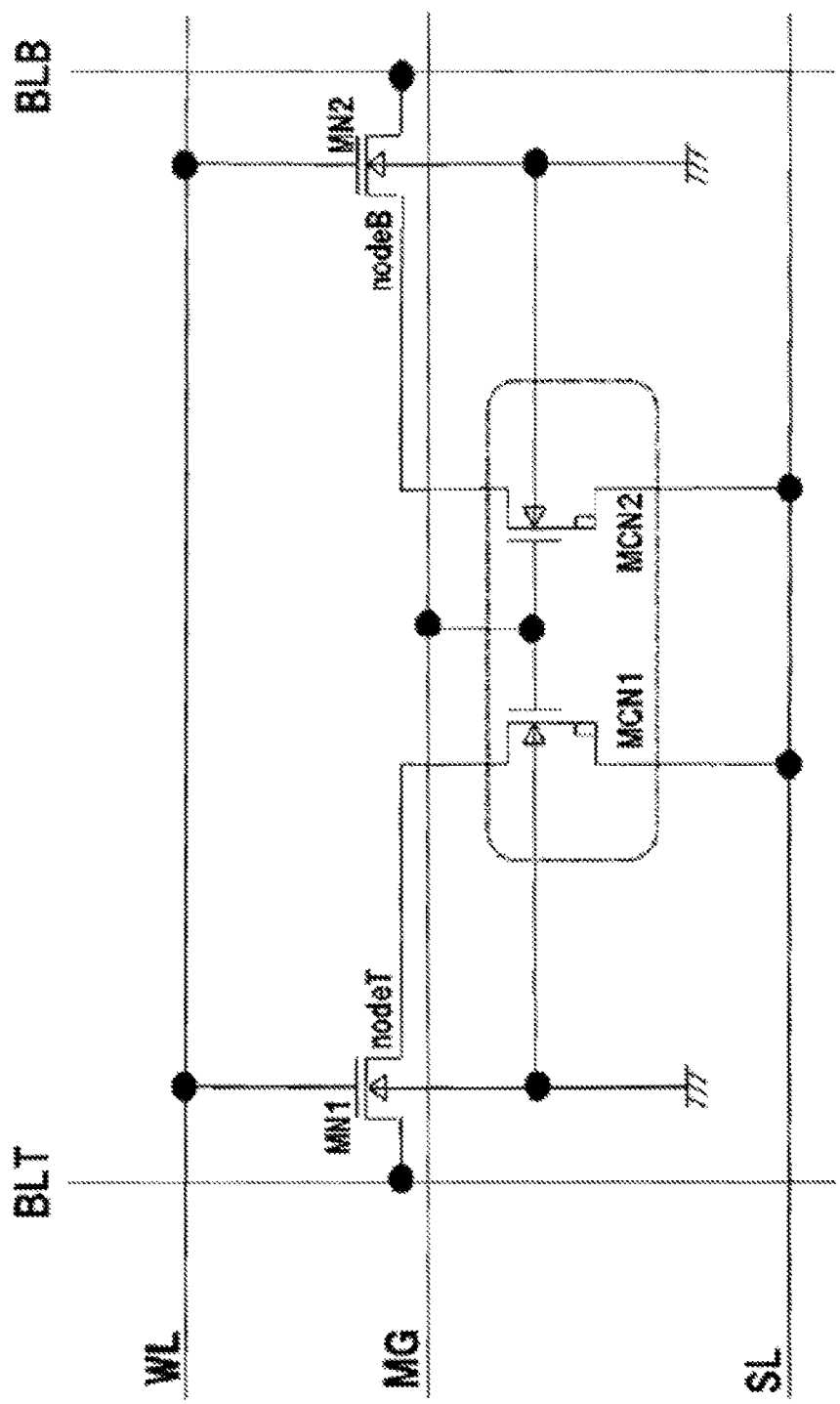
FIG. 66 shows a diagram of a construction of a memory cell unit of a seventh embodiment of the present invention.

FIG. 66 is a diagram which shows a seventh embodiment of a memory cell unit. The point where FIG. 66 is different from the first embodiment shown in FIG. 57 is that the gate voltage MG of the memory transistors MCN1 and MCN2 is shared. In this structure, because the gate voltages MGT and MGB of the memory transistors MCN1 and MCN2 as shown in FIG. 63 can not be controlled separately, data in the case where the data is indefinite as in when the threshold voltages of the memory transistors MCN1 and MCN2 are both Vth0, can not be determined as "1" or "0". However, in the case where this memory cell with this type of indefinite data is included, it is useful because the structure is simplified.

The memory cell shown in FIG. 66 is connected in the shape of an array as shown in FIG. 58 and a memory device is formed. Programming, erasing and reading operations of this memory cell are the same as the operations shown in FIG. 59, FIG. 60 and FIG. 61 of the sixth embodiment. Also, when detecting a threshold voltage, because the gate voltages of the memory transistors MCN1 and MCN2 as shown in FIG. 65 can not be controlled separately, the gate voltage of the transistor which is not to be measured is also controlled by a MAP voltage and the potential difference between the source and drain of the memory transistor which is not to be measured is 0V and because a leak current does not flow, a problem does not occur as far as operation is concerned.

The structure in this embodiment has the following merit. Because gate voltage control of the memory transistors MCN1 and MCN2 as stated above is shared the number of drivers for controlling the gate of a memory transistor can be reduced by half compared to the first embodiment.

Eighth Embodiment

Figure 67:
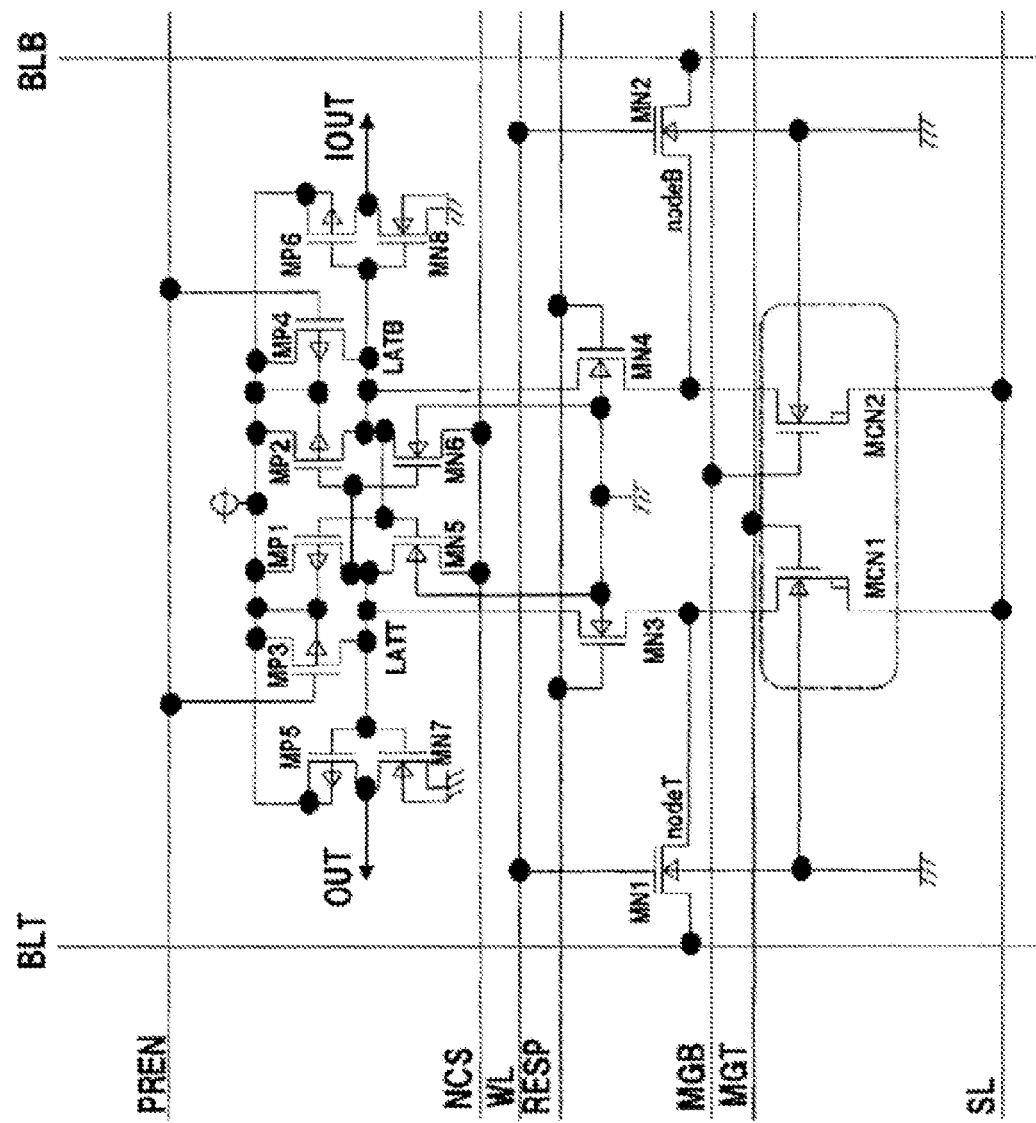
FIG. 67 shows a diagram of a construction of a memory cell unit of an eighth embodiment of the present invention.

FIG. 67 is a diagram which shows an eighth embodiment of a memory cell unit. The point where FIG. 67 is different from the first embodiment shown in FIG. 57 is that assuming the case where a fuse output is used, an inverter for inverting a flip flop and each flip flop output is arranged within each memory cell unit. The connection of the memory transistors MCN1 and MCN2 and the transfer gates MN1 and MN2 is the same as the sixth embodiment shown in FIG. 57.

The flip flop (part) is formed by PMOS transistors MP1 and MP2 in which an N well potential and a source potential are Vcc, and NMOS transistors MN5 and MN6 in which a P well potential is GND and a source potential is NCS. The PMOS transistor MP1 and the NMOS transistor MN5 form a TRUE side inverter and the PMOS transistor MP2 and the NMOS transistor MN6 form a BAR side inverter.

The flip flop TRUE side input/output (part) LATT is connected to the node T via an NMOS transistor MN3. The flip flop BAR side input/output (part) LATB is connected to the node B via an NMOS transistor MN4. The gate potential of the NMOS transistors MN3 and MN4 is controlled by a control signal RESP.

In addition, the flip flop TRUE side input/output (part) LATT is connected to Vcc via a PMOS transistor MP3. The flip flop BAR side input/output (part) LATB is connected to Vcc via a PMOS transistor MP4. The gate potential of the PMOS transistors MP3 and MP4 are controlled by a control signal PREN.

The flip flop TRUE side output LATT becomes the input of an inverter formed by a PMOS transistor MP5 and an NMOS transistor MN7 and is output as OUT of an inverter output. The flip flop BAR side output LATB becomes the input of an inverter formed by a PMOS transistor MP6 and an NMOS transistor MN8 and is output as IOUT of an inverter output. In the case of a fuse either OUT or IOUT is used, however when data is transferred to the flip flop in order to secure parasitic capacitance balance between LATT and LATB and operational stability, an inverter is arranged on/in both side (True side and Bar side).

Figure 68:
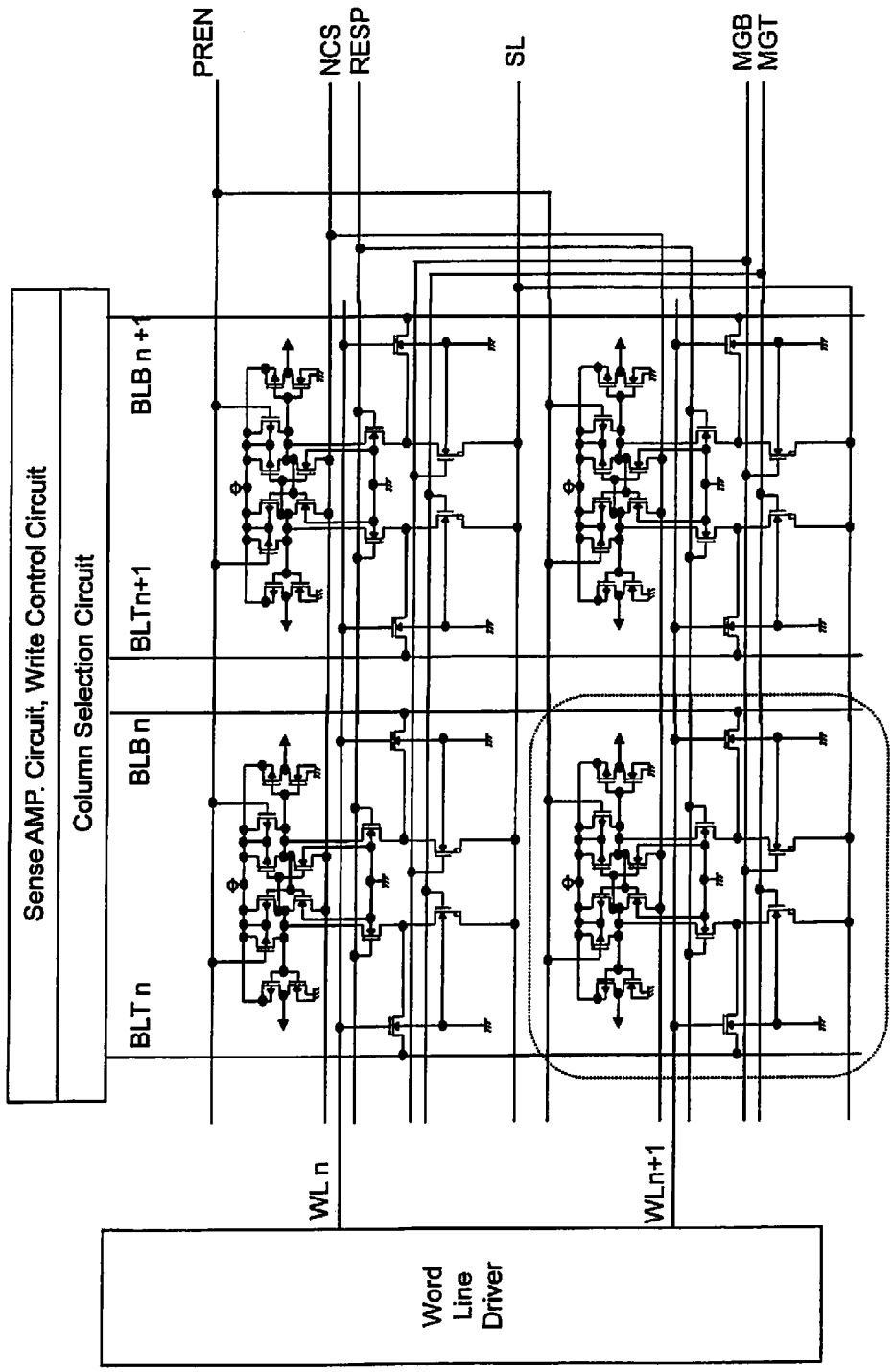
FIG. 68 shows a diagram of a construction of a memory device arranged with an array of the memory cell units in an eighth embodiment.

FIG. 68 is a diagram which shows the structure of a memory device consisting of a plurality of the memory cell units shown in FIG. 67 which are connected in rows (row: X) and columns (column: Y) in the shape of an array. In this memory device word lines WL are arranged on each row and are each independently controlled by a word line driver. In addition, the bit lines BLT and BLB are arranged on each column and are each independently controlled by a column selection circuit. Signal lines other than these (SL, MGT, MGB, PREN, NCS, RESP) are commonly arranged on all the memory cell units (block) and are commonly controlled.

Figure 69:
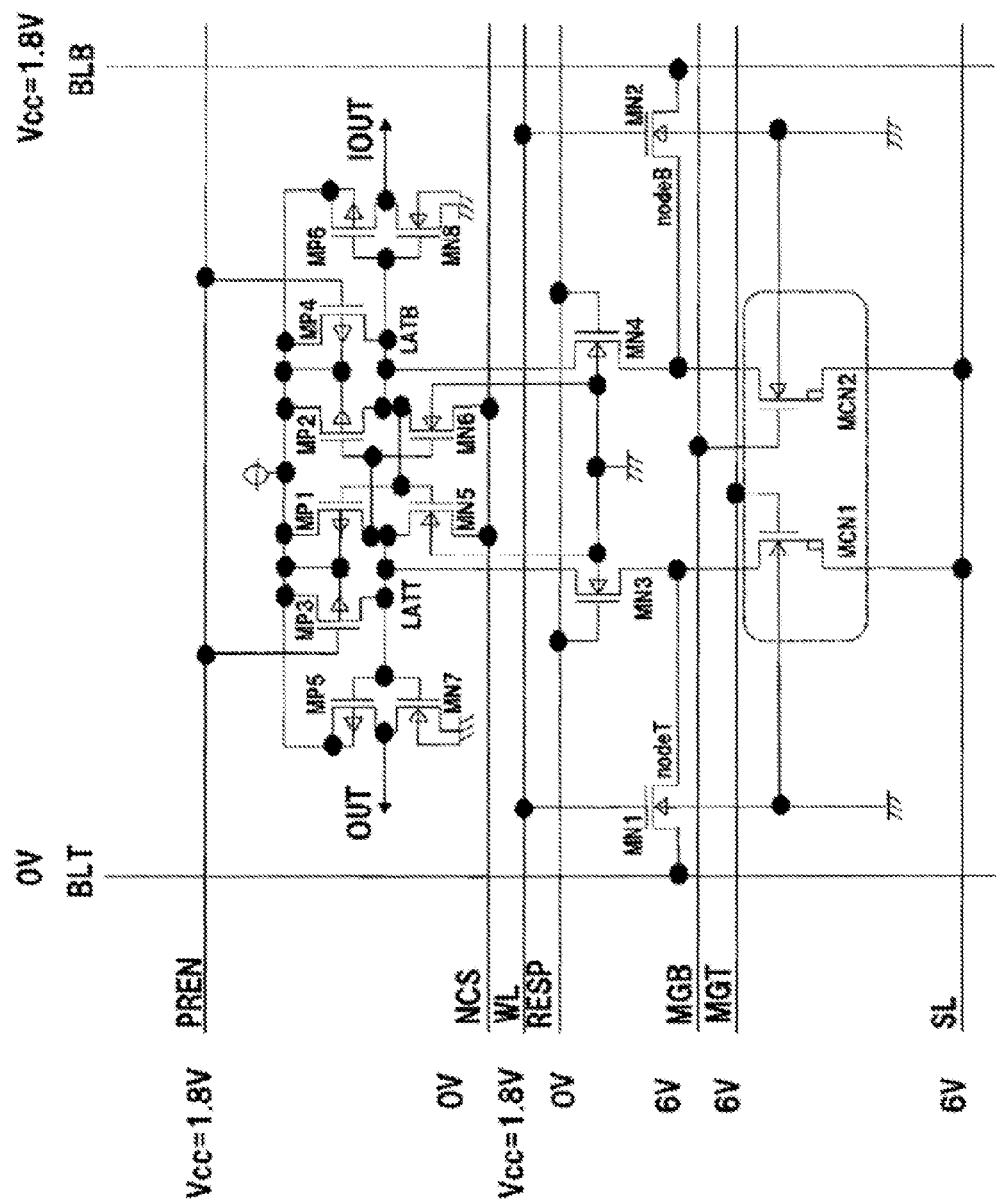
FIG. 69 shows a diagram of the voltage application conditions when programming data to the memory cell unit of an eighth embodiment.

FIG. 69 is a diagram which shows the application conditions of a programming voltage which is applied to a memory cell unit. In FIG. 69, the conditions in the case when data "0" is programmed, that is, when the threshold voltage of the memory transistor MCN1 is raised, are shown. The operations to the nonvolatile data memory (part) are the same as in the sixth embodiment. The flip flop (part) is electrically separated from the nonvolatile data memory (part) by switching the NMOS transistors MN3 and MN4 OFF by setting the gate potential RESP to 0V.

When "0" is programmed, the word line WL is set to Vcc, the TRUE side bit line BLT is set to 0V and the BAR side BLB is set to Vcc under the conditions that the source voltage SL and the gate voltages MGT and MGB are set to 6V. In this way, the node T becomes 1V for example, by switching ON the TRUE side transfer gate MN1 and a 300 μA current for example, flows to the memory transistor MCN1. Due to this current, channel hot electrons occur in the source SL side of the memory transistor MCN1 and the threshold voltage of the memory transistor MCN1 increases (programmed) due to an injection of electrons into the SL side side spacer (part).

Because the transfer gate MN2 is switched OFF node B increases to 5V (6V−Vthn:Vthn=threshold voltage of MCN2) by charging from the source line SL side. However, because there is no current pass in the memory transistor MCN2, channel hot electron injection does not occur and the threshold voltage of the memory transistor MCN2 which is not to be programmed does not change.

In addition, the voltage application conditions in the case where data "1" is programmed, that is, the voltage application conditions for increasing the threshold voltage of the memory transistor MCN2 is that the voltage of the TRUE side bit line BLT is exchanged for the voltage of the BAR side bit line BLB and BLT is set at Vcc and BLB is set at 0V. Other conditions remain the same as when programming data "0".

Furthermore, in the present embodiment, 6V is applied to both the gate MGT and the drain SL of the memory transistor MCN1, however, the voltage which is applied to the gate MGT and drain SL of the memory transistor MCN1 is not limited to 6V. The gate MGT and the drain SL may each be applied with different voltages.

Figure 70:
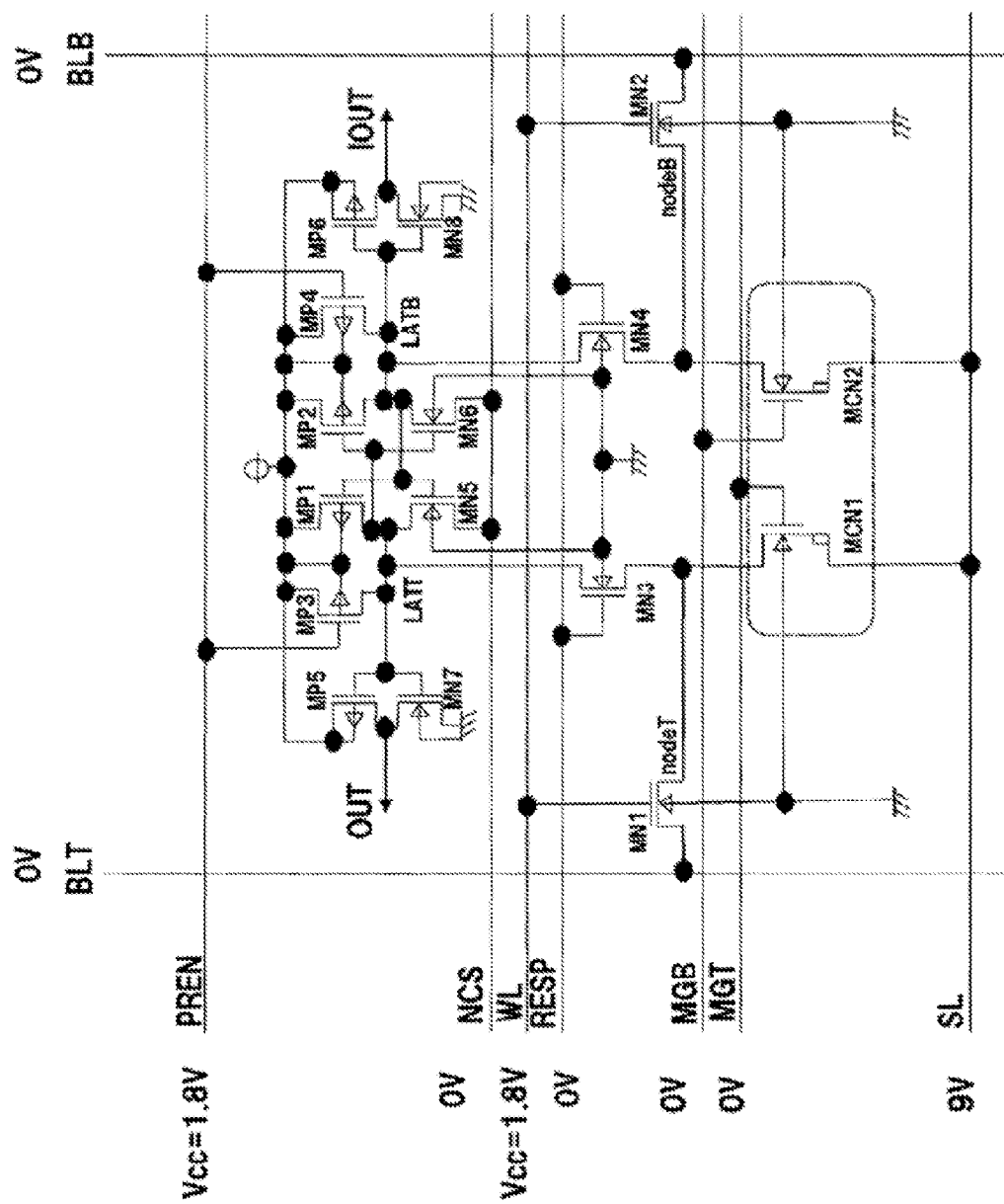
FIG. 70 shows a diagram of the voltage application conditions when erasing data from the memory cell unit of an eighth embodiment.

FIG. 70 is a diagram which shows the application conditions of an erase voltage which is applied to a memory cell unit. The operations to the nonvolatile data memory (part) are almost the same as those shown in FIG. 60 in the sixth embodiment. The flip flop (part) is electrically separated from the memory transistor (part) by switching OFF the NMOS transistors MN3 and MN4 by setting the gate voltage RESP to 0V.

An erasure operation is performed (simultaneously) on all the memory cells (block). The word line WL is set to Vcc and the bit lines BLT and BLB are set to 0V under the conditions that the source line SL is set to 9V and the gate voltages MGT and MGB of the memory transistors MCN1 and MCN2 are set to 0V. By switching ON the transfer gates MN1 and MN2 by this voltage arrangement, the node T and node B become 0V and avalanche hot holes HH are injected to the source-side side-spacer from the source side (source line SL) within the memory transistors MCN1 and MCN2. A negative charge (electrons) which is trapped by the programming operation in FIG. 69, is neutralized by this positive charge and the threshold voltage of the memory transistors MCN1 and MCN2 is restored to a pre-programming state.

Figure 71:
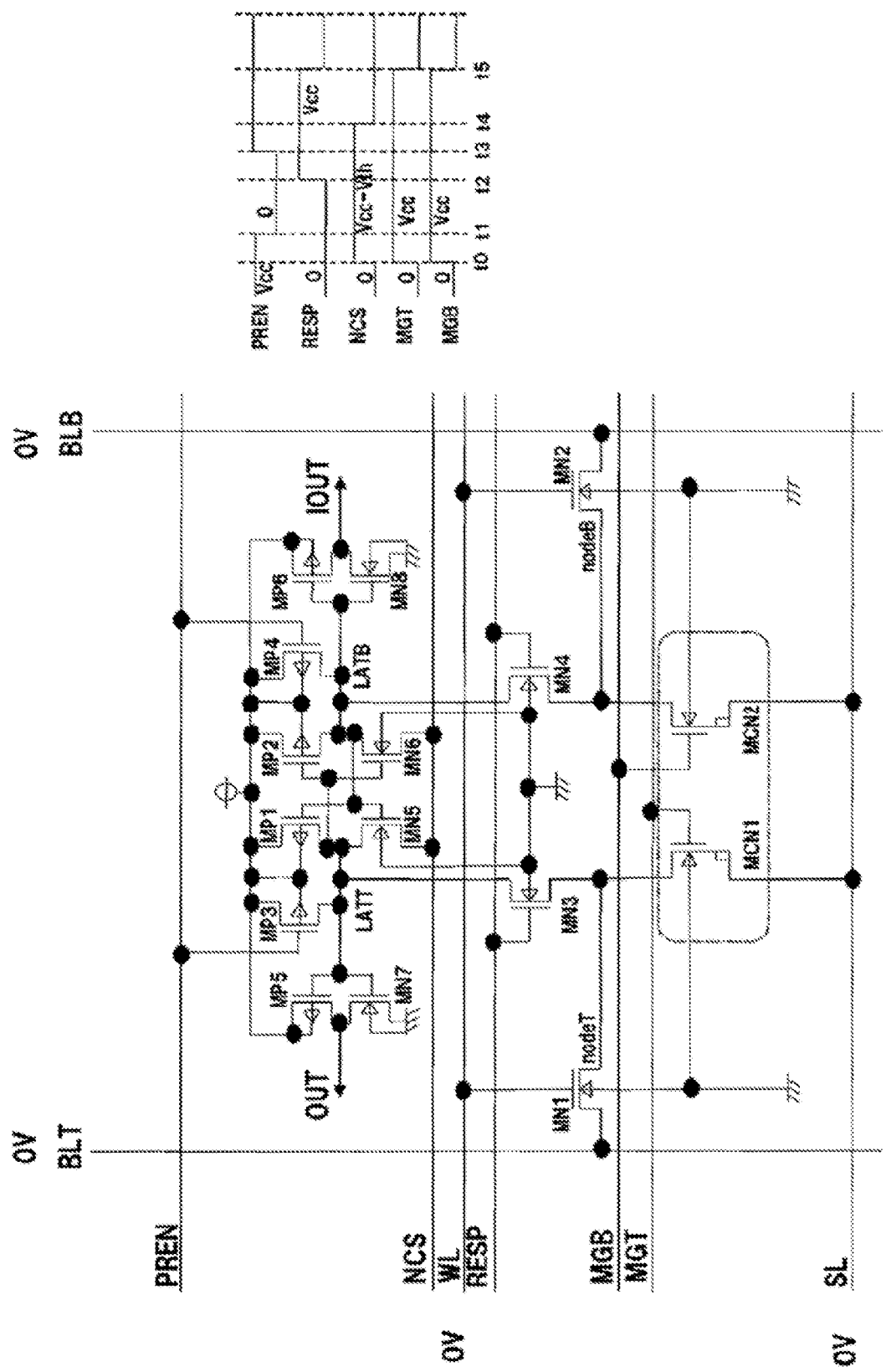
FIG. 71 shows a diagram of the voltage application conditions when transferring data of a nonvolatile data memory (part) to a flip flop (part) in the memory cell unit of an eighth embodiment.

FIG. 71 shows the operation voltage conditions in the case where data of the nonvolatile data memory (part) is transferred to the flip flop (part) in the memory cell unit. The voltage application conditions shown in FIG. 71 presuppose that data in a memory cell unit to be read is not indefinite, that is, both the threshold voltages of the memory transistors MCN1 and MCN2 of the nonvolatile data memory (part) are not Vth0. Transfer of data to the flip flop (part) is performed by the following procedure under the conditions that the source voltage SL of the memory transistors MCN1 and MCN2 is set to 0V. At the time t0 the gate voltages MGT and MGB of the memory transistors MCN1 and MCN2 increase to Vcc from 0V, the NMOS side source voltage NCS of the flip flop (part) increases to Vcc−Vth from 0V and a sensor operation is prepared. At the time t1 the PMOS transistors MP3 and MP4 for pre-charging are switched ON by setting the PREN signal to 0V and LATT and LATB are pre-charged to Vcc. Then at the time t2 the NMOS transistors MN3 and MN4 are switched ON by setting the RESP signal to Vcc and the node T and the node B which are drain side potentials of the memory transistors MCN1 and MCN2 are charged to Vcc−Vth. At the time t3 the pre-charge operation is completed by restoring the PREN signal to Vcc and the potential difference corresponding to the current differential of the memory transistors MCN1 and MCN2 appears in LATT and LATB. After waiting a certain sensor time period, the state of the flip flop (part) is determined by restoring the NCS potential to 0V at t4, and the operation is completed by restoring the RESP signal and the gate voltages MGT and MGB of the memory transistors MCN1 and MCN2 to 0V at t5. After the operations are complete the gate voltages MGT and MGB of the memory transistors MCN1 and MCN2 are 0V and it is possible to relieve electrical filed stress upon the memory transistors.

In the previously stated control method, it is presupposed that data in a memory cell unit which is to be read is not indefinite, that is, both the threshold voltages of he memory transistor MCN1 and MCN2 in a nonvolatile data memory (part) are not Vth0. However, in actual usage it is possible that data which is not indefinite must be read from an unknown memory cell unit.

Figure 72:
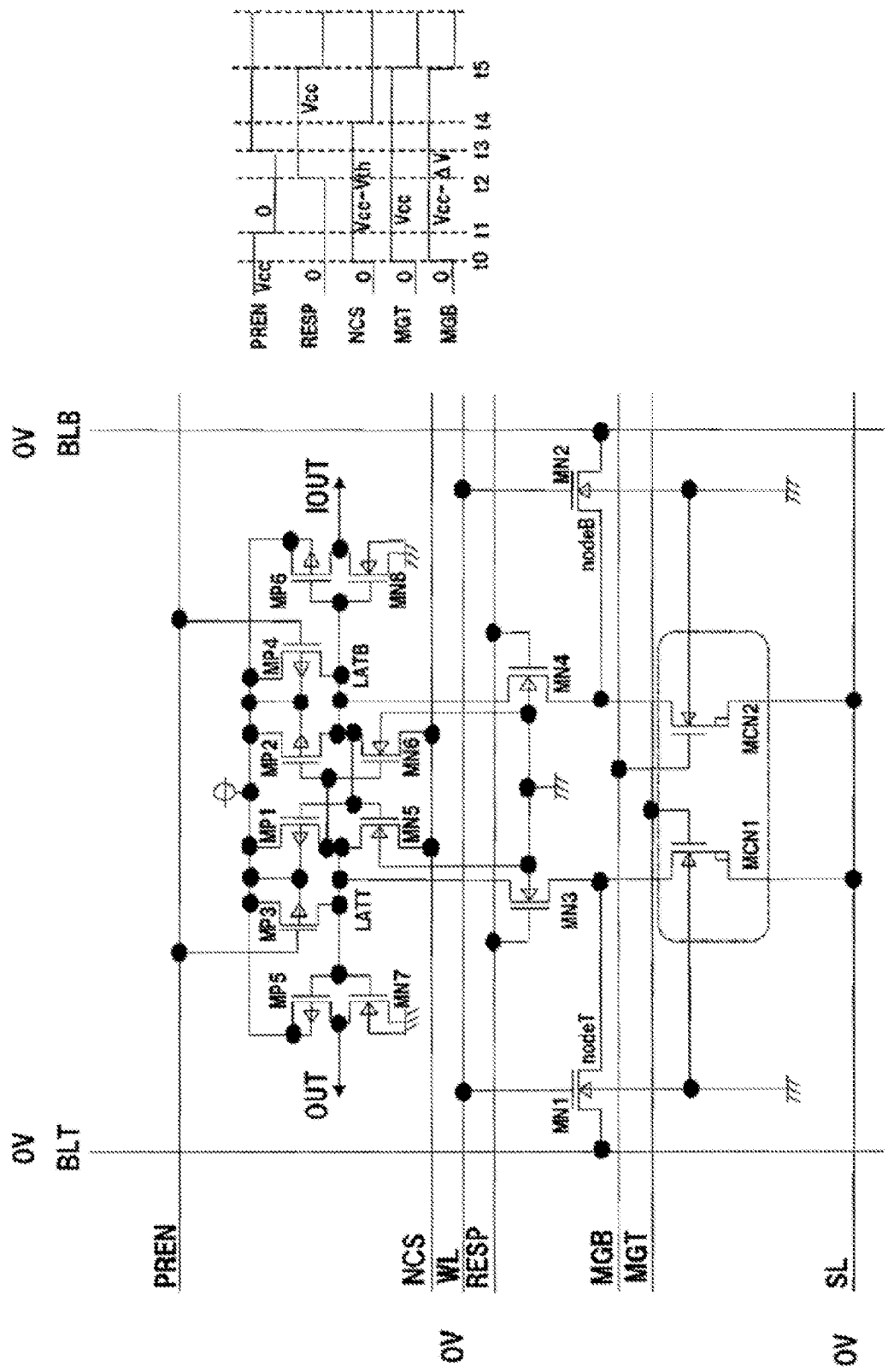
FIG. 72 shows a diagram of the voltage application conditions when transferring data of a nonvolatile data memory (part) to a flip flop (part) in the memory cell unit of an eighth embodiment.

FIG. 72 is a diagram which shows the voltage application conditions when a sense amplifier is made to recognize indefinite data as data "1" even in the case where a memory cell unit with this indefinite data is included and where data is determined as data which is already programmed in a non-volatile data memory (part). The different points between these conditions and the voltage application conditions shown in FIG. 71 are as follows. The gate voltage MGT of the memory transistor MCN1 is set to Vcc and the gate voltage MGB of the memory transistor MCN2 is set to Vcc−ΔV (for example, ΔV=0.2V) and the gate voltage of the memory transistor MCN1 is set higher than the gate voltage of the memory transistor MCN2 by ΔV. In this way, it becomes easier to switch ON the memory transistor MCN1 than the memory transistor MCN2 and in the case where indefinite data such as when the threshold voltages of both the memory transistors MCN1 and MCN2 are Vth0, it is possible to forcibly set data which is set in the flip flop (part) to "1". However, in the case where data is already programmed, data is determined based on the threshold voltage differential between the memory transistors MCN1 and MCN2. This operation is the same as that explained in FIG. 71.

Here, the case where the threshold voltage of both memory transistors MCN1 and MCN2 is Vth0, indicates that reprogramming to the memory transistors MCN1 and MCN2 has not been performed and is possible that there is also no deterioration in the memory transistors together with reprogramming. As a result, it is sufficient to decide upon the size of ΔV by only considering the variance in the initial threshold voltage of a transistor, for example, about 0.2V is considered sufficient.

Here, in the case where data is indefinite, the case was explained that the data which is read is forcibly determined as "1", however, by reversing the potential difference between MGT and MGB it is possible to determine the data as "0".

Figure 73:
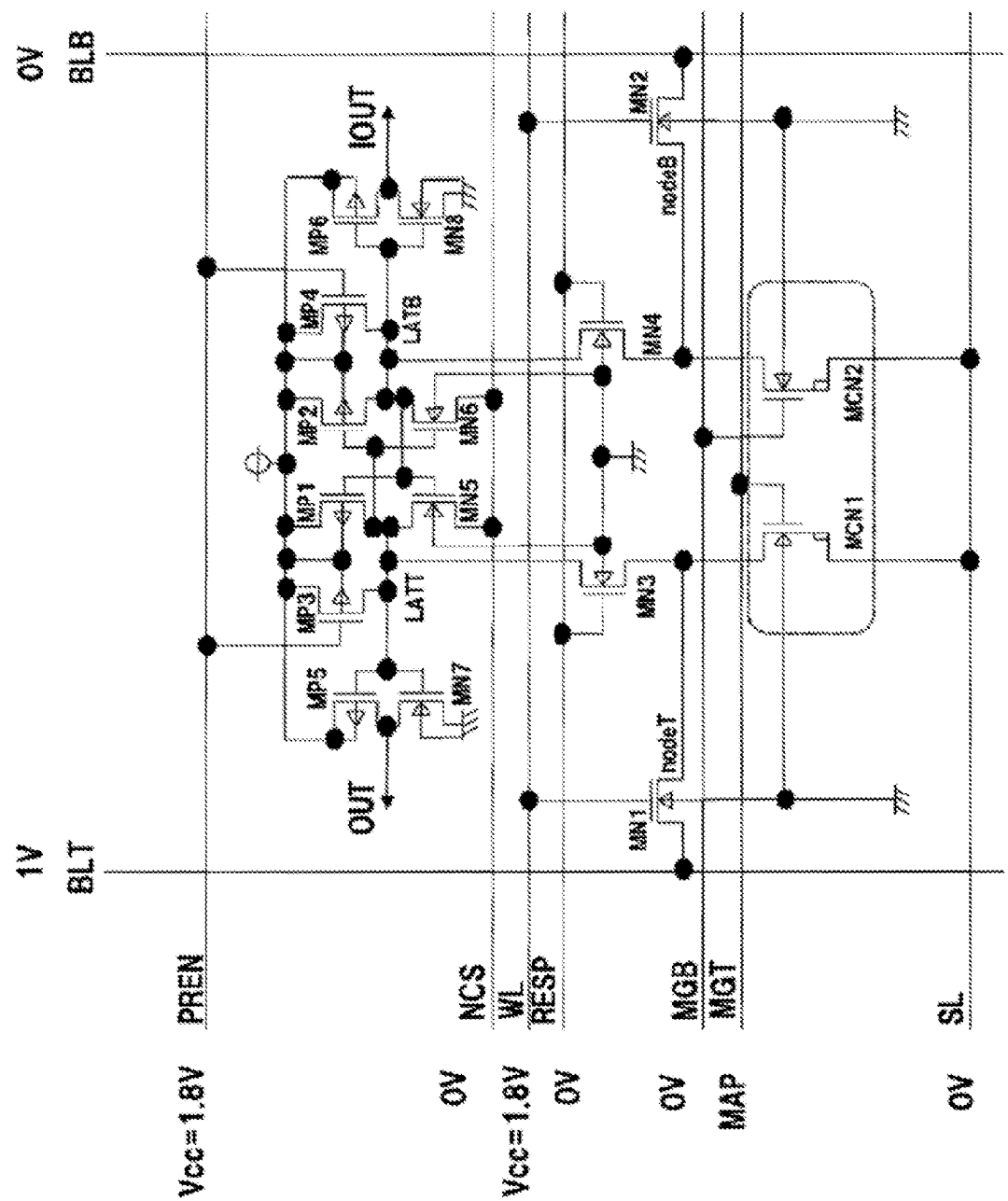
FIG. 73 shows a diagram which explains a threshold voltage detection method of a memory transistor of the memory unit of an eighth embodiment.

FIG. 73 is a diagram which explains a method for detecting a threshold voltage of the memory transistor MCN1. The application conditions of a voltage applied to a nonvolatile data memory (part) are the same as the voltage application conditions shown in FIG. 65 in the sixth embodiment. The flip flop (part) is electrically separated from the nonvolatile data memory (part) by switching OFF the NMOS transistors MN3 and MN4 by setting the gate voltage RESP to 0V.

By detecting a threshold voltage of a memory transistor using this method, it becomes possible to evaluate an initial state threshold voltage variance, the threshold voltage change amount in programming an erasure operations and high temperature retention characteristics etc.

A source voltage SL of the memory transistor MCN1 is set to 0V and 1V is supplied to the drain (node T). 1V is supplied to the drain from a bit line BLT via the transfer gate MN1. Under these conditions, a MAP voltage (variable) is applied to the gate of a memory transistor. By making the MAP voltage variable it becomes possible to determine the threshold voltage (required gate voltage for flowing a certain fixed current) of the memory transistor MCN1.

When a threshold voltage of the memory transistor MCN1 side is measured, the gate voltage MGB of the memory transistor MCN2 is set to 0V and the memory transistor MCN2 is switched OFF. Because the voltage between the source and drain of the memory transistor MCN2 is 0V, even if the transistor is switched ON, current does not flow. However, the memory transistor MCN2 is switched OFF so that the source voltage SL is not raised by a current leak for example. Even if the gate voltage MGB of the memory transistor MCN2 is set to the same MAP voltage as the gate voltage MGT of the memory transistor MCN1 a problem does not arise as far as operation is concerned.

FIG. 73 shows the voltage application conditions in the case where a threshold voltage of the memory transistor MCN1 is measured. However, in the case where a threshold voltage of the memory transistor MCN2 is measured, it is sufficient to reverse the control of the bit lines BLT, BLB and control of the gate voltage MGT and MGB.

Ninth Embodiment

Figure 74:
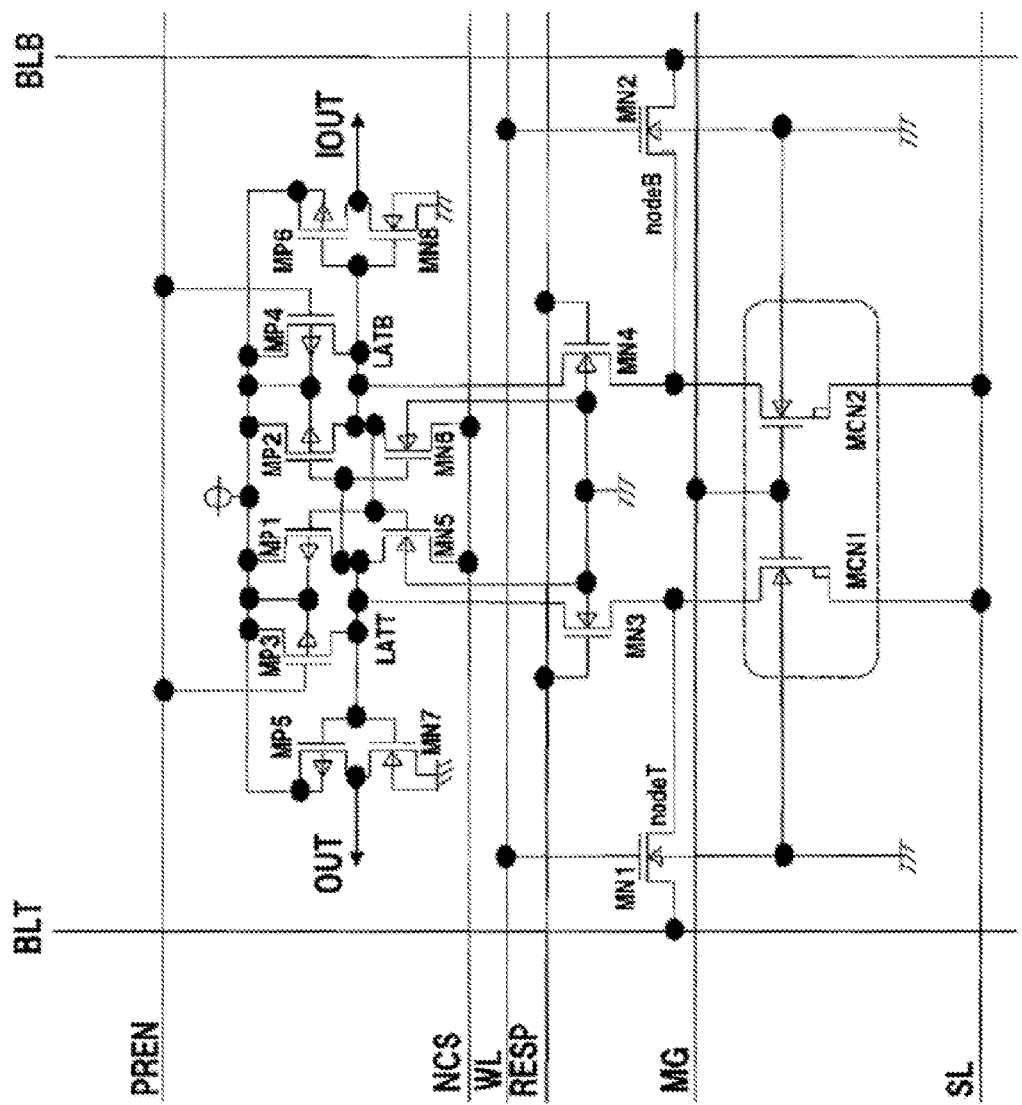
FIG. 74 shows a diagram of the construction of a memory cell unit of a ninth embodiment of the present invention.

FIG. 74 is a diagram which shows a ninth embodiment of a memory cell unit. The point where FIG. 74 is different from the third embodiment shown in FIG. 67 is that the gate voltage MG of the memory transistors MCN1 and MCN2 is shared. In this structure, because the gate voltages MGT and MGB of the memory transistors MCN1 and MCN2 as shown in FIG. 72 can not be controlled separately, data in the case where the data is indefinite as in when the threshold voltage of the memory transistors MCN1 and MCN2 are both Vth0, can not be determined as "1" or "0". However, in the case where this memory cell with this type of indefinite data is included, it is useful because the structure is simplified.

The memory cell shown in FIG. 74 is connected in the shape of an array as shown in FIG. 68 and a memory device is formed. Programming, erasing and reading operations of this memory cell are the same as the operations shown in FIG. 69, FIG. 70 and FIG. 71 of the eight embodiment. Also, when detecting a threshold voltage, because the gate voltages of the memory transistors MCN1 and MCN2 as shown in FIG. 73 can not be controlled separately, the gate voltage of the transistor which is not to be measured is also controlled by a MAP voltage and the potential difference between the source and drain of the memory transistor which is not to be measured is 0V and because a leak current does not flow, a problem does not occur as far as operation is concerned.

The structure in this embodiment has the following merit. Because gate voltage control of the memory transistors MCN1 and MCN2 as stated above is shared the number of drivers for controlling the gate of a memory transistor can be reduced by half compared to the first embodiment.

Tenth Embodiment

Figure 75:
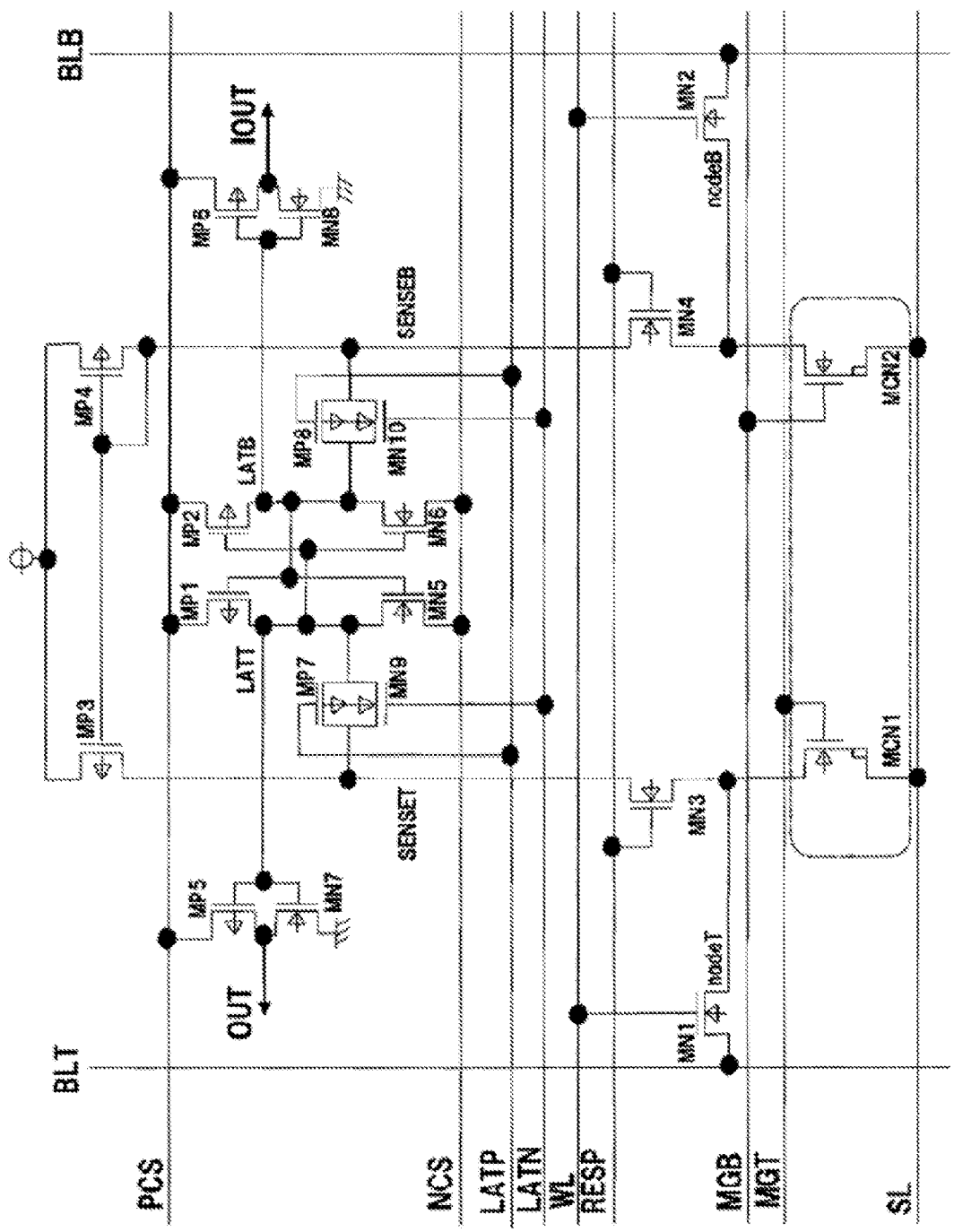
FIG. 75 shows a diagram of the construction of a memory cell unit of a tenth embodiment of the present invention.

FIG. 75 is a diagram which shows a tenth embodiment of a memory cell unit. The same as the third embodiment shown in FIG. 67 the case is assumed where a fuse output is used, an inverter for inverting a flip flop and each flip flop output is arranged within each memory cell. The connection of the memory transistors MCN1 and MCN2 and the transfer gates MN1 and MN2 is the same as the sixth embodiment shown in FIG. 57.

The flip flop (part) is formed by PMOS transistors MP1 and MP2 in which an N well potential is set to Vcc and a source potential is set to PCS, and NMOS transistors MN5 and MN6 in which a P well potential is set to GND and a source potential is set to NCS. The PMOS transistor MP1 and the NMOS transistor MN5 form a TRUE side inverter and the PMOS transistor MP2 and the NMOS transistor MN6 form a BAR side inverter.

The flip flop TRUE side input/output (part) LATT is connected to SENSET via a PMOS transistor MP7 and an NMOS transistor MN9. The flip flop BAR side input/output (part) LATB is connected to SENSEB via a PMOS transistor MP8 and an NMOS transistor MN10. The gate potential of the PMOS transistors MP7 and MP8 is controlled by LATP and the gate potential of the NMOS transistors MN9 and MN10 is controlled by a control signal LATN. SENSET and SENSEB are drain potentials of the PMOS transistors MP3 and MP4 which are each connected in the form of a current mirror and SENSET is connected to node T via the NMOS transistor MN3 and SENSEB is connected to node B via the NMOS transistor MN4. The gate potential of the NMOS transistors MN3 and MN4 are controlled by RESP.

The flip flop TRUE side output LATT becomes the input of an inverter formed by a PMOS transistor MP5 and an NMOS transistor MN7 and is output as OUT of an inverter output. The flip flop BAR side output LATB becomes the input of an inverter formed by a PMOS transistor MP6 and an NMOS transistor MN8 and is output as IOUT of an inverter output. In the case of a fuse, either OUT or IOUT is used, however when data is transferred to the flip flop in order to secure parasitic capacitance balance between LATT and LATB and operational stability, an inverter is arranged on/in both side (True side and Bar side).

The operations of the memory unit in the present embodiment which are different to the operation of the memory unit in the eight embodiment are as follows. Only the transfer method of data to the flip flop (part) from the nonvolatile data memory (part) is different whereas because RESP is set to 0V and the flip flop (part) is electrically separated, programming and erasure operations are exactly the same. When data is transferred to the flip flop (part), the voltage differential corresponding to a current difference between the memory elements MCN1 and MCN2 output at/to SENSET and SENSEB stably and this voltage is transferred to the flip flop (part).

Furthermore, the plurality of memory cells shown in FIG. 75 are connected in the shape of an array as in FIG. 68 and form a memory device.

Figure 76:
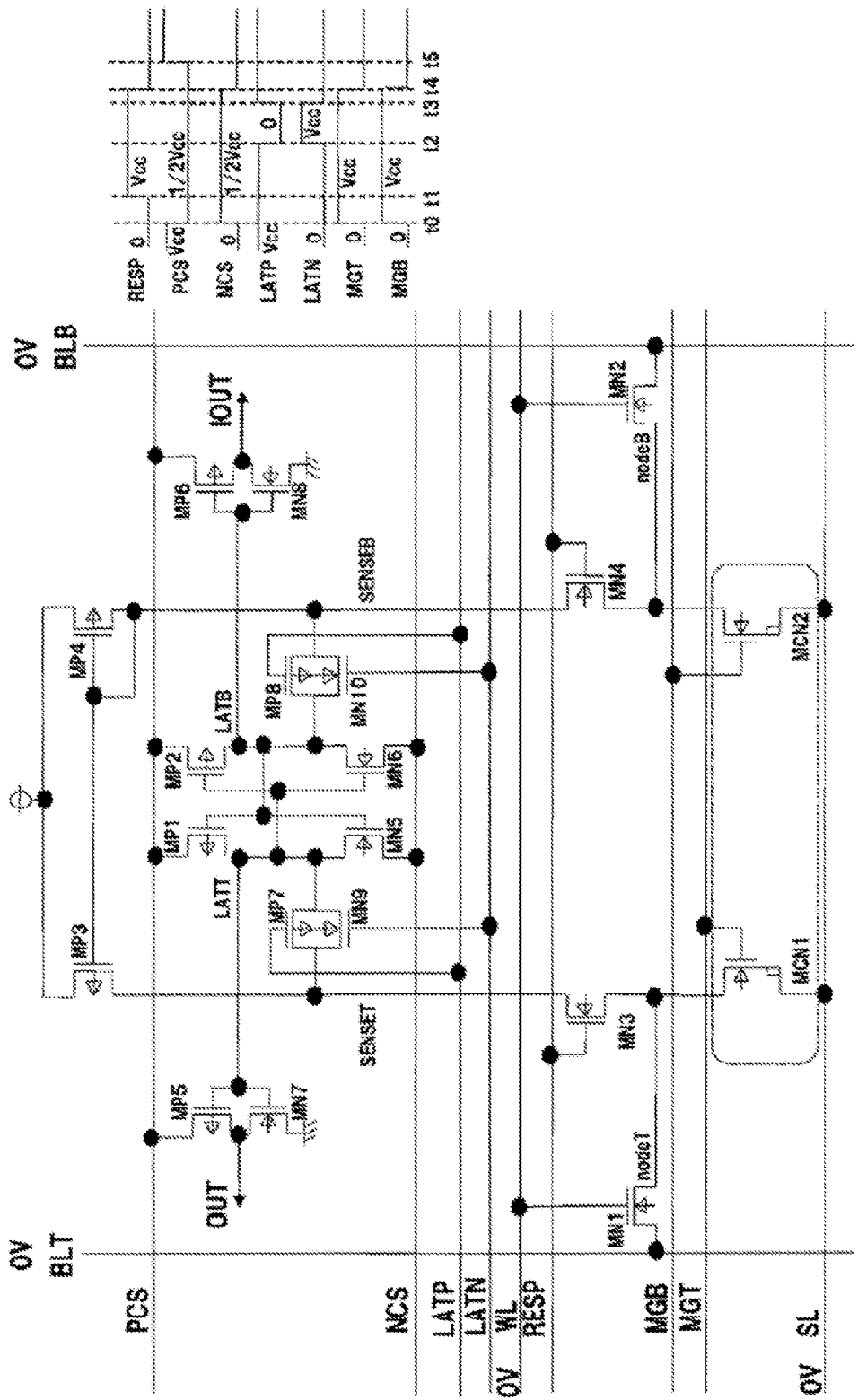
FIG. 76 shows a diagram of the voltage application conditions when transferring data of a nonvolatile data memory (part) to a flip flop (part) in the memory cell unit of a tenth embodiment.

FIG. 76 shows the operation voltage conditions in the case where data of the nonvolatile data memory (part) is trans-ferred to the flip flop (part) in the memory cell unit. The voltage application conditions shown in FIG. 76 presuppose that data in a memory cell unit to be read is not indefinite, that is, both the threshold voltages of the memory transistors MCN1 and MCN2 of the nonvolatile data memory (part) are not Vth0. Transfer of data to the flip flop (part) is performed by the following procedure under the conditions that the source voltage SL of the memory transistors MCN1 and MCN2 is set to 0V. At the time t0 the gate voltages MGT and MGB of the memory transistors MCN1 and MCN2 increase to Vcc from 0V, the PMOS side source voltage PCS decreases to half of Vcc from Vcc and the NMOS side source voltage NCS of the flip flop (part) increases to half of Vcc from 0V and a sensor operation is prepared. At the time t1 the RESP signal is set to Vcc and by switching ON the NMOS transistors MN3 and MN4, SENSET and SENSEB which are the drain side potentials of the memory transistors MCN1 and MCN2, becomes potentials which correspond to the currents of the memory transistors MCN1 and MCN2 which flow via the current mirror connected PMOS transistors MP3 and MP4. SENSEB is decided by only the memory transistor MCN2 side current value and SENSET is decided by the current differential between the memory transistors MCN1 and MCN2. For example, when the memory transistor MCN1 side current is larger than the memory transistor MCN2 side current, SENSET<SENSEB and in the reverse case SENSET>SENSEB. At the time t2 where the potential difference of SENSET and SENSEB is secured, the potentials of SENSET and SENSEB are transferred to LATT and LATB which are the inputs of the flip flop (part) by setting LATP to 0V from Vcc and LATN to Vcc from 0V. At the time t3, LATP is restored to Vcc and LATN is restored 0V and by setting NSC to 0V at the time t4 and PCS to Vcc at the time t5, the data of the flip flop (part) is determined.

Furthermore, after the potential differential of SENSET and SENSEB is transferred to the flip flop (part), because there is not necessary to allow a current to flow to the memory transistors MCN1 and MCN2 side, RESP and the gate voltages MGT and MGB of the memory transistors are restored to 0V and it becomes possible to relieve the electrical filed stress upon the memory transistors.

In the eighth embodiment, the transient state of the process wherein either of LATT and LATN which are inputs of the flip flop (part), continue to decrease due to the current of the memory transistors MCN1 and MCN2, is sensed in the flip flop (part). In the present embodiment however, by generating a sufficient potential difference in the current mirror (part) for SENSET and SENSEB and transferring this stable potential to LATT and LATB it is possible to improve a sensor margin.

In the previously stated control method, it is presupposed that data in a memory cell unit which is to be read is not indefinite, that is, both the threshold voltages of he memory transistor MCN1 and MCN2 in a nonvolatile data memory (part) are not Vth0. However, in actual usage it is possible that data which is not indefinite must be read from an unknown memory cell unit.

Figure 77:
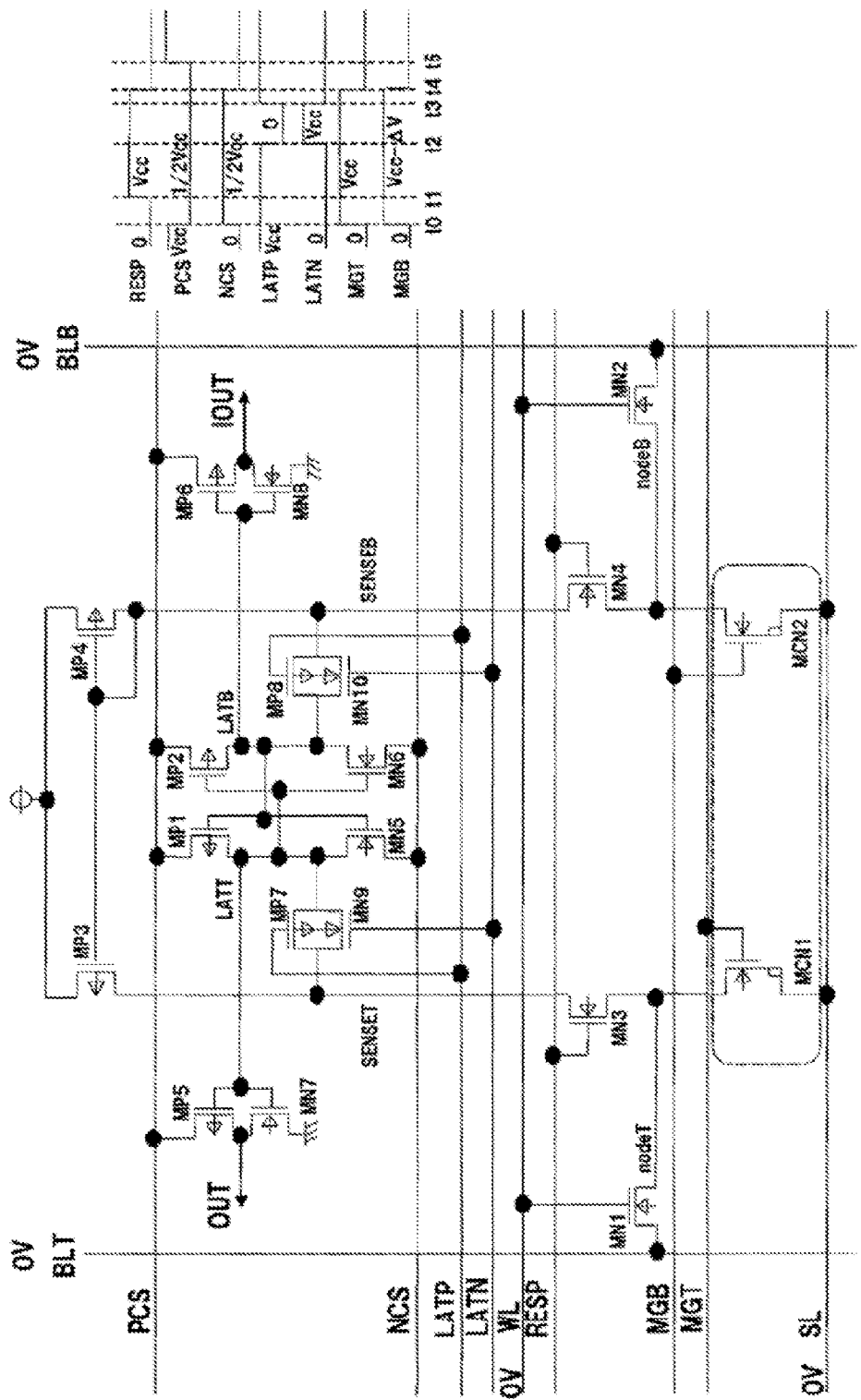
FIG. 77 shows a diagram of the voltage application conditions when transferring data of a nonvolatile data memory (part) to a flip flop (part) in the memory cell unit of a tenth embodiment.

FIG. 77 is a diagram which shows the voltage application conditions when a sense amplifier is made to recognize indefinite data as data "1" even in the case where a memory cell unit with this indefinite data is included and where data is determined as data which is already programmed in a nonvolatile data memory (part). The different points between these conditions and the voltage application conditions shown in FIG. 76 are as follows. The gate voltage MGT of the memory transistor MCN1 is set to Vcc and the gate voltage MGB of the memory transistor MCN2 is set to Vcc−ΔV (for example, ΔV=0.2V) and the gate voltage of the memory transistor MCN1 is set higher than the gate voltage of the memory transistor MCN2 by ΔV. In this way, it becomes easier to switch ON the memory transistor MCN1 than the memory transistor MCN2 and in the case where indefinite data such as when the threshold voltages of both the memory transistors MCN1 and MCN2 are Vth0, it is possible to forcibly set data which is set in the flip flop (part) to "1". However, in the case where data is already programmed, data is determined based on the threshold voltage differential between the memory transistors MCN1 and MCN2.

Here, the case where the threshold voltage of both memory transistors MCN1 and MCN2 is Vth0, indicates that reprogramming to the memory transistors MCN1 and MCN2 has not been performed and is possible that there is also no deterioration in the memory transistors together with reprogramming. As a result, it is sufficient to decide upon the size of ΔV by only considering the variance in the initial threshold voltage of a transistor, for example, about 0.2V is considered sufficient.

Here, in the case where data is indefinite, the case was explained that the data which is forcibly set in the flip flop (part) was determined as "1", however, by reversing the potential difference between MGT and MGB it is possible to determine the data as "0".

Eleventh Embodiment

Figure 78:
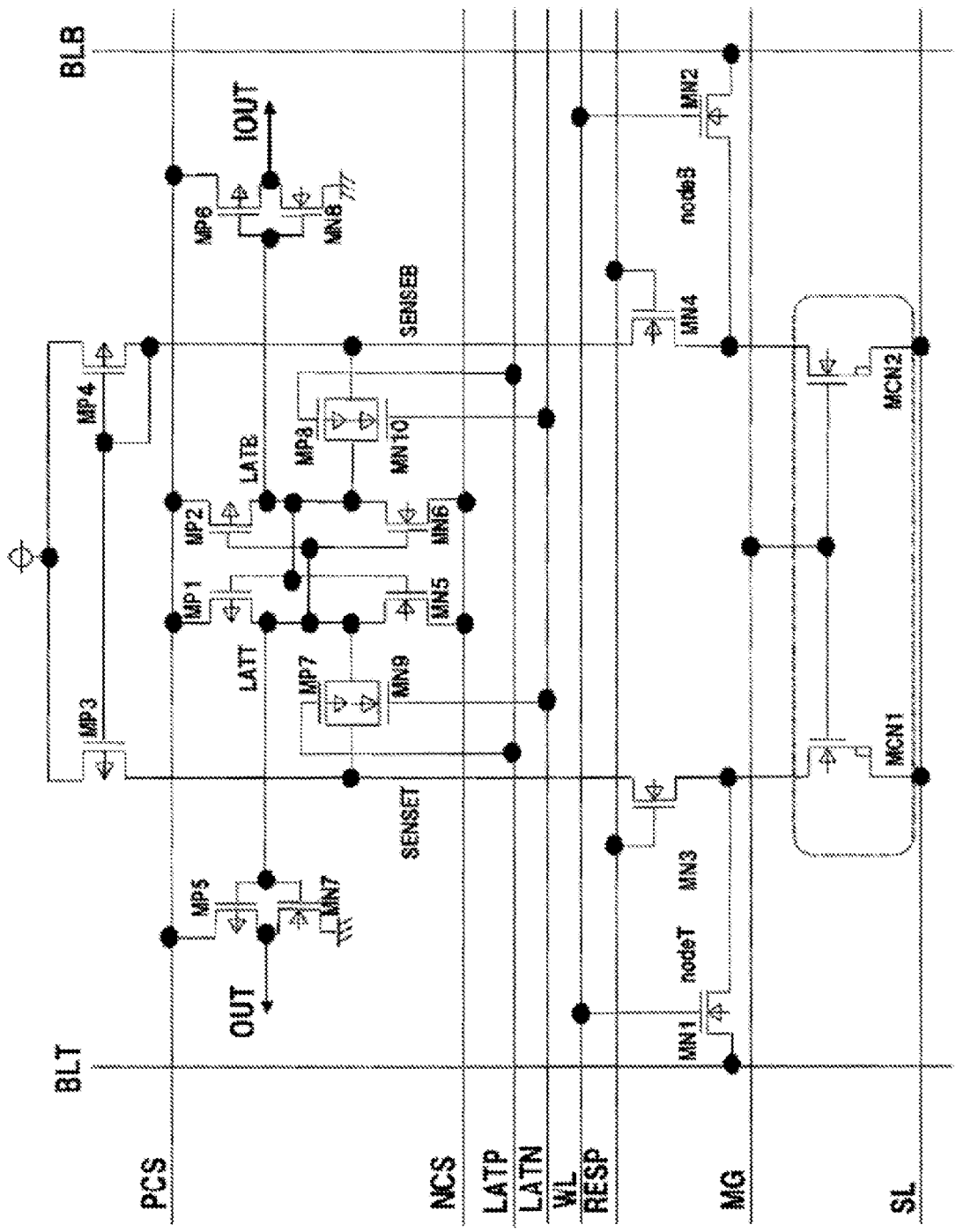
FIG. 78 shows a diagram of the construction of a memory cell unit of an eleventh embodiment of the present invention.

FIG. 78 is a diagram which shows an eleventh embodiment of a memory cell unit. The point where FIG. 78 is different from the tenth embodiment shown in FIG. 75 is that the gate voltage MG of the memory transistors MCN1 and MCN2 is shared. In this structure, because the gate voltages MGT and MGB of the memory transistors MCN1 and MCN2 as shown in FIG. 77 can not be controlled separately, data in the case where the data is indefinite as in when the threshold voltage of the memory transistors MCN1 and MCN2 are both Vth0, can not be determined as "1" or "0". However, in the case where this memory cell with this type of indefinite data is included, it is useful because the structure is simplified. Furthermore, the plurality of memory cells shown in FIG. 78 are connected in the shape of an array as in FIG. 68 and form a memory device.

Twelfth Embodiment

Figure 79:
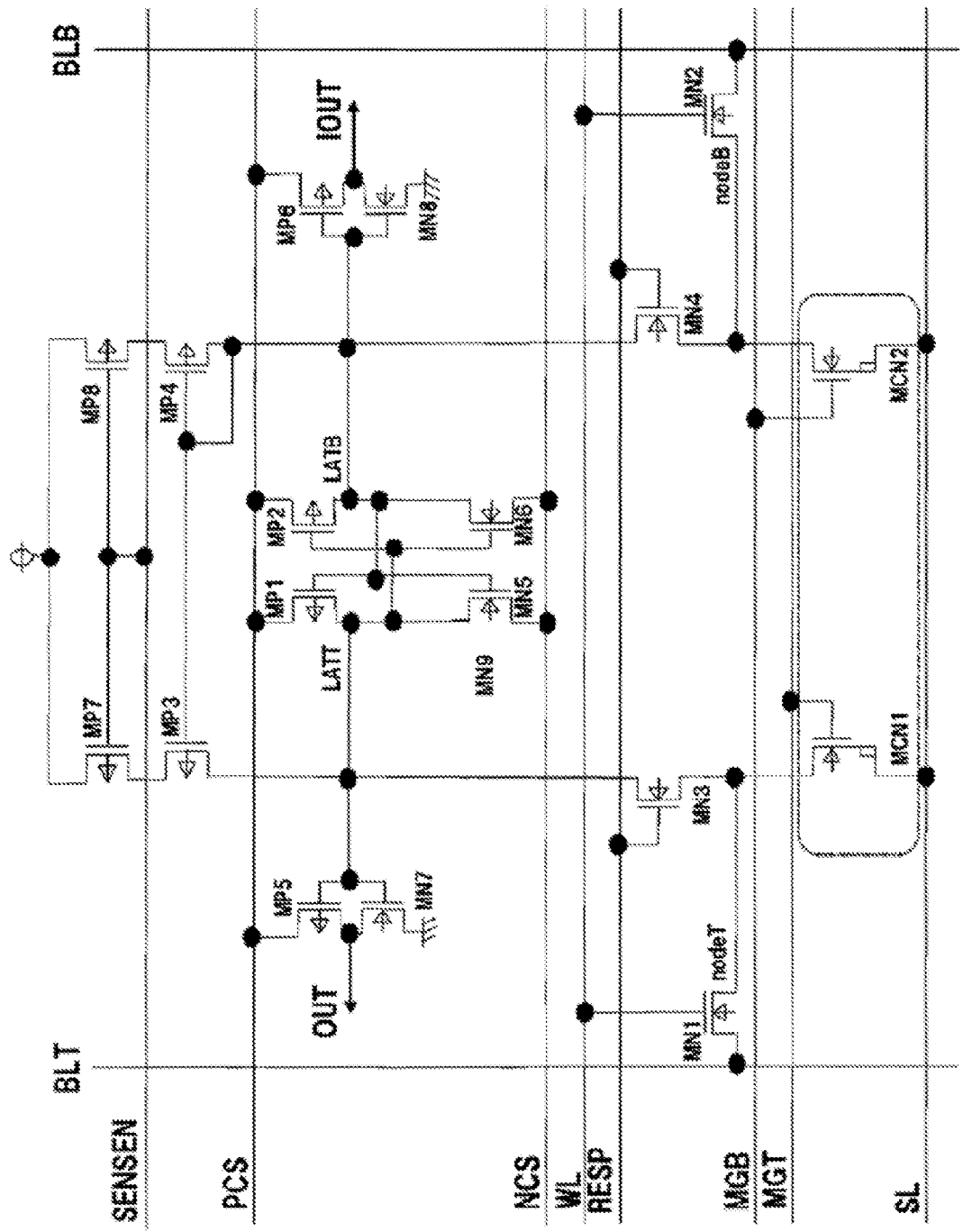
FIG. 79 shows a diagram of the construction of a memory cell unit of a twelfth embodiment of the present invention.

FIG. 79 is a diagram which shows a twelfth embodiment of a memory cell unit. The same as the eighth embodiment shown in FIG. 67 the case is assumed where a fuse output is used, an inverter for inverting a flip flop and each flip flop output is arranged within each memory cell unit. The connection of the memory transistors MCN1 and MCN2 and the transfer gates MN1 and MN2 is the same as the sixth embodiment shown in FIG. 57.

The flip flop (part) is formed by PMOS transistors MP1 and MP2 in which an N well potential is set to Vcc and a source potential is set to PCS, and NMOS transistors MN5 and MN6 in which a P well potential is set to GND and a source potential is set to NCS. The PMOS transistor MP1 and the NMOS transistor MN5 form a TRUE side inverter and the PMOS transistor MP2 and the NMOS transistor MN6 form a BAR side inverter.

The flip flop TRUE side input/output (part) LATT and the BAR side input/output (part) LATB become drain potentials of PMOS transistors MP3 and MP4 which are each connected in the form of a current mirror. The TRUE side input/output (part) LATT is connected to node T via the NMOS transistor MN3 and the BAR side input/output (part) LATB is connected to node B via the NMOS transistor MN4. The gate potentials of the NMOS transistors MN3 and MN4 are controlled by RESP. In the source side of the PMOS transistors MP3 and MP4 a PMOS transistor MP7 is arranged between the power supply and the PMOS transistor MP3, a PMOS transistor MP8 is arranged between the power supply and the PMOS transistor MP4 and the gate voltages of PMOS transistors MP7 and MP8 are controlled by SENSEN.

The flip flop TRUE side output LATT becomes the input of an inverter formed by a PMOS transistor MP5 and an NMOS transistor MN7 and is output as OUT of an inverter output. The flip flop BAR side output LATB becomes the input of an inverter formed by a PMOS transistor MP6 and an NMOS transistor MN8 and is output as IOUT of an inverter output. In the case of a fuse either OUT or IOUT is used, however when data is transferred to the flip flop in order to secure parasitic capacitance balance between LATT and LATB and operational stability, an inverter is arranged on/in both side (True side and Bar side).

The operations of the memory unit in the present embodiment which are different to the operation of the memory unit in the eight embodiment are as follows. Only the operation at the time of transfer of data to the flip flop (part) is different whereas because RESP is set to 0V and the flip flop (part) is electrically separated, programming and erasure operations are exactly the same. In addition, in the operations when data is transferred to the memory cell unit of the present embodiment, the points which are different to the operations in the tenth embodiment are as follows. A voltage difference corresponding to the current difference of the memory transistors MCN1 and MCN2 which flows via a current mirror circuit, is applied directly to the flip flop (part) input/outputs LATT and LATB. After this voltage difference output stably and the state of the flip flop (part) is determined, the current pass of the PMOS current mirror is cut off by the PMOS transistors MP7 and MP8.

Furthermore, the plurality of memory cells shown in FIG. 79 are connected in the shape of an array as in FIG. 68 and form a memory device.

Figure 80:
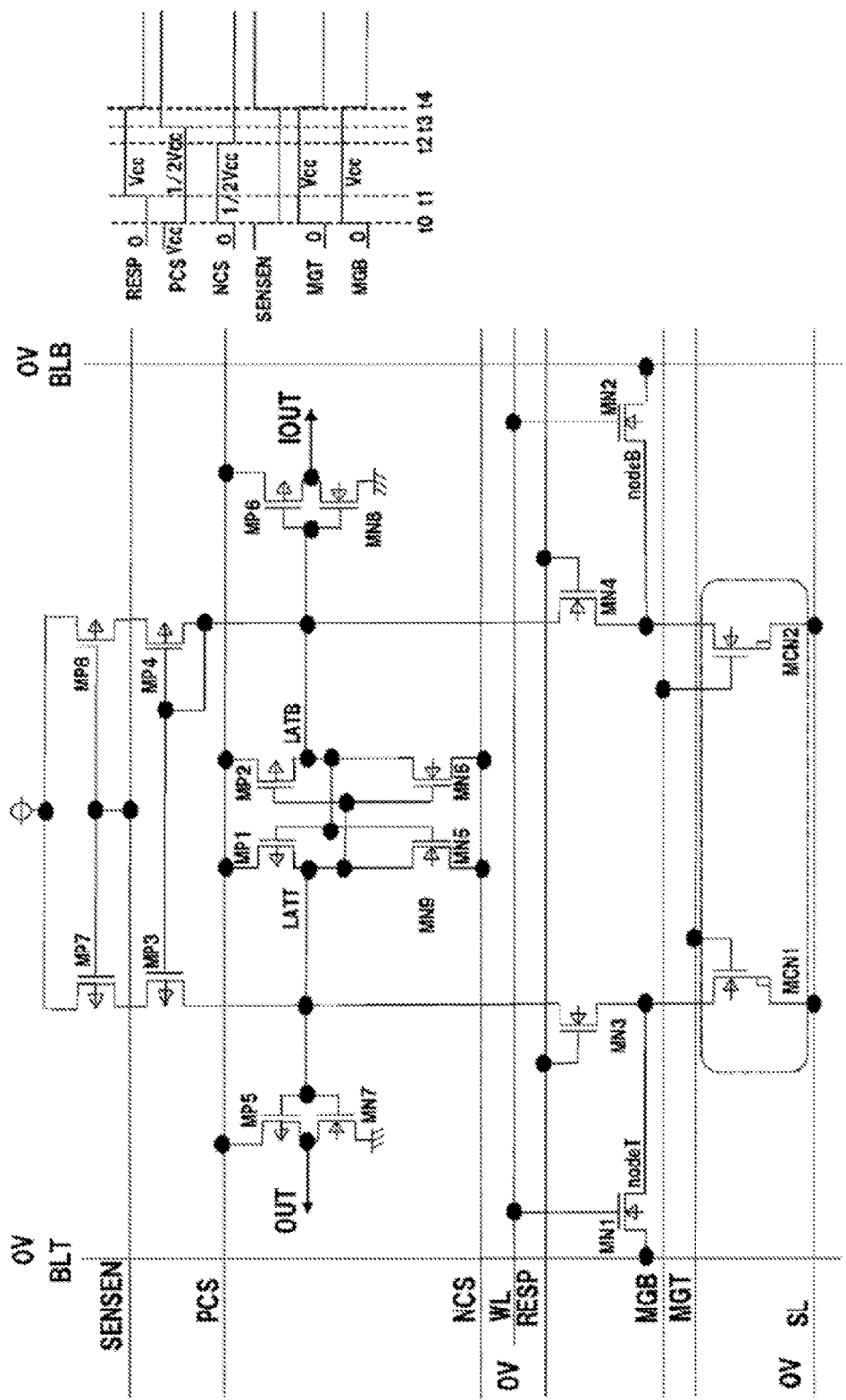
FIG. 80 shows a diagram of the voltage application conditions when transferring data of a nonvolatile data memory (part) to a flip flop (part) in the memory cell unit of a twelfth embodiment.

FIG. 80 shows the operation voltage conditions in the case where data of the nonvolatile data memory (part) is transferred to the flip flop (part). The voltage application conditions shown in FIG. 80 presuppose that data in a memory cell unit to be read is not indefinite, that is, both the threshold voltages of the memory transistors MCN1 and MCN2 of the nonvolatile data memory (part) are not Vth0. Transfer of data to the flip flop (part) is performed by the following procedure under the conditions that the source voltage SL of the memory transistors MCN1 and MCN2 is set to 0V. At the time t0 the gate voltages MGT and MGB of the memory transistors MCN1 and MCN2 increase to Vcc from 0V, the flip flop (part) PMOS side source voltage PCS decreases to half of Vcc from Vcc and the NMOS side source voltage NCS increases to half of Vcc from 0V, the PMOS current mirror (part) SENSEN signal is set at 0V from Vcc and a sensor operation is prepared. At the time t1 the RESP signal is set to Vcc and by switching ON the NMOS transistors MN3 and MN4, LATT and LATB which are drain side potentials of the memory transistors MCN1 and MCN2, become potentials which correspond to the current difference of each of the memory transistors MCN1 and MCN2 which flow via the current mirror connected PMOS transistors MP3 and MP4. LATB is decided by only the memory transistor MCN2 side current value and LATT is decided by the current differential between the memory transistors MCN1 and MCN2. For example, when the memory transistor MCN1 side current is larger than the memory transistor MCN2 side current, LATT<LATB and in the reverse case LATT>LATB. At the time t2 where the potential difference of LATT and LATB is secured, the data of the flip flop (part) is determined by setting PCS to Vcc at t3. After the data of the flip flop (part) is determined, in order to remove a throughput current between the flip flop (part) input/output and the PMOS current mirror (part) and the memory elements (part), at t4 RESP is restored to 0V, the SENSEN signal is restored to Vcc, and the gate potentials MGT and MGB of the memory transistors MCN1 and MCN2 are restored to 0V. In this way, it is possible to relieve the electrical field stress upon the memory transistors.

Similar to the tenth embodiment (FIG. 76), it is possible to improve a sensor margin by generating a sufficient potential difference in the PMOS current mirror. Also, compared to the tenth embodiment, it is possible to reduce the number of transistor elements by two and the number of control signals by one.

In the previously stated control method, it is presupposed that data in a memory cell unit which is to be read is not indefinite, that is, both the threshold voltages of he memory transistor MCN1 and MCN2 in a nonvolatile data memory (part) are not Vth0. However, in actual usage it is possible that data which is not indefinite must be read from an unknown memory cell unit.

Figure 81:
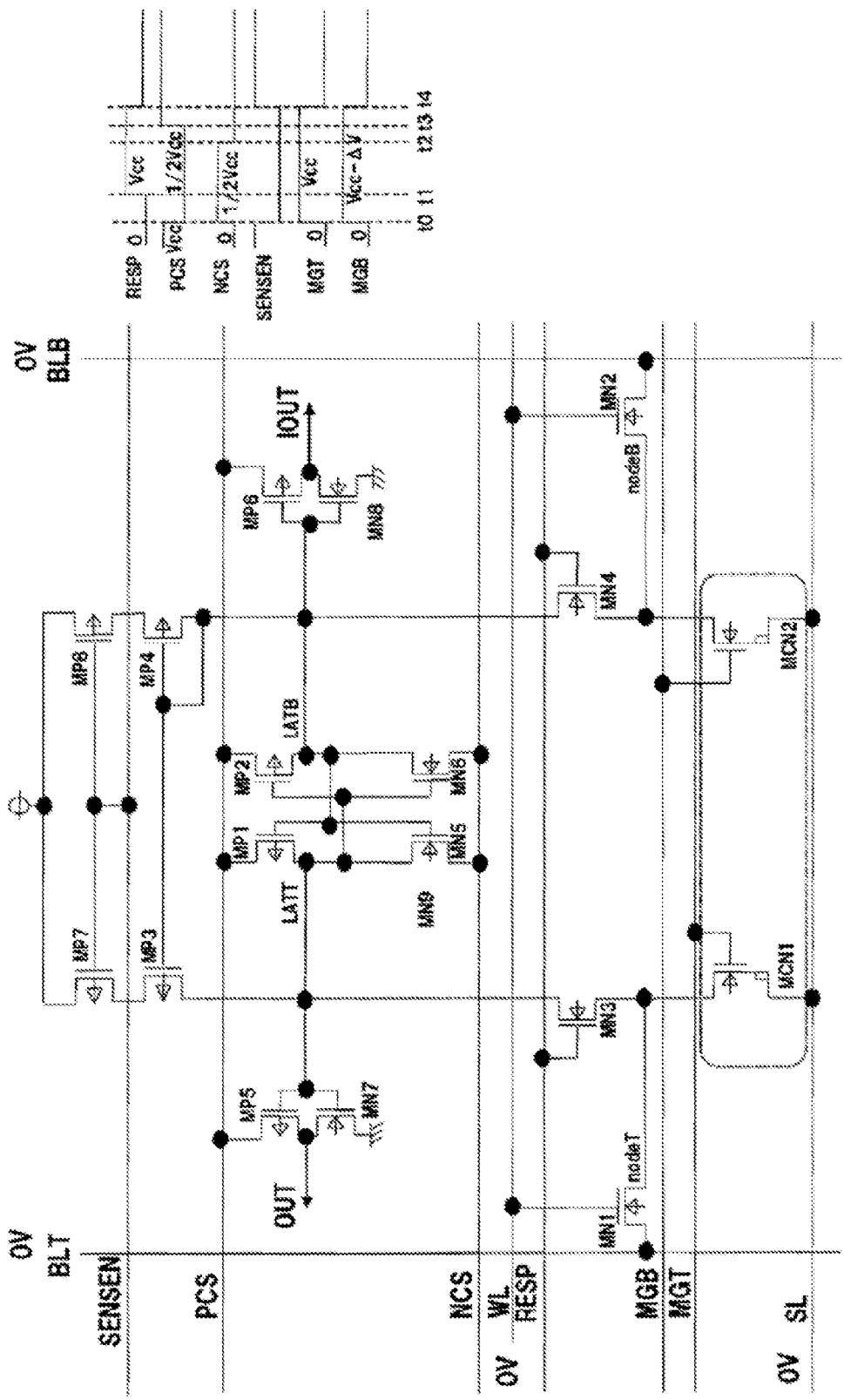
FIG. 81 shows a diagram of the voltage application conditions when transferring data of a nonvolatile data memory (part) to a flip flop (part) in the memory cell unit of a twelfth embodiment.

FIG. 81 is a diagram which shows the voltage application conditions when a sense amplifier is made to recognize indefinite data as data "1" even in the case where a memory cell unit with this indefinite data is included and where data is determined as data which is already programmed in a non-volatile data memory (part). The different points between these conditions and the voltage application conditions shown in FIG. 80 are as follows. The gate voltage MGT of the memory transistor MCN1 is set to Vcc and the gate voltage MGB of the memory transistor MCN2 is set to Vcc−ΔV (for example, ΔV=0.2V) and the gate voltage of the memory transistor MCN1 is set higher than the gate voltage of the memory transistor MCN2 by ΔV. In this way, it becomes easier to switch ON the memory transistor MCN1 than the memory transistor MCN2 and in the case where indefinite data such as when the threshold voltages of both the memory transistors MCN1 and MCN2 are Vth0, it is possible to forcibly set data which is set in the flip flop (part) to "1". However, in the case where data is already programmed, data is determined based on the threshold voltage differential between the memory transistors MCN1 and MCN2.

Here, the case where the threshold voltage of both memory transistors MCN1 and MCN2 is Vth0, indicates that reprogramming to the memory transistors MCN1 and MCN2 has not been performed and is possible that there is also no deterioration in the memory transistors together with reprogramming. As a result, it is sufficient to decide upon the size of ΔV by only considering the variance in the initial threshold voltage of a transistor, for example, about 0.2V is considered sufficient.

Here, in the case where data is indefinite, the case was explained that the data which is read is forcibly determined as "1", however, by reversing the potential difference between MGT and MGB it is possible to determine the data as "0".

Thirteenth Embodiment

Figure 82:
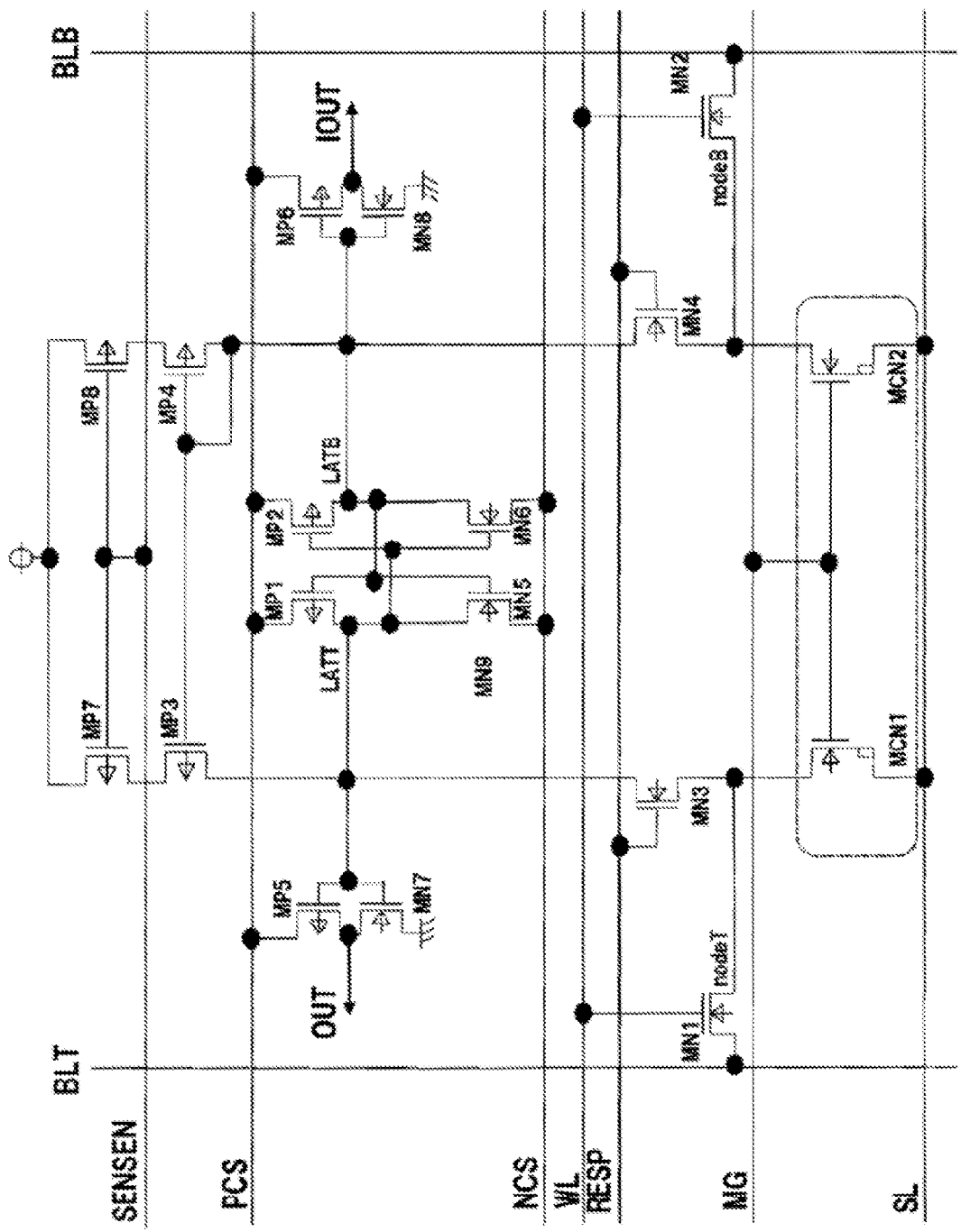
FIG. 82 shows a diagram of the construction of a memory cell unit of a thirteenth embodiment of the present invention.

FIG. 82 is a diagram which shows a thirteenth embodiment of a memory cell unit of a memory device. The point where FIG. 81 is different from the twelfth embodiment shown in FIG. 79 is that the gate voltage MG of the memory transistors MCN1 and MCN2 is shared. In this structure, because the gate voltages MGT and MGB of the memory transistors MCN1 and MCN2 as shown in FIG. 72 can not be controlled separately, data in the case where the data is indefinite as in when the threshold voltage of the memory transistors MCN1 and MCN2 are both Vth0, can not be determined as "1" or "0". However, in the case where this memory cell with this type of indefinite data is included, the number of drivers for controlling the gate of a memory transistor can be reduced and it is useful because the structure is simplified. Furthermore, the plurality of memory cells shown in FIG. 82 are connected in the shape of an array as in FIG. 68 and form a memory device.

Fourteenth Embodiment

Figure 83:
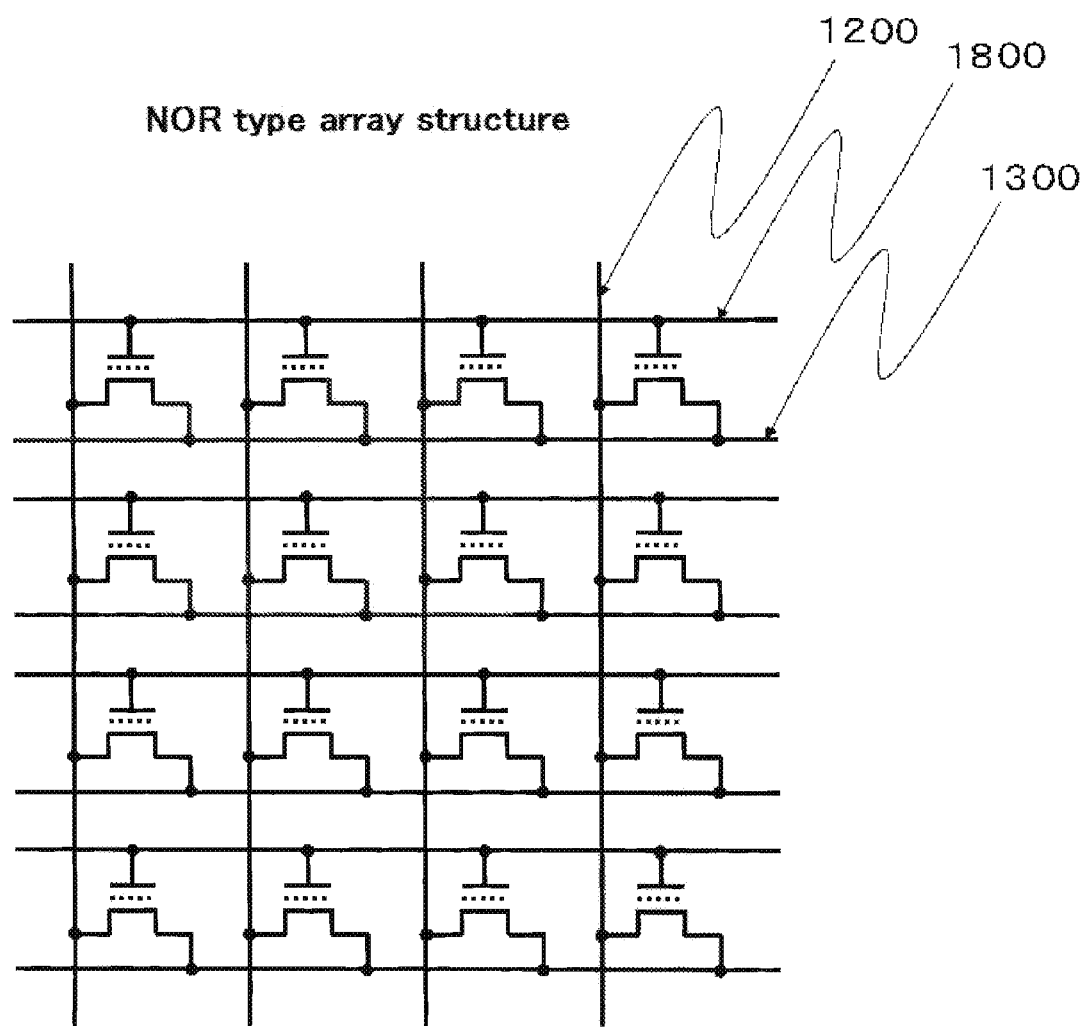
FIG. 83 is an equivalent circuit diagram which shows the structure of a general NOR type flash memory.

FIG. 83 shows an equivalent circuit of a general NOR type array structure. The drain section of each memory cell and a bit line are connected via a contact and bit line 1200 and word line 1800 are formed to intersect each other. In addition, source line 1300 and word line 1800 are arranged in parallel.

Figure 84:
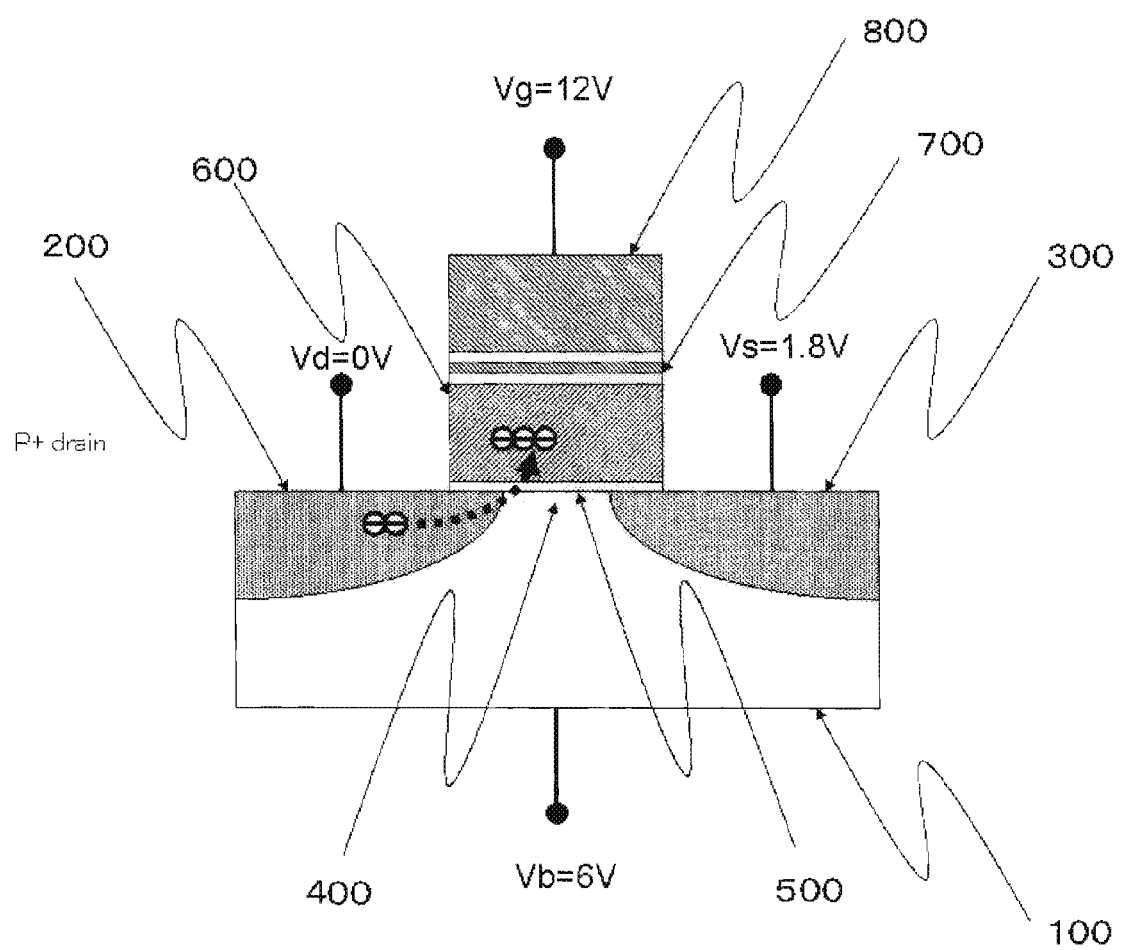
FIG. 84 is a diagram for explaining B4-HE injection technology.

However, as a technology for dramatically improving the programming speed of a NOR type flash memory, the applicants developed a B4-HE (back bias assisted band-to-band tunneling induced hot electron) injection mechanism in which current consumption at the time of programming is reduced by injecting hot electrons by BTBT (band-to-band tunneling) to a charge accumulation layer while a back gate voltage is applied as is shown in FIG. 84, and in which programming speed to a flash memory is dramatically improved by increasing the number of cells which can be simultaneously programmed.

Figure 85:
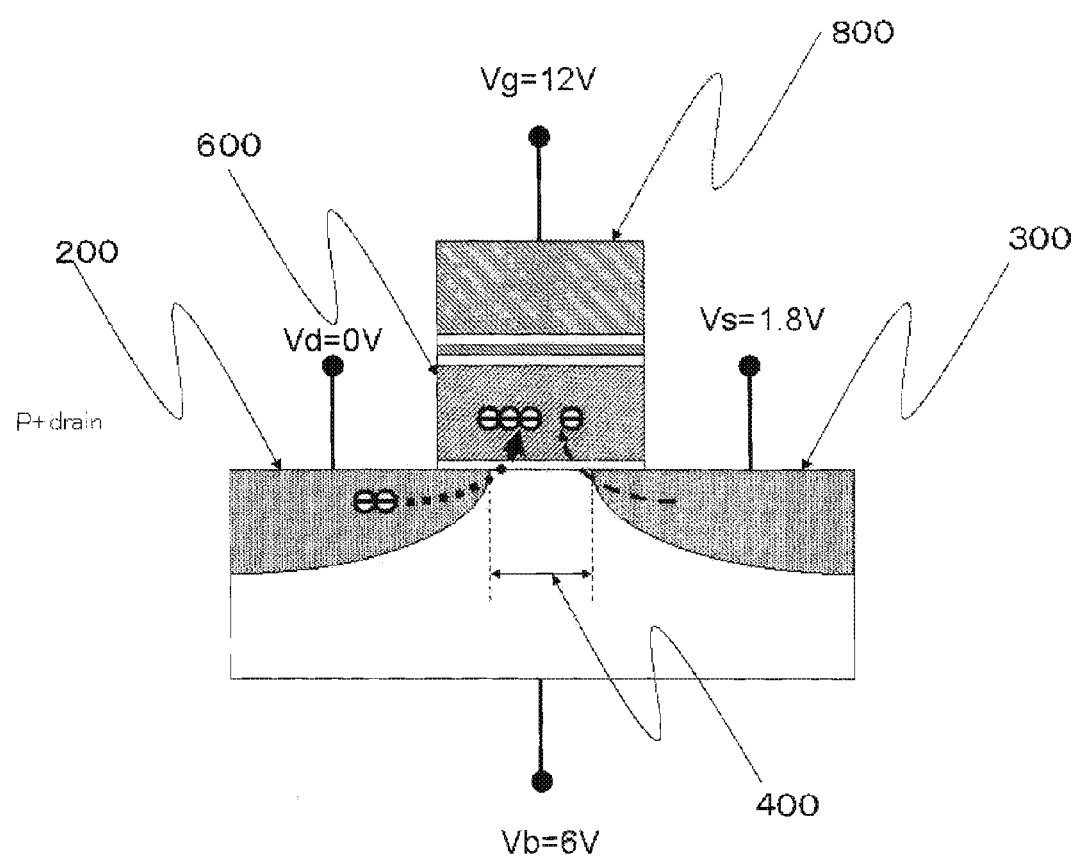
FIG. 85 is a diagram which shows problems of a conventional B4 flash memory.

However, in the case of using the B4-HE injection technology stated above, weak B4-HE injection also occurs even on the source side of a memory cell which may lead unnecessary programming to a programming non selected cell. In addition, if scaling progresses and gate length becomes shorter, punch through of a memory cell occurs due to the effects of a short channel and B4-HE no longer occurs. That is, it is no longer possible to perform B4-HE programming (FIG. 85). This is because it is no longer possible to obtain an electrical field which accelerates electrons by punching through.

This invention aims to provide a structure of a non-volatile memory device and a method for reading of the device which control unnecessary programming from a source side, simultaneously control short channel effects of a memory cell and improves scalability.

The present invention can control unnecessary programming from a source side, simultaneously control short channel effects of a memory cell and improve scalability in a B4 flash memory of a NOR type array structure control.

The embodiments of the present invention will be explained while referring to the diagrams. A fourteenth embodiment will be explained while referring to FIG. 86.

Figure 86:
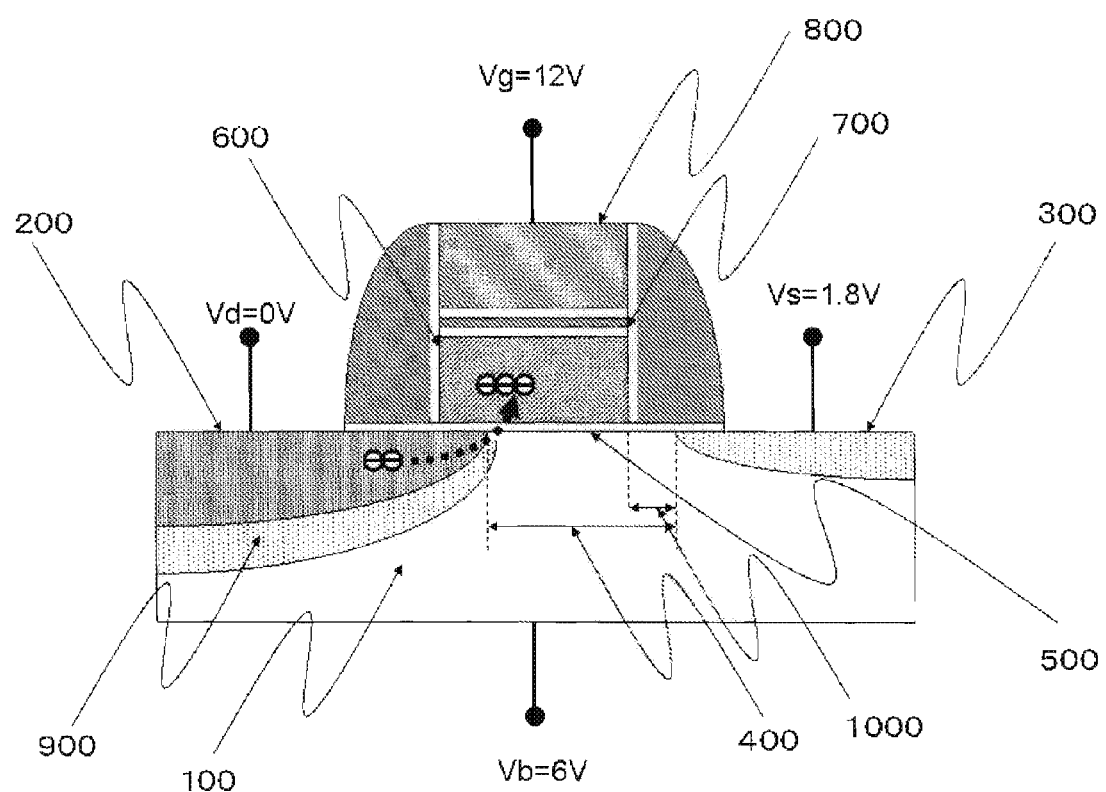
FIG. 86 is a cross-sectional diagram which shows the structure of a memory cell which is a fourteenth embodiment of the present invention.

FIG. 86 is a cross-sectional diagram which shows the structure of a memory cell which is a fourteenth embodiment of the present invention. This memory cell is formed with a P channel floating gate structure. That is, the memory cell is formed by a tunnel insulation film 500, a floating gate electrode 600 formed by a charge accumulation layer, an insulation film 700, and a control gate electrode 800 formed by a word line on the upper part of a channel region 400.

An n type well 100 is formed across entire surface near the surface of a semiconductor substrate (not shown in the diagram). A certain interval is created near the surface of this n type well 100 and a first p type diffusion region 200 which forms a drain and a second p type diffusion region 300 which forms a source are formed. This p type diffusion region 100 is connected via a contact to a wiring layer formed by bits lines in this memory cell. A bit line and word line extend in intersecting directions.

The first p type diffusion region has a higher concentration of impurities compared to the second p type diffusion region, or has a deeper junction depth, or there is large amount of overlap between a control gate/charge accumulation layer etc, that is the control gate/charge accumulation layer have an asymmetrical structure. In addition, a halo region 900 may be formed by n type impurities near the first p type diffusion region. The halo region 900 is a region for generating hot electrons by increasing an electrical field is increased near the first p type diffusion region which functions as a drain when a programming operation is performed, and is an n type region having a higher concentration than the n type well 100.

Furthermore, the second p type diffusion region may be arranged in a positional relationship having an offset region 1000 towards the control gate/charge accumulation layer. In this way, a structure is created whereby hot electrons are not easily generated near the second p type diffusion region and any generated hot electrons do not easily reach the charge accumulation layer and whereby unnecessary programming (electron injection) from the second p type diffusion region does not easily occur. In addition, by adopting a structure whereby an overlap of the second p type diffusion region is small or an offset structure it is possible to increase the effective length of the channel 400 and thus a memory cell structure having which can withstand the effects of short channel can be obtained.

Fifteenth Embodiment

The operation method of a memory cell array which is a fifteenth embodiment of the present invention will be explained while referring to FIG. 87 and FIG. 88.

Figure 87:
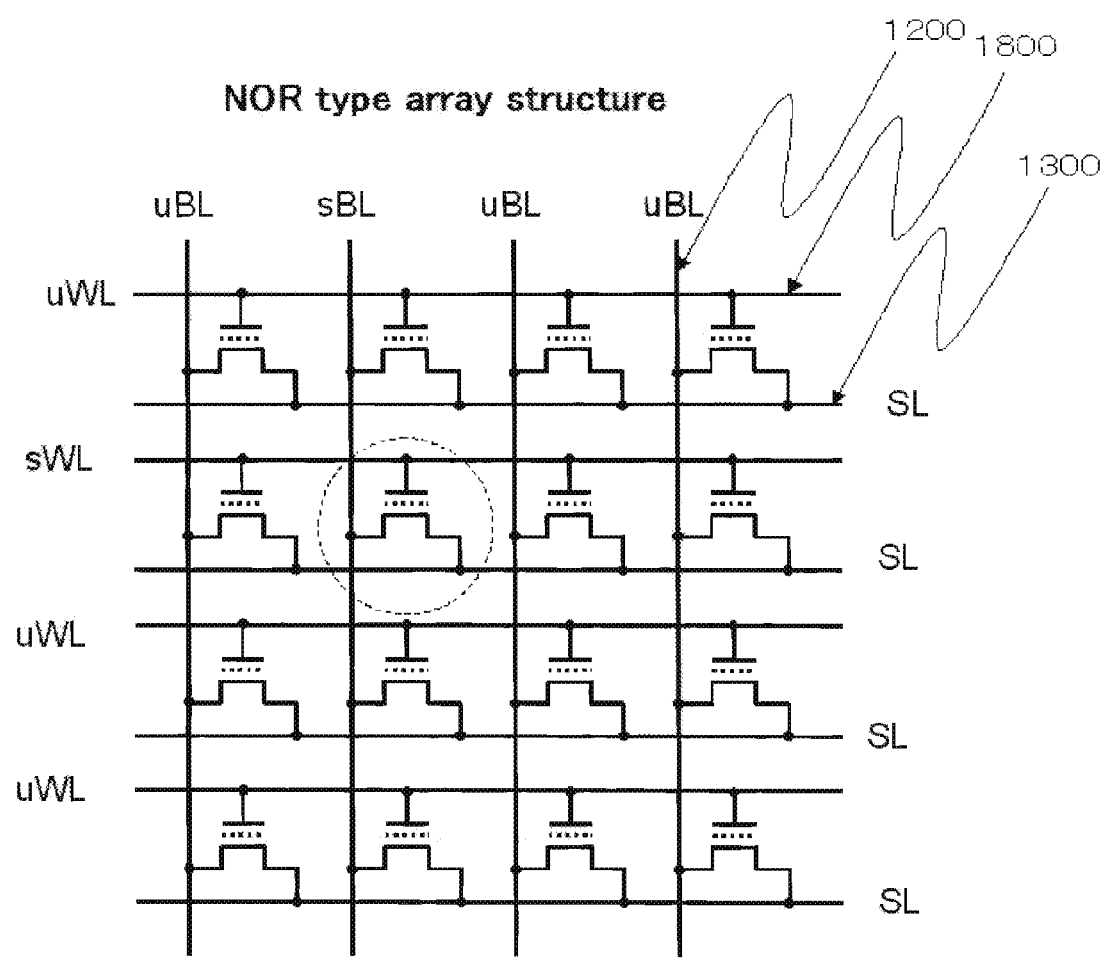
FIG. 87 is a diagram which shows an equivalent circuit structure of the same memory cell and a selected memory cell.

FIG. 87 shows an equivalent circuit diagram in which a memory cell of a single non-volatile semiconductor memory device shown in the fourteenth embodiment is arranged in a NOR type array shape.

The case where programming and reading is performed of the cell which is enclosed by a dotted line in the diagram will be explained. A bit line which is connected to a memory cell to be programmed is labeled sBL, all other bit lines are labeled uBL, a word line connected to a cell to be programmed is labeled sWL and all other word lines are labeled uWL.

The voltage applied to each electrode during programming, erasing, reading, and standby of each memory cell in FIG. 87 is shown in FIG. 88. Here, an erasure operation is performed in block units of about 512 k bits.

The size relationship between each voltage applied shown in FIG. 88 fulfills at least one of the following conditions:

Operation Condition 1:

$Vgp \geq Vbe \geq Vbp \geq uVdp \geq Vsp \geq Vgsb = Vbsb \geq Vdr \geq Vsr \geq Vdsb = Vssb = Vsub \geq Vgr \geq Vge,$ $Vcc \geq uVgr$ Operation Condition 2:

$Vgp \geq Vbe \geq Vbp \geq uVdp \geq Vsp \geq Vgsb = Vbsb \geq Vdr \geq Vsr \geq Vdsb = Vssb = Vsub \geq Vgr \geq Vge,$ $Vcc \geq uVgr,$ $uVdp = 2 \times Vcc,$ $Vsp = Vcc,$ $Vgsb = Vbsb = Vcc,$ $Vcc \geq Vdr \geq GND,$ $Vsr = Vdsb = Vssb = Vsub = GND,$ Operation Condition 3:

$Vgp \geq Vbe \geq Vbp \geq Vgsb = Vbsb \geq Vdr \geq Vsr = Vdsb = Vssb = Vsub \geq Vgr \geq Vge,$ $Vcc \geq uVgr$ $uVdp = \text{floating},$ $Vsp = Vcc/\text{floating},$ $Vgsb = Vbsb = Vcc,$ $Vcc \geq Vdr \geq GND,$ $Vsr = Vdsb = Vssb = Vsub = GND,$ Here, Vcc represents a power voltage, for example, 1.8V. All bit lines and word lines have the same potential during an erasure operation and standby state.

An example of the actual voltage values applied is shown in FIG. 89.

The features of the present operation are as follows. The potential relationship (Vsp≧Vdp) between Vsp and Vdp when programming and the potential relationship (Vdr≧Vsr) between Vdr and Vsr when reading is reversed. In this way, a reverse read in which the reading direction is reversed is realized, resistance increases due to the low concentration of the second p type diffusion region and it is possible to avoid a drop in a read current in a usual reading direction. Furthermore, even in the case where the second p type diffusion region includes an offset towards to charge accumulation layer/control gate, while a read current drops in a forward reading direction, it is possible to avoid a drop in current by reverse reading.

Next, each operation will be explained in detail.

First, a programming operation is explained. Programming to a memory cell is performed by injecting electrons to the charge accumulation layer 600. Injection of a charge to the charge accumulation layer 600 is performed by B4-HE back bias assisted band-to-band tunneling induced hot electron injection which occurs due to the high potential difference between the gate electrode 800 (sWL) which is applied with a relatively high positive voltage Vgp using a back gate voltage Vbp, and the first p type diffusion region 200 (sBL: below called a drain) with is applied with the voltage Vdp. Because the drain is operated by a ground voltage, a positive back gate voltage of 6V is applied to the n type well 100. In the way, has a relatively negative potential.

Specifically, +6V is applied to the n type well 100 as a back gate voltage and the drain is applied with a ground voltage (0V) as is shown in FIG. 89. Then, 12V is applied to the gate electrode 800 as a gate voltage Vgp. At this time, VCC (=1.8V) is applied to the second p type diffusion region (SL: below called a source) of a selected cell or it is made to float.

In addition, 0V or 1.8V is applied to a word line uWL of a nonselected cell and 1.8V or 3.6V is applied to a nonselected bit line uBL or made to float.

The potential relationship near a selected cell when programming will be explained using FIG. 86. By applying the voltages in the conditions shown in the FIG. 89 when programming, electrons generated by BTBT within the first p type diffusion region 200 (sBL) of a selected cell which functions as a drain are accelerated due to a strong electrical field of the halo layer 900 which is formed near the boundary surface between the first p type diffusion region 200 and the n type well 100, and become hot electrons having a high energy. A part of these are attracted by the positive voltage applied to the gate electrode 800 (sWL), go over the tunnel insulation film 500 and are injected into the charge accumulation layer 600.

Because this charge injection is performed while the source 1300/drain 1200 are off state, it is possible to obtain an injection efficiency of about $10^{-2}$ which is a high efficiency rate about $\times 10^3$ compared to conventional channel hot election injection methods.

Next, a reading operation will be explained. The reading operation conditions shown in FIG. 88 and FIG. 89 are operation conditions at the time of what is called reverse read. Reverse read refers to the operation of reading after the potential relationship applied to the first and second p type diffusion regions is reversed when programming and reading. When reading 1.8V (=VCC) is applied to the n type well 100 as a back gate voltage, 0V (GND) is applied to the source, and VCC (1.8V) is applied to the drain (sBL) of a selected cell. In this state, a read voltage Vgr=−3V is applied to a word line sWL of the selected cell. When reading, the word line voltage Vgr changes due to the programming characteristics of an element. In this way, if programming is performed to a selected cell in this potential arrangement, that is, if the selected cell is in a programming state, a current flows to the bit line sBL which is to be read and the voltage drops towards 0V, and of the selected cell is in a non-programmed state, no current flows and the voltage remains at VCC. Reading is performed by a change in the voltage of this bit line sBL or by detecting current with a detection circuit.

Next, an erasure operation will be explained. The erasure method is performed by extracting electrons from the charge accumulation layer by FN (Fowler-Nordheim) tunneling or by hole injection.

The erasure operation by FN tunneling will be explained while referring to FIG. 88 and FIG. 89. Erasure is performed in block units which share an n type well 100. A positive high voltage of 10V is applied to the n type well 100 or to the n type well 100 and source line 1300, and a negative high voltage of −10V is applied to all the word lines within a block. In this way, a large potential difference is generated between the word line (gate electrode) and n type well 100, electrons trapped in the charge accumulation layer 600 pass through the tunnel insulation film 500 due to the effects of FN tunneling and are extracted by leaping to the n type well 100. Furthermore, a bit line may be applied with the same high voltage as the n type well 100 or may be made to float.

In addition, erasure may be performed by hole injection due to tunneling effects instead of extracting electrons by the effects of FN tunneling.

Furthermore, with this structure it is also possible to omit the halo region 900. In a standby state, the potential of a bit line and a source line is 0V and the potential of an n well and word line is VCC (1.8V) in the present embodiment. In this way, when moving from a standby state to a reading state it is sufficient that only the potential of a selected bit line sBL is raised from 0V to 1.8V and only the potential of a selected word line sWL is decreased from 1.8V to −3V.

In the case where the potential applied to a bit line, source line, n well, and word line is 1.8V in a usual standby state, when moving to a read state, the potential of the source line must change from 1.8V to 0V, the potential of the nonselected bit line must change form 1.8V to 0V and the potential of a word line must change from 1.8V to −3V, and because the number of electrodes for changing these potentials becomes large, parasitic capacitance increases, and the time required for moving stated increases when the consumption current for charging this increases.

Figure 90:
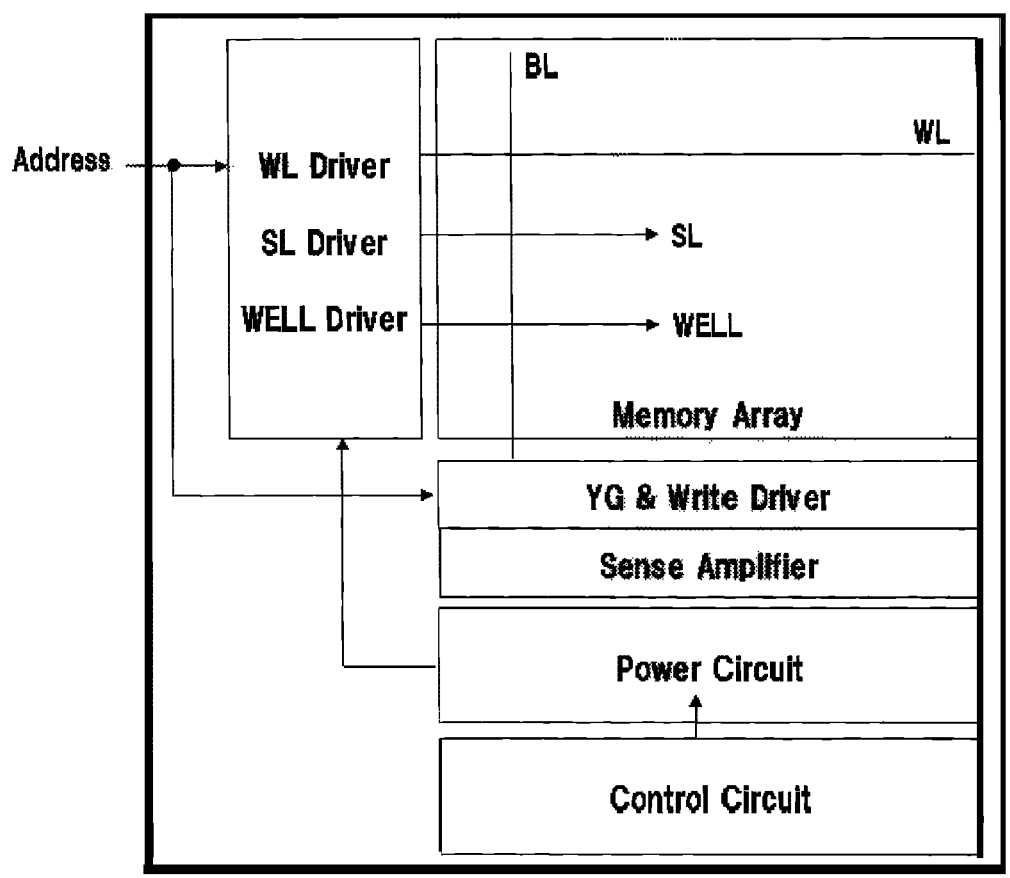
FIG. 90 is a block diagram which shows a chip structure of the same memory.

A block view of the chip structure of the present embodiment is shown in FIG. 90.

A word line driver, source line driver and well driver which are X type circuits, and Y gate and write driver and sense amplifier driver which are Y type circuits are arranged on the periphery of a memory cell array and includes other power type circuits and control type circuits.

While a floating gate structure was explained above as an embodiment of the present invention, a charge trap structure in a MNOS or silicon nano crystal structure is also the same.

It will be understood by those skilled in the art that the present invention may be, without limitation, embodied in other specific forms without departing from the scope of the invention disclosed and that the examples and embodiments described herein are in all respects illustrative and not restrictive. Those skilled in the art of the present invention will recognize that other embodiments using the concepts described herein are also possible. Further, any reference to claim elements in the singular, for example, using the articles "a," "an," or "the," is not to be construed as limiting the element to the singular.

EXPLANATION OF THE SYMBOLS 100 n type well
200 first p type diffusion region (drain)
300 second p type diffusion region (source)
400 channel region
500 tunnel insulation film
600 charge accumulation layer (floating gate)
700 ONO insulation film
800 control gate electrode (word line)
900 halo region
1000 offset region
1200 bit line
1300 source line
1800 word line

What is claimed is:

1. A non-volatile semiconductor device having a memory cell formed on an n type well formed in a semiconductor substrate, comprising:
   a first p-type diffusion region formed on a surface of the n type well;
   a second p-type diffusion region formed on the surface of the n type well, a channel region being interposed between the first p-type diffusion region and the second p-type diffusion region;
   a tunnel insulation film formed on the channel region;
   a floating gate formed on the tunnel insulation film;
   an insulation film formed on the floating gate;
   a gate electrode formed on the insulation film; and
   a metal wire connected to the first p-type diffusion region, the metal wire intersecting with an extension of the gate electrode;
   wherein the first p-type diffusion region and the second p-type diffusion region are asymmetrically arranged such that (i) a junction depth of the first p-type diffusion region and a junction depth of the second p-type diffusion region are different; or (ii) a first shape of the first p-type diffusion region and a second shape of the second p-type diffusion region are different; and such that a first resistivity of the first p-type diffusion region is lower than a second resistivity of the second p-type diffusion region; and wherein the device is configured such that a gate read voltage Vgr is applied to the gate electrode when the memory cell is selected for reading during a read operation, and an unselected gate read voltage uVgr is applied to the gate electrode when the memory cell is not selected for the reading during the read operation, and Vgr is lower than uVgr.

2. The non-volatile semiconductor device according to claim 1, wherein a negative erase voltage Vge is applied to the gate electrode when the memory cell is erased.

3. The non-volatile semiconductor device according to claim 1, wherein a positive gate program voltage Vgp is applied to the gate electrode when the memory cell is selected for programming during a program operation, and a zero or positive gate program voltage uVgp is applied to the gate electrode when the memory cell is not selected for the programming during the program operation, wherein Vpg is higher than uVpg.

4. The non-volatile semiconductor device according to claim 1 wherein:
when the memory cell is selected for programming during a program operation, a first program voltage Vdp is applied to the first p-type diffusion region and a second program voltage Vsp is applied to the second p-type diffusion region, Vsp being higher than Vdp; and
when the memory cell is selected for reading during the read operation, a first read voltage Vdr is applied to the first p-type diffusion region and a second read voltage Vsr is applied to the second p-type diffusion region, Vdr being higher than Vsr.

5. A non-volatile semiconductor device having a memory cell formed on an n type well formed in a semiconductor substrate, comprising:
a first p-type diffusion region formed on a surface of the n type well;
a second p-type diffusion region formed on the surface of the n type well, a channel region being interposed between the first p-type diffusion region and the second p-type diffusion region;
a tunnel insulation film formed on the channel region;
a floating gate formed on the tunnel insulation film;
an insulation film formed on the floating gate; and
a gate electrode formed on the insulation film;
wherein the first p-type diffusion region and the second p-type diffusion region are asymmetrically arranged such that (i) a junction depth of the first p-type diffusion region and a junction depth of the second p-type diffusion region are different; or (ii) a first shape of the first p-type diffusion region and a second shape of the second p-type diffusion region are different; and such that a first resistivity of the first p-type diffusion region is lower than a second resistivity of the second p-type diffusion region; and
wherein a first program voltage Vdp is applied to the first p-type diffusion region, a second program voltage Vsp is applied to the second p-type diffusion region, a third program voltage Vgp is applied to the gate electrode and a fourth program voltage Vbp is applied to the n-type well when the memory cell is selected for programming during a program operation, the first to fourth program voltages having values as follows: $Vgp \geq Vbp > Vsp \geq Vdp$; and
wherein a first read voltage Vdr is applied to the first p-type diffusion region, a second read voltage Vsr is applied to the second p-type diffusion region, a third read voltage Vgr is applied to the gate electrode and the a fourth read voltage Vbr is applied to the n-type well when the memory cell is selected for reading during a read operation, the first to fourth read voltages having values as follows: $Vbr \geq Vdr > Vsr \geq Vgr$.

6. The non-volatile semiconductor device according to claim 5, wherein a first standby voltage Vdsb is applied to the first p-type diffusion region, a second standby voltage Vssb is applied to the second p-type diffusion region, a third standby voltage Vgsb is applied to the gate electrode and a fourth standby voltage Vbsb is applied to the n-type well when the memory cell is at a standby operation, the first to fourth standby voltages having values as follows: $Vgsb = Vbsb > Vssb = Vdsb$.

7. The non-volatile semiconductor device according to claim 6, wherein $Vgsb = Vbsb = Vcc$ and $Vssb = Vdsb = 0V$.

* * * * *